United States Patent
Namba

(10) Patent No.: US 9,449,807 B2
(45) Date of Patent: Sep. 20, 2016

(54) SUBSTRATE PROCESSING APPARATUS AND SUBSTRATE PROCESSING METHOD

(71) Applicant: DAINIPPON SCREEN MFG. CO., LTD., Kyoto (JP)

(72) Inventor: Toshimitsu Namba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 13/957,869

(22) Filed: Aug. 2, 2013

(65) Prior Publication Data

US 2014/0041689 A1      Feb. 13, 2014

(30) Foreign Application Priority Data

| Aug. 9, 2012 | (JP) | ................ P2012-177600 |
| Aug. 30, 2012 | (JP) | ................ P2012-190472 |
| Aug. 30, 2012 | (JP) | ................ P2012-190473 |
| Sep. 26, 2012 | (JP) | ................ P2012-212786 |
| Sep. 26, 2012 | (JP) | ................ P2012-212787 |

(51) Int. Cl.
*H01L 21/02* (2006.01)
*H01L 21/687* (2006.01)
*H01L 21/67* (2006.01)

(52) U.S. Cl.
CPC ... *H01L 21/02019* (2013.01); *H01L 21/67051* (2013.01); *H01L 21/68728* (2013.01); *H01L 21/68742* (2013.01); *H01L 21/68792* (2013.01)

(58) Field of Classification Search
CPC ........... H01L 21/02019; H01L 21/68728; H01L 21/68792; H01L 21/67051; H01L 21/68742
See application file for complete search history.

(56) References Cited

U.S. PATENT DOCUMENTS

| 5,695,817 | A | 12/1997 | Tateyama et al. ............ 427/240 |
| 5,772,770 | A | 6/1998 | Suda et al. .................... 118/719 |
| 5,803,970 | A | 9/1998 | Tateyama et al. ............ 118/319 |
| 5,997,653 | A | 12/1999 | Yamasaka ........................ 134/2 |
| 6,049,148 | A | 4/2000 | Nichols et al. ................. 310/68 |
| 6,167,893 | B1* | 1/2001 | Taatjes et al. ................ 134/147 |
| 8,091,504 | B2 | 1/2012 | Hsieh et al. .................. 118/319 |
| 2001/0051499 | A1* | 12/2001 | Shinozaki .................... 451/285 |
| 2008/0142051 | A1 | 6/2008 | Hashizume .................... 134/23 |
| 2009/0079122 | A1 | 3/2009 | Obweger ....................... 269/57 |
| 2009/0120472 | A1* | 5/2009 | Nishiyama et al. .......... 134/157 |
| 2010/0289200 | A1 | 11/2010 | Fukui et al. ...................... 269/8 |
| 2011/0240601 | A1 | 10/2011 | Hashizume et al. ............ 216/83 |
| 2011/0250044 | A1 | 10/2011 | Obweger et al. ............ 414/757 |

(Continued)

FOREIGN PATENT DOCUMENTS

| CN | 101204708 A | 6/2008 |
| JP | H 08-1067 A | 1/1996 |

(Continued)

*Primary Examiner* — Jason Ko
*Assistant Examiner* — Spencer Bell
(74) *Attorney, Agent, or Firm* — Ostrolenk Faber LLP

(57) ABSTRACT

A substrate processing apparatus includes a substrate holding part, a substrate rotating mechanism, and a chamber. The substrate rotating mechanism incudes an annular rotor part disposed in an internal space of the chamber and a stator part disposed around the rotor part outside the chamber. The substrate holding part is attached to the rotor part in the internal space of the chamber. In the substrate rotating mechanism, a rotating force is generated about a central axis between the stator part and the rotor part. The rotor part is thereby rotated about the central axis, being in a floating state, together with a substrate and the substrate holding part. In the substrate processing apparatus, the substrate can be easily rotated in the internal space having excellent sealability. As a result, it is possible to easily perform single-substrate processing in a sealed internal space.

19 Claims, 27 Drawing Sheets

(56) References Cited

U.S. PATENT DOCUMENTS

| | | | |
|---|---|---|---|
| 2011/0253181 A1 | 10/2011 | Obweger et al. | 134/157 |
| 2011/0290283 A1 | 12/2011 | Obweger et al. | 134/104.2 |
| 2011/0304107 A1 | 12/2011 | Obweger et al. | 279/60 |
| 2012/0018940 A1 | 1/2012 | Kumnig et al. | 269/225 |
| 2012/0103522 A1 | 5/2012 | Hohenwarter | 156/345.23 |
| 2012/0305036 A1 | 12/2012 | Lach et al. | 134/137 |
| 2013/0008602 A1 | 1/2013 | Hohenwarter | 156/345.23 |
| 2013/0062839 A1 | 3/2013 | Tschinderle et al. | 279/157 |

FOREIGN PATENT DOCUMENTS

| | | |
|---|---|---|
| JP | 8-255789 | 10/1996 |
| JP | 09-246156 | 9/1997 |
| JP | H 10-12523 A | 1/1998 |
| JP | 10-172951 | 6/1998 |
| JP | 11-204613 | 7/1999 |
| JP | 11-251414 | 9/1999 |
| JP | 2957383 | 10/1999 |
| JP | 2002-280318 | 9/2002 |
| JP | 2006-105524 | 4/2006 |
| JP | 2006-310709 | 11/2006 |
| JP | 2007-027784 A | 2/2007 |
| JP | 2008-73636 A | 4/2008 |
| JP | 2008-112760 | 5/2008 |
| JP | 2010-155216 | 7/2010 |

\* cited by examiner

SUBSTRATE PROCESSING APPARATUS AND SUBSTRATE PROCESSING METHOD

TECHNICAL FIELD

The present invention relates to a substrate processing apparatus and a substrate processing method for processing a substrate.

BACKGROUND ART

In a process of manufacturing a semiconductor substrate (hereinafter, referred to simply as a "substrate"), conventionally, various processings are performed on a substrate by using a substrate processing apparatus. By supplying a processing liquid onto a substrate having a surface on which a resist pattern is formed, for example, a processing such as etching or the like is performed on the surface of the substrate. Further, after the etching is finished, a process of removing the resist from the substrate and a process of cleaning the substrate are also performed.

In an apparatus disclosed in Japanese Patent Application Laid-Open No. 9-246156 (Document 1), after rinsing a developer or the like on a wafer by using a rinse liquid, the wafer is dried. Specifically, a wafer is loaded into a rinse processing part and absorbed by a wafer absorption part, and after an opening of the rinse processing part is closed by a shutter, an internal space of the rinse processing part is exhausted. Then, in the internal space which has been brought into a reduced pressure atmosphere, rinse processing is performed by rotating the wafer together with the wafer absorption part at low speed and supplying the rinse liquid thereto, and after that, the wafer is dried by rotating the wafer at high speed.

In such an apparatus as disclosed in Document 1, a driving part such as a servo motor or the like for rotating the wafer absorption part is provided outside the rinse processing part and mechanically connected to the wafer absorption part with a rotation axis penetrating an outer wall of the rinse processing part. For this reason, it is necessary to provide a seal at a portion where the rotation axis penetrates from the outside of the rinse processing part into the internal space to prevent outflow of the processing liquid and entry of particles. Further, in the case where the internal space of the rinse processing part is brought into a reduced pressure atmosphere, like in the case of Document 1, it is also necessary to prevent inflow and outflow of the atmosphere by the seal. Since such a seal has a very complicated structure, there is a possibility that the apparatus may be complicated or upsized, and moreover, it is not easy to completely seal the internal space even by using the seal.

SUMMARY OF INVENTION

The present invention is intended for a substrate processing apparatus for processing a substrate, and it is an object of the present invention to easily achieve single-substrate processing in a sealed space. The present invention is also intended for a substrate processing method for processing a substrate.

The substrate processing apparatus according to the present invention includes a chamber having a chamber body and a chamber cover and forming an internal space which is sealed by closing an upper opening of the chamber body by the chamber cover, a substrate holding part disposed in the internal space of the chamber, for holding a substrate horizontally, a substrate rotating mechanism for rotating the substrate together with the substrate holding part about a central axis oriented in a vertical direction, and a processing liquid discharge part for discharging a processing liquid supplied onto the substrate to the outside of the chamber, and in the substrate processing apparatus of the present invention, the substrate rotating mechanism includes an annular rotor part disposed in the internal space of the chamber, to which the substrate holding part is attached, and a stator part disposed around the rotor part outside the chamber, for generating a rotating force between itself and the rotor part. By the substrate processing apparatus of the present invention, it is possible to easily achieve single-substrate processing in a sealed space.

In a preferred embodiment of the present invention, the substrate processing apparatus further includes a processing liquid supply part for supplying the processing liquid to the inside of the chamber and a control part for controlling the substrate rotating mechanism and the processing liquid supply part, and in the substrate processing apparatus of the present invention, under the control of the control part, the processing liquid is supplied and pooled into the chamber while the substrate holding part does not hold any substrate, and the substrate holding part is rotated while at least part of the substrate holding part is immersed into the processing liquid in the internal space, to thereby clean the inside of the chamber. It is thereby possible to easily clean the inside of the chamber.

In another preferred embodiment of the present invention, the processing liquid discharge part discharges the processing liquid from a lower portion of the internal space, the rotor part is disposed around the substrate holding part, and the rotor part includes a liquid receiving surface opposed to an outer peripheral edge of the substrate in a radial direction, for receiving the processing liquid spattering from the outer peripheral edge of the substrate and guiding the processing liquid downward. It is thereby possible to prevent the processing liquid from splashing back to the substrate.

In still another preferred embodiment of the present invention, the processing liquid discharge part discharges the processing liquid from a lower portion of the internal space, the rotor part is disposed around the substrate holding part, an inner peripheral edge of an upper surface of the rotor part is in contact with or adjacent to an outer peripheral edge of the upper surface of the substrate, the chamber includes an annular flow channel forming part which forms a flow channel between itself and the rotor part, the flow channel for guiding the processing liquid to the processing liquid discharge part and a slit-like opening for guiding the processing liquid to the flow channel is formed between the inner peripheral edge of the upper surface of the rotor part and the flow channel forming part. It is thereby possible to prevent the processing liquid from splashing back to the substrate.

In yet another preferred embodiment of the present invention, the substrate holding part includes a plurality of substrate supporting parts for supporting the substrate from below and a plurality of substrate retaining parts for retaining the substrate from above, each substrate supporting part of the plurality of substrate supporting parts is rotatable about a first rotation axis oriented horizontally between a first waiting position and a first holding position and rotates from the first waiting position to the first holding position by placing the substrate on a first substrate contact part, to thereby support the substrate from below, and each substrate retaining part of the plurality of substrate retaining parts is rotatable about a second rotation axis oriented horizontally between a second waiting position and a second holding position and rotates from the second waiting position to the second holding position by centrifugal force due to rotation performed by the substrate rotating mechanism, to thereby retain the substrate from above at a second substrate contact part. It is thereby possible to easily hold the substrate without providing any driving mechanism for driving the substrate holding part.

In further preferred embodiment of the present invention, the substrate processing apparatus further includes a processing liquid supply part for supplying the processing liquid onto the substrate in the internal space, a gas supply part for supplying gas into the internal space, a buffer tank connected to the internal space through a connecting pipe, for temporarily pooling the processing liquid led from the internal space, in which gas is always continuous with the gas in the internal space with gas in the connecting pipe interposed therebetween, a gas discharge part for discharging the gas from the buffer tank, and a pressure control part for controlling a pressure in the internal space of the chamber by controlling the gas supply part and the gas discharge part, and in the substrate processing apparatus of the present invention, the processing liquid discharge part discharges the processing liquid pooled in the buffer tank. It is thereby possible to control the pressure in the internal space of the chamber with high accuracy.

The substrate processing method according to the present invention includes a) supplying and pooling a processing liquid into a chamber while a substrate holding part disposed in an internal space sealed inside the chamber does not hold any substrate and b) cleaning the inside of the chamber by rotating the substrate holding part while immersing at least part of the substrate holding part into the processing liquid in the internal space.

These and other objects, features, aspects and advantages of the present invention will become more apparent from the following detailed description of the present invention when taken in conjunction with the accompanying drawings.

DESCRIPTION OF EMBODIMENTS

Figure 1:
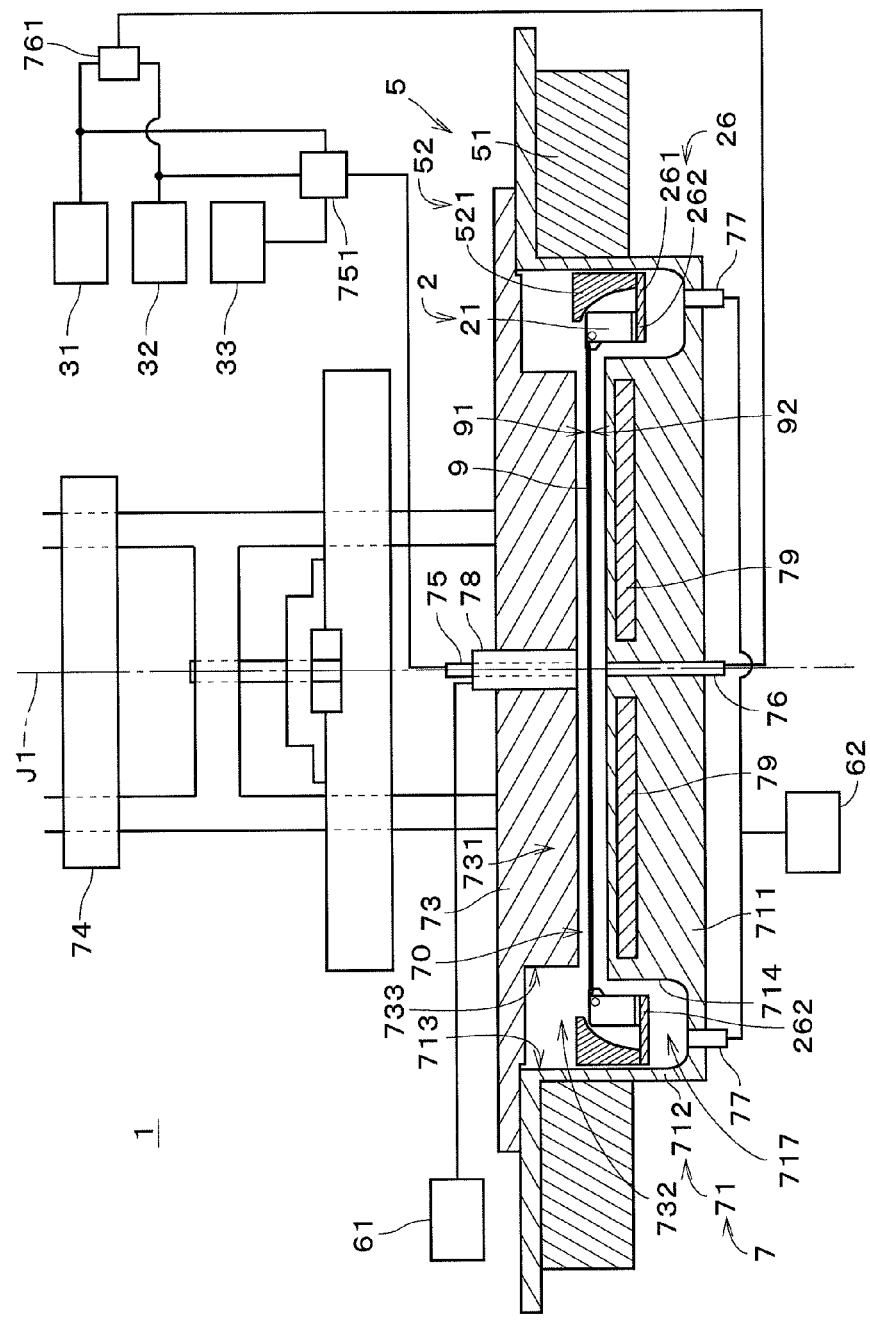
FIG. 1 is a view showing a configuration of a substrate processing apparatus in accordance with a first preferred embodiment of the present invention.

FIG. 1 is a view showing a configuration of a substrate processing apparatus 1 in accordance with the first preferred embodiment of the present invention. The substrate processing apparatus 1 is a single-substrate processing apparatus which supplies a processing liquid onto a semiconductor substrate 9 (hereinafter, referred to simply as a "substrate 9") having a substantially disk-like shape and thereby processes substrates one by one.

Figure 2:
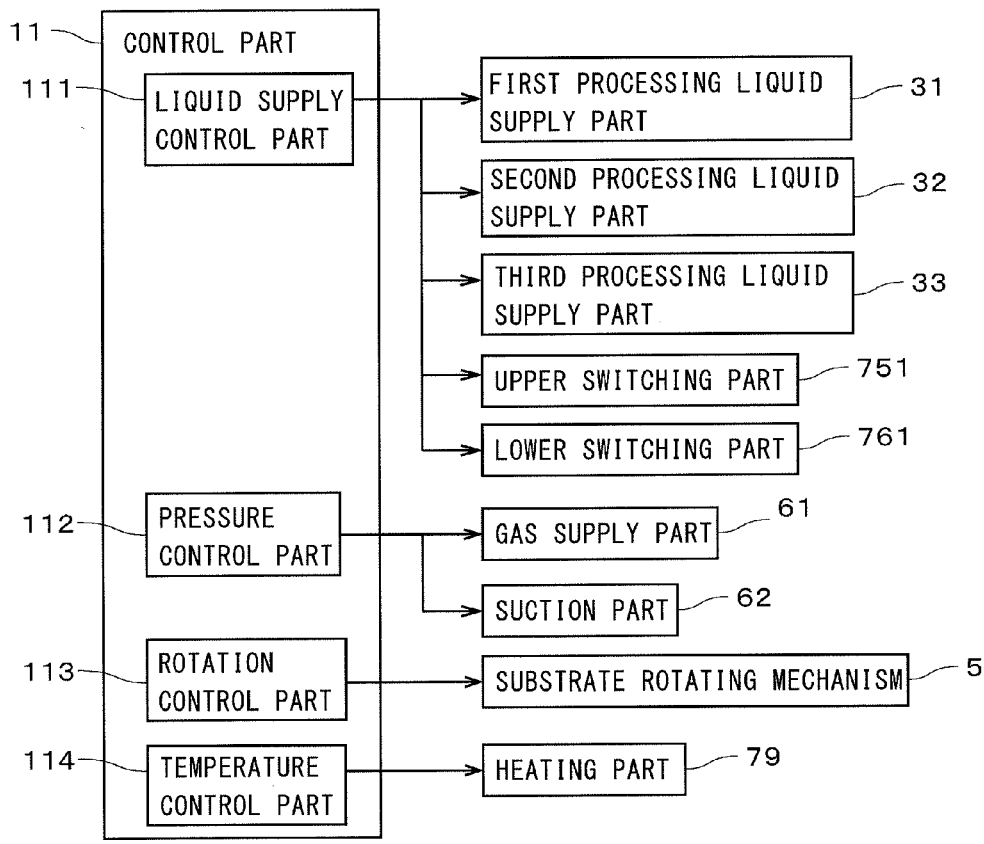
FIG. 2 is a block diagram showing functions of a control part.

The substrate processing apparatus 1 includes a substrate holding part 2, a first processing liquid supply part 31, a second processing liquid supply part 32, a third processing liquid supply part 33, a substrate moving mechanism 4 (see FIG. 10), a substrate rotating mechanism 5, a gas supply part 61, a suction part 62, a chamber 7, a heating part 79, and a control part 11 for controlling these constituent elements (see FIG. 2). FIG. 1 is a cross section showing the substrate rotating mechanism 5, the chamber 7, and the like. The substrate holding part 2 can hold a substrate 9, and FIG. 1 shows a state where the substrate holding part 2 holds a substrate 9.

The chamber 7 includes a chamber body 71, a chamber cover 73, and a cover moving mechanism 74. The chamber body 71 and the chamber cover 73 are each formed of a non-magnetic material. The chamber body 71 includes a chamber bottom 711 and a chamber sidewall 712. The chamber bottom 711 has a substantially disk-like shape with a central axis J1 oriented in a vertical direction as its center and has an annular recessed portion 714 at its outer peripheral portion. The chamber sidewall 712 has a substantially cylindrical shape with the central axis J1 as its center and is continuous with an outer peripheral portion of the annular recessed portion 714 of the chamber bottom 711. Then, a space surrounded by the annular recessed portion 714 and the chamber sidewall 712 is a lower annular space 717. The annular recessed portion 714 is formed so that an outer peripheral edge of a substrate 9 held by the substrate holding part 2 may be accommodated within the width of the annular recessed portion 714 in processing the substrate 9. For this reason, in processing the substrate 9, the lower annular space 717 is positioned below the outer peripheral edge of the substrate 9. The chamber cover 73 has a substantially disk-like shape with the central axis J1 as its center and serves to close an upper opening of the chamber body 71. The chamber cover 73 is opposed to one main surface 91 (hereinafter, referred to as an "upper surface 91") of the substrate 9, on which a fine pattern is formed, in the vertical direction, and the chamber bottom 711 is opposed to a lower surface 92 which is the other main surface of the substrate 9 in the vertical direction. Inside the chamber bottom 711, a heater serving as the heating part 79 is provided.

The cover moving mechanism 74 moves the chamber cover 73 in the vertical direction. In the substrate processing apparatus 1, the substrate 9 is loaded and unloaded into/from the chamber 7 while the chamber cover 73 which has been moved upward is positioned away from the chamber body 71. Further, by pressing the chamber cover 73 against an upper portion of the chamber sidewall 712 to close the upper opening of the chamber body 71, the internal space 70 is formed, being sealed.

The chamber cover 73 includes a cover protruding portion 731 protruding downward. The cover protruding portion 731 has a substantially cylindrical shape with the central axis J1 as its center and has an outer peripheral surface 733 having a cylindrical shape with the central axis J1 as its center. While the internal space 70 is formed by closing the upper opening of the chamber body 71 by the chamber cover 73, that is, the chamber 7 is sealed, a space between the outer peripheral surface 733 of the cover protruding portion 731 and the inner peripheral surface 713 of the chamber sidewall 712 becomes an upper annular space 732. Since a bottom surface of the cover protruding portion 731 having a substantially cylindrical shape is slightly smaller than the upper surface 91 of the substrate 9 held by the substrate holding part 2, the upper annular space 732 is positioned above the outer peripheral edge of the substrate 9 when the substrate 9 is processed.

A first upper nozzle 75 is attached to a center portion of the chamber cover 73, and a second upper nozzle 78 having an annular cross section is provided around the first upper nozzle 75. To the first upper nozzle 75, connected are the first processing liquid supply part 31, the second processing liquid supply part 32, and the third processing liquid supply part 33 through an upper switching part 751. To the second upper nozzle 78, connected is the gas supply part 61.

A lower nozzle 76 is attached to a center portion of the chamber bottom 711. To the lower nozzle 76, connected are the first processing liquid supply part 31 and the second processing liquid supply part 32 through a lower switching part 761. Further, a plurality of lower discharge parts 77 are provided at an outer peripheral portion of the chamber bottom 711 at regular pitches in a circumferential direction about the central axis J1. The plurality of lower discharge parts 77 are connected to the suction part 62.

FIG. 2 is a block diagram showing functions of the control part 11. FIG. 2 also shows constituent elements connected to the control part 11. As shown in FIG. 2, the control part 11 includes a liquid supply control part 111, a pressure control part 112, a rotation control part 113, and a temperature control part 114.

In the substrate processing apparatus 1, the liquid supply control part 111 controls the first processing liquid supply part 31, the upper switching part 751, and the lower switching part 761 to supply a first processing liquid from the first upper nozzle 75 onto a center portion of the upper surface 91 of the substrate 9 and supply the first processing liquid from the lower nozzle 76 onto a center portion of the lower surface 92 of the substrate 9 in the internal space 70 shown in FIG. 1. Further, the liquid supply control part 111 controls the second processing liquid supply part 32, the upper switching part 751, and the lower switching part 761 to supply a second processing liquid from the first upper nozzle 75 onto the center portion of the upper surface 91 of the substrate 9 and supply the second processing liquid from the lower nozzle 76 onto the center portion of the lower surface 92 of the substrate 9.

Furthermore, the liquid supply control part 111 controls the third processing liquid supply part 33 and the upper switching part 751 to supply a third processing liquid from the first upper nozzle 75 onto the center portion of the upper surface 91 of the substrate 9. In this preferred embodiment, the first processing liquid is an etching solution such as hydrofluoric acid, a tetramethylammonium hydroxide solution, or the like, and the second processing liquid is deionized water (DIW). The third processing liquid is isopropyl alcohol (IPA). Further, also in order to stop the supply of the processing liquids from the first upper nozzle 75 and the lower nozzle 76, the upper switching part 751 and the lower switching part 761 are controlled.

In the substrate processing apparatus 1, the pressure control part 112 shown in FIG. 2 controls the gas supply part 61 to supply gas into the internal space 70 of the chamber 7 from the second upper nozzle 78 shown in FIG. 1. In this preferred embodiment, the gas supply part 61 supplies nitrogen gas ($N_2$) to the inside of the chamber 7. The suction part 62 performs suction through the plurality of lower discharge parts 77, to thereby discharge the gas from the internal space 70 of the chamber 7. Thus, the suction part 62 and the lower discharge parts 77 serve as a gas discharge part.

In the substrate processing apparatus 1, the pressure control part 112 controls the gas supply part 61 and the suction part 62 to control a pressure in the internal space 70 of the chamber 7. Specifically, while the suction of the suction part 62 is stopped, the gas supply part 61 supplies gas to the inside of the chamber 7, to thereby increase the pressure in the internal space 70 of the chamber 7 to be higher than the normal pressure (atmospheric pressure) and bring the internal space 70 into a pressurized atmosphere. Further, while the supply of gas from the gas supply part 61 is stopped, the suction part 62 discharges the gas from the chamber 7 to the outside of the chamber 7, to thereby decrease the pressure in the internal space 70 to be lower than the normal pressure and bring the internal space 70 into a reduced pressure atmosphere.

The suction part 62 performs suction through the plurality of lower discharge parts 77, to thereby discharge the processing liquid which has been supplied onto the substrate 9 from the first processing liquid supply part 31, the second processing liquid supply part 32, or the third processing liquid supply part 33, from a lower portion of the internal space 70 to the outside of the chamber 7. Thus, the suction part 62 and the lower discharge parts 77 serve as a processing liquid discharge part.

The substrate rotating mechanism 5 is a so-called hollow motor. The substrate rotating mechanism 5 includes an annular stator part 51 and an annular rotor part 52. The rotor part 52 is disposed in the internal space 70 of the chamber 7. A lower portion of the rotor part 52 is positioned inside the lower annular space 717 of the chamber body 71. The rotor part 52 includes a permanent magnet 521 having a substantially annular shape. A surface of the permanent magnet 521 is coated with a fluorocarbon resin. The substrate holding part 2 is attached to the rotor part 52.

The stator part 51 is disposed around the rotor part 52 outside the chamber 7 (that is, outside the internal space 70). In this preferred embodiment, the stator part 51 is fixed, being in contact with an outer peripheral surface of the chamber sidewall 712. The stator part 51 includes a plurality of coil parts arranged in the circumferential direction about the central axis J1.

In the substrate rotating mechanism 5, by supplying current to the stator part 51, a rotating force is generated about the central axis J1 between the stator part 51 and the rotor part 52. The rotor part 52 thereby rotates horizontally about the central axis J1 together with the substrate 9 and the substrate holding part 2. In the substrate processing apparatus 1, by magnetic force exerted between the stator part 51 and the rotor part 52 with the current supplied to the stator part 51, the rotor part 52 floats in the internal space 70, not being in direct or indirect contact with the chamber 7, and rotates, being in a floating state.

When the supply of current to the stator part 51 is stopped, the rotor part 52 is attracted toward the chamber sidewall 712 by magnetic force exerted between the permanent magnet 521 and a magnetic material such as a core of the stator part 51. Then, part of an outer peripheral surface of the rotor part 52 comes into contact with the inner peripheral surface 713 of the chamber sidewall 712 and is supported by the stator part 51 with the chamber sidewall 712 interposed therebetween. The rotor part 52 comes to rest, not being in contact with the chamber bottom 711 or the chamber cover 73.

The substrate holding part 2 is attached to the rotor part 52 and disposed in the internal space 70 of the chamber 7 as discussed above. The substrate 9 is held by the substrate holding part 2 with the upper surface 91 thereof directed upward substantially perpendicular to the central axis J1. In other words, the substrate holding part 2 horizontally holds the substrate 9.

Figure 3:
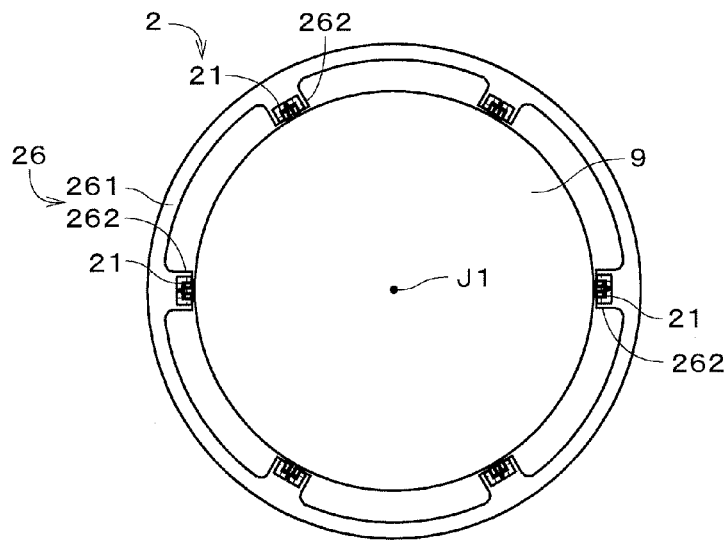
FIG. 3 is a plan view showing a substrate holding part.

FIG. 3 is a plan view showing the substrate holding part 2. FIG. 3 also shows a chuck supporting part 26 for supporting the substrate holding part 2. As shown in FIGS. 1 and 3, the substrate holding part 2 includes a plurality of chuck parts 21 each for holding the substrate 9 by sandwiching an outer edge thereof from above and below. In this preferred embodiment, six chuck parts 21 are arranged in the circumferential direction at regular angular intervals (of 60°) in the circumferential direction. The chuck supporting part 26 includes an annular portion 261 having a substantially annular disk-like shape and a plurality of protruding portions 262 protruding inward in a radial direction from the annular portion 261. As shown in FIG. 1, the annular portion 261 is fixed to a lower end of the rotor part 52. The plurality of protruding portions 262 are positioned on an inner side relative to the rotor part 52 in the radial direction about the central axis J1, and the chuck part 21 is attached onto each of the protruding portions 262. The plurality of chuck parts 21 are also disposed on an inner side relative to the rotor part 52 in the radial direction. Further, a lower portion of each of the chuck parts 21 and the chuck supporting part 26 are positioned inside the annular recessed portion 714.

Figure 4:
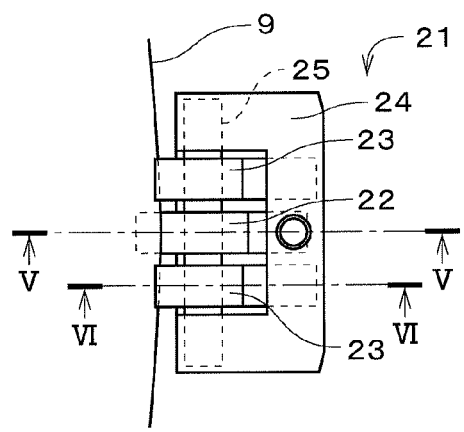
FIG. 4 is an enlarged plan view showing a chuck part.

FIG. 4 is an enlarged plan view showing one chuck part 21. The other chuck parts 21 each have the same structure as that of the chuck part 21 shown in FIG. 4. As shown in FIG. 4, each of the chuck parts 21 includes one substrate supporting part 22 for supporting the substrate 9 from below and two substrate retaining parts 23 for retaining the substrate 9 from above. In the chuck part 21, the two substrate retaining parts 23 are disposed on both sides of the substrate supporting part 22 in the circumferential direction, adjacently to the substrate supporting part 22.

Figure 5:
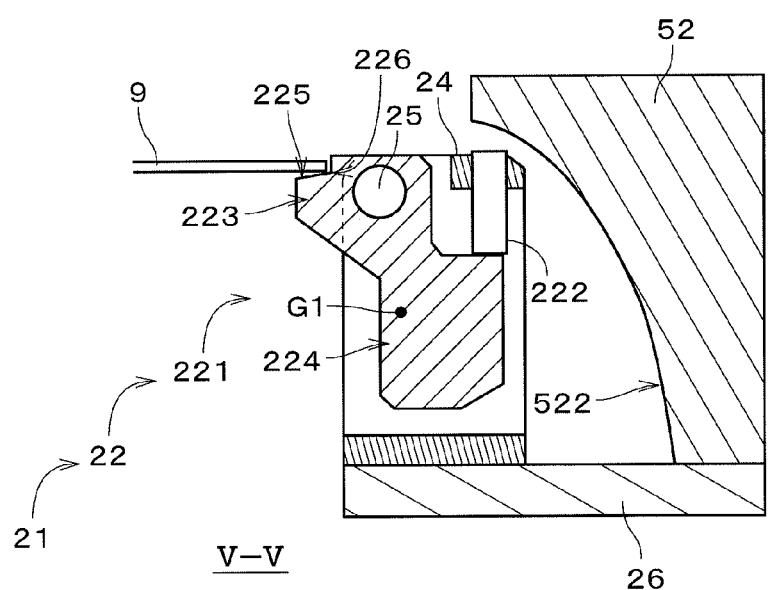
FIGS. 5 to 8 are cross sections each showing the chuck part.
Figure 6:
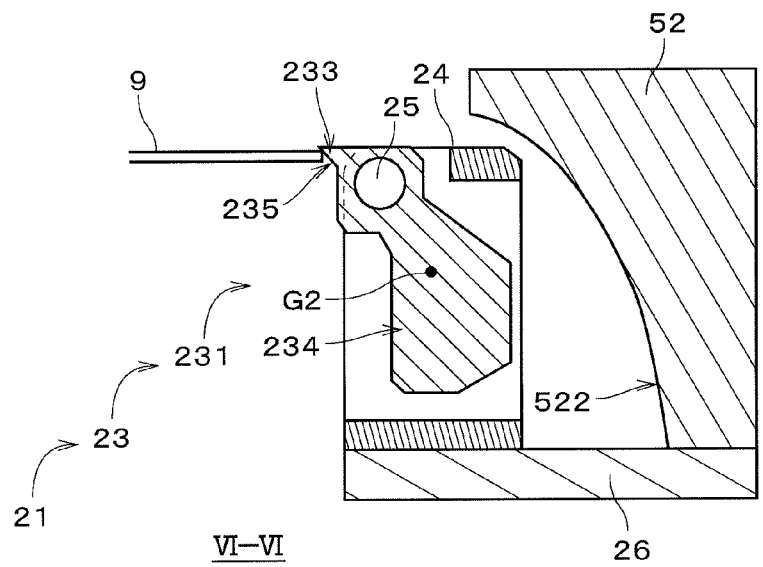

FIG. 5 is a cross section showing the chuck part 21, taken along a line A-A of FIG. 4. FIG. 6 is a cross section showing the chuck part 21, taken along a line B-B of FIG. 4. Both FIGS. 5 and 6 also show a portion behind the cross section of the chuck part 21 and the cross section of the rotor part 52 (the same applies to FIGS. 7 and 8). As shown in FIGS. 4 to 6, the chuck part 21 further includes a frame 24 and a rotation axis 25. As shown in FIGS. 5 and 6, the frame 24 is disposed on an inner side relative to an inner peripheral surface 522 of the rotor part 52. A lower end portion of the frame 24 is attached to a lower end portion of the rotor part 52 with the chuck supporting part 26 interposed therebetween. The rotation axis 25 is attached to an upper end portion of the frame 24, being oriented horizontally.

As shown in FIG. 5, the substrate supporting part 22 includes a supporting body 221 and a first stopper 222. The supporting body 221 is provided with a through hole into which the rotation axis 25 is inserted, and is rotatable about the rotation axis 25. The first stopper 222 is attached to the frame 24, being threadedly engaged in a screw hole which is provided at an upper portion of the frame 24 and oriented vertically. The position of the first stopper 222 in the vertical direction is easily changeable by rotating the first stopper 222.

The supporting body 221 has a first substrate contact part 223 and a first anchor part 224. The first substrate contact part 223 is positioned on an inner side relative to the rotation axis 25 in the radial direction, coming into contact with the outer edge of the substrate 9 from below. The first anchor part 224 is positioned below the rotation axis 25. The first stopper 222 is positioned above the first anchor part 224, coming into contact with an upper portion of the first anchor part 224. It is thereby possible to prevent the first anchor part 224 from rotating counterclockwise from the state shown in FIG. 5 and moving upward.

Figure 7:
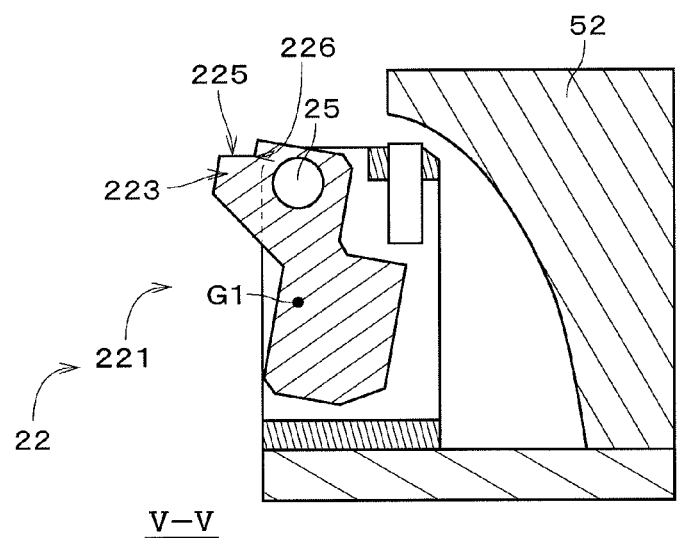

In the substrate supporting part 22, a barycentric position G1 of the supporting body 221 is positioned below the rotation axis 25 on an outer side relative to the rotation axis 25 in the radial direction. Therefore, when the substrate 9 is removed from on the first substrate contact part 223, the supporting body 221 rotates clockwise from the position shown in FIG. 5 and is brought into a state shown in FIG. 7 where the barycentric position G1 is positioned just below the rotation axis 25 in the vertical direction. In the following discussion, a position of the supporting body 221 shown in FIG. 5 is referred to as a "first holding position" and a position of the supporting body 221 shown in FIG. 7 is referred to as a "first waiting position".

As discussed above, the supporting body 221 is rotatable about the rotation axis 25 between the first waiting position and the first holding position. In the substrate supporting part 22, the substrate 9 is placed on the first substrate contact part 223, and with the weight of the substrate 9 applied to the first substrate contact part 223, the supporting body 221 rotates from the first waiting position shown in FIG. 7 to the first holding position shown in FIG. 5, where the supporting body 221 supports the substrate 9 from below. Further, while the substrate 9 is placed on the first substrate contact part 223, the movement of the supporting body 221 is limited with the first anchor part 224 brought into contact with the first stopper 222.

The first substrate contact part 223 has a first contact surface 225 which is a surface to be brought into contact with the outer edge of the substrate 9. As shown in FIG. 5, while the substrate supporting part 22 is positioned at the first holding position, the first contact surface 225 is a sloped surface which goes downward as it goes inward in the radial direction. To be precise, the first contact surface 225 is part of a conical surface. Further, as shown in FIG. 7, while the substrate supporting part 22 is positioned at the first waiting position, the first contact surface 225 is a substantially horizontal ring-shaped surface. An outer edge 226 of the first contact surface 225 in the radial direction in the case where the substrate supporting part 22 is positioned at the first waiting position is positioned on an outer side in the radial direction relative to the edge 226 in the case where the substrate supporting part 22 is positioned at the first holding position. Therefore, since a mountable area for the substrate 9 is larger than that in a structure where the substrate supporting part 22 is fixed at the first holding position regardless of the presence or absence of the substrate 9, it becomes possible to more easily mount the substrate 9 onto the first contact surface 225 of the first substrate contact part 223.

As shown in FIG. 6, the substrate retaining part 23 includes a retaining body 231. The retaining body 231 is provided with a through hole into which the rotation axis 25 is inserted, and is rotatable about the rotation axis 25. Assuming that the center of rotation of the above-described supporting body 221 is referred to as a "first rotation axis" and the center of rotation of the retaining body 231 is referred to as a "second rotation axis", the first rotation axis of the substrate supporting part 22 and the second rotation axis of the substrate retaining part 23 which is disposed adjacently to the substrate supporting part 22 are the same one, i.e., the rotation axis 25.

Figure 30:
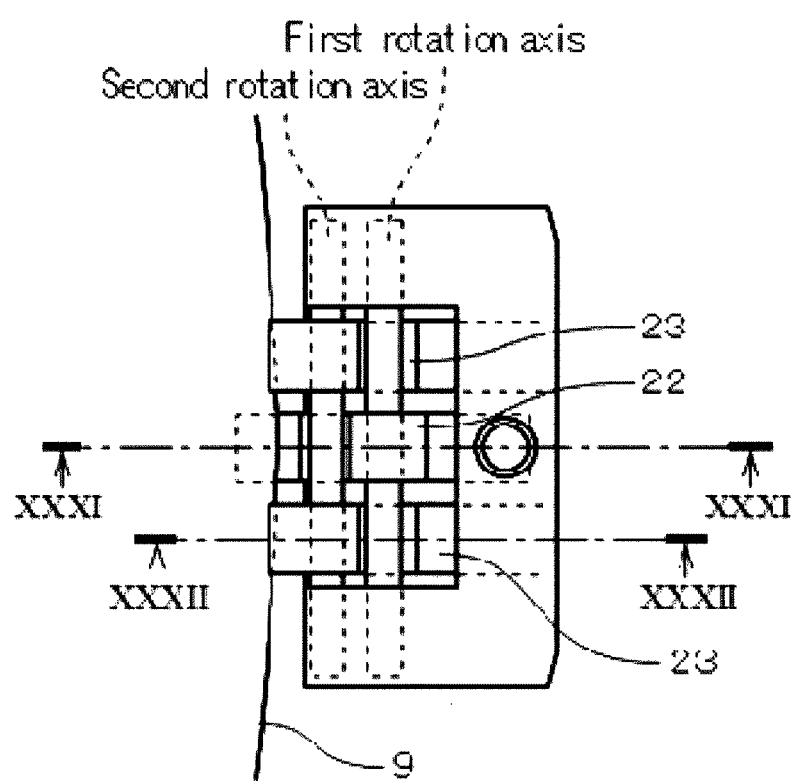
FIG. 30 is a view of a chuck part corresponding to FIG. 4, showing distinct first and second rotation axes.
Figure 31:
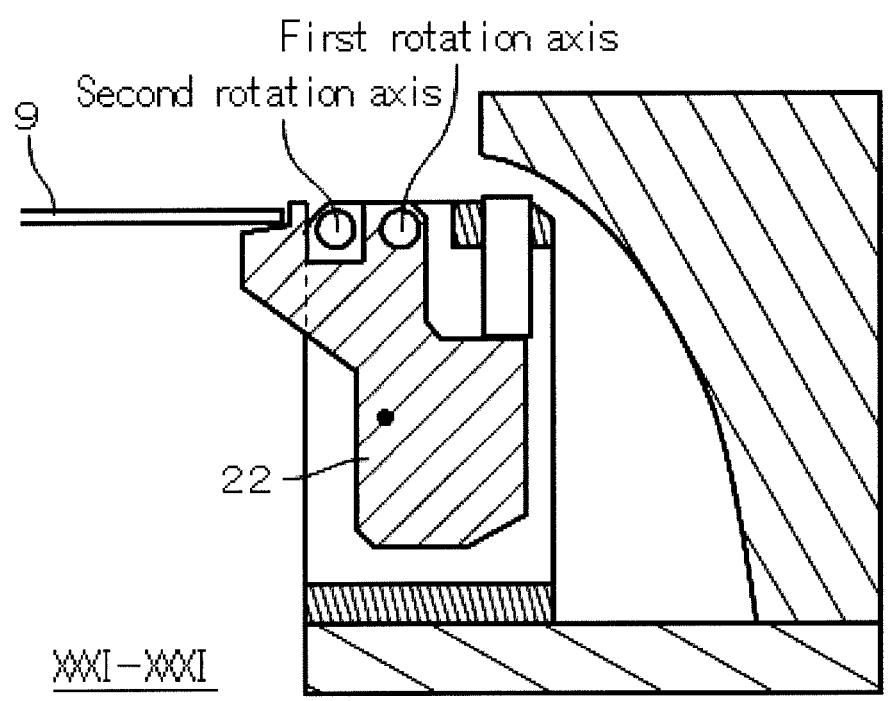
FIG. 31 is a view of a chuck part corresponding to FIG. 5, showing distinct first and second rotation axes.
Figure 32:
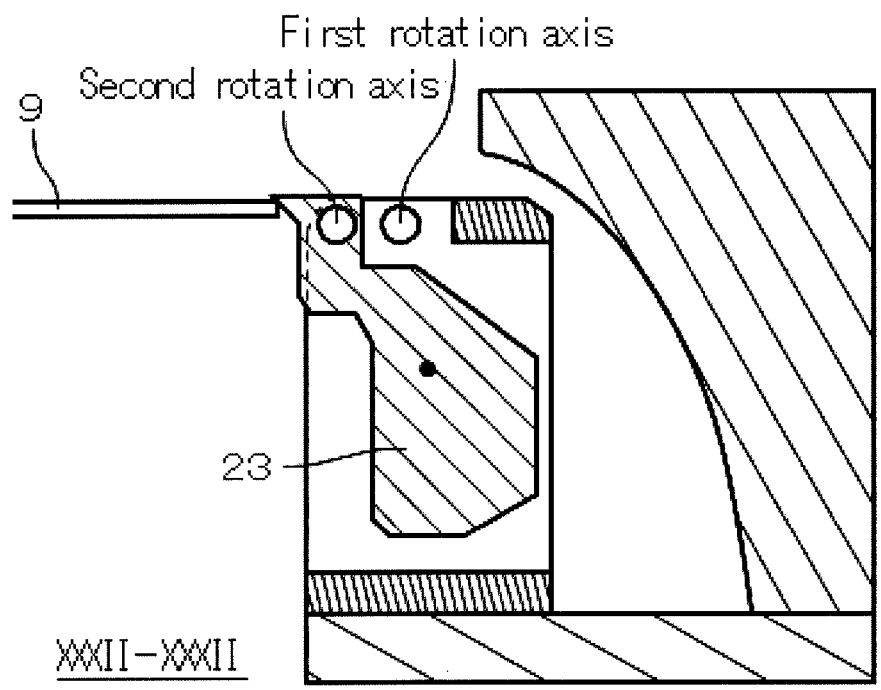
FIG. 32 is a view of a chuck part corresponding to FIG. 6, showing distinct first and second rotation axes.

FIGS. 30-32 are views of chuck parts respectively corresponding to FIGS. 4-6, each showing distinct first and second rotation axes.

The retaining body 231 has a second substrate contact part 233 and a second anchor part 234. The second substrate contact part 233 is positioned on an inner side relative to the rotation axis 25 in the radial direction, coming into contact with the outer edge of the substrate 9 from above. The second anchor part 234 is positioned below the rotation axis 25.

Figure 8:
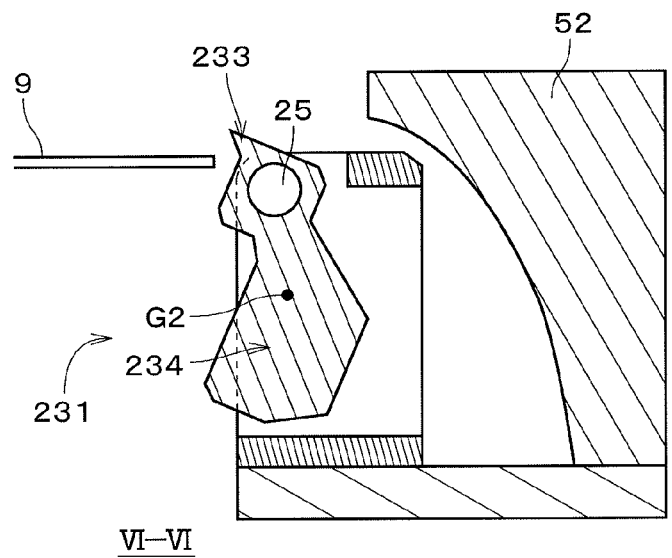

In the substrate retaining part 23, while the rotor part 52 and the substrate holding part 2 are both still, the retaining body 231 rotates by its own weight from the position shown in FIG. 6, causing a state shown in FIG. 8 where a barycentric position G2 is positioned just below the rotation axis 25 in the vertical direction. The second anchor part 234 has such a shape as not to come into contact with the chamber bottom 711 and the like disposed on an inner side in the radial direction in the state of FIG. 8. In the state of FIG. 8, the second substrate contact part 233 is positioned above the substrate 9, being away therefrom, and on an outer side relative to the outer edge of the substrate 9 in the radial direction. In the following discussion, a position of the retaining body 231 shown in FIG. 6 is referred to as a "second holding position" and a position of the retaining body 231 shown in FIG. 8 is referred to as a "second waiting position".

The retaining body 231 is rotatable about the rotation axis 25 between the second waiting position and the second holding position. In the substrate processing apparatus 1, when the substrate holding part 2 is rotated together with the rotor part 52, centrifugal force due to rotation performed by the substrate rotating mechanism 5 is exerted on the second anchor part 234, and the retaining body 231 thereby rotates from the second waiting position shown in FIG. 8 to the second holding position shown in FIG. 6, where the retaining body 231 retains the substrate 9 from above at the second substrate contact part 233. The second substrate contact part 233 has a second contact surface 235 which is a surface to be brought into contact with the outer edge of the substrate 9. As shown in FIG. 6, while the substrate retaining part 23 is positioned at the second holding position, the second contact surface 235 is a sloped surface which goes upward as it goes inward in the radial direction.

Further, when the rotation of the rotor part 52 is stopped and the centrifugal force exerted on the second anchor part 234 is released, the retaining body 231 rotates clockwise from the second holding position in FIG. 6. Then, as shown in FIG. 8, while the barycentric position G2 of the second anchor part 234 is positioned just below the rotation axis 25 in the vertical direction, the retaining body 231 stops rotating, to be positioned at the second waiting position.

Figure 9:
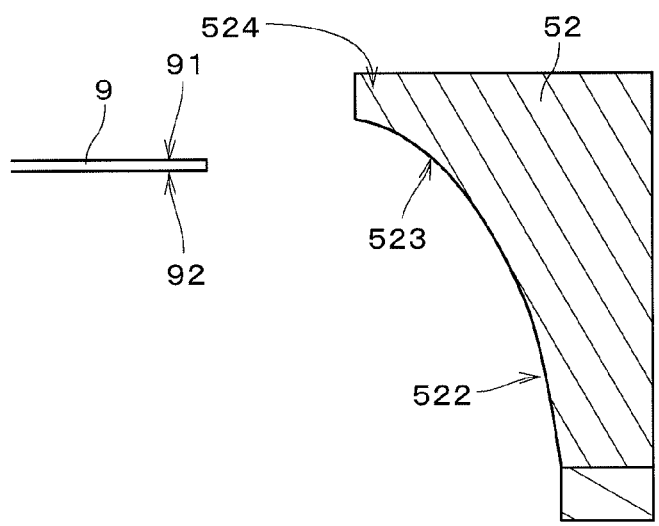
FIG. 9 is a cross section showing a rotor part.

FIG. 9 is a cross section showing the rotor part 52 taken at a position where the chuck part 21 is not provided. FIG. 9 also shows the substrate 9 held by the substrate holding part 2 (see FIG. 3). As shown in FIG. 9, the rotor part 52 is provided across from a position upper than the upper surface 91 of the substrate 9 to a position lower than the lower surface 92 of the substrate 9 in the vertical direction. The inner peripheral surface 522 of the rotor part 52 includes a cylindrical liquid receiving surface 523 which is opposed to the outer peripheral edge of the substrate 9 in the radial direction to receive the processing liquid spattering from the outer peripheral edge of the substrate 9. The liquid receiving surface 523 extends upward to be higher than the upper surface 91 of the substrate 9 in the vertical direction and also extends downward to be lower than the lower surface 92 of the substrate 9. Further, the liquid receiving surface 523 is a sloped surface which gradually goes outward in the radial direction as it goes downward, thereby guiding the processing liquid received from the substrate 9 downward. In this preferred embodiment, the liquid receiving surface 523 shown in FIG. 9 has a substantially arc cross section. Further, the cross section of the liquid receiving surface 523 may have various shapes. For example, the cross section of the liquid receiving surface 523 may have a linear shape which goes outward in the radial direction as it goes downward. The rotor part 52 includes an annular protruding portion 524 protruding inward in the radial direction on an upper side of the liquid receiving surface 523.

Figure 10:
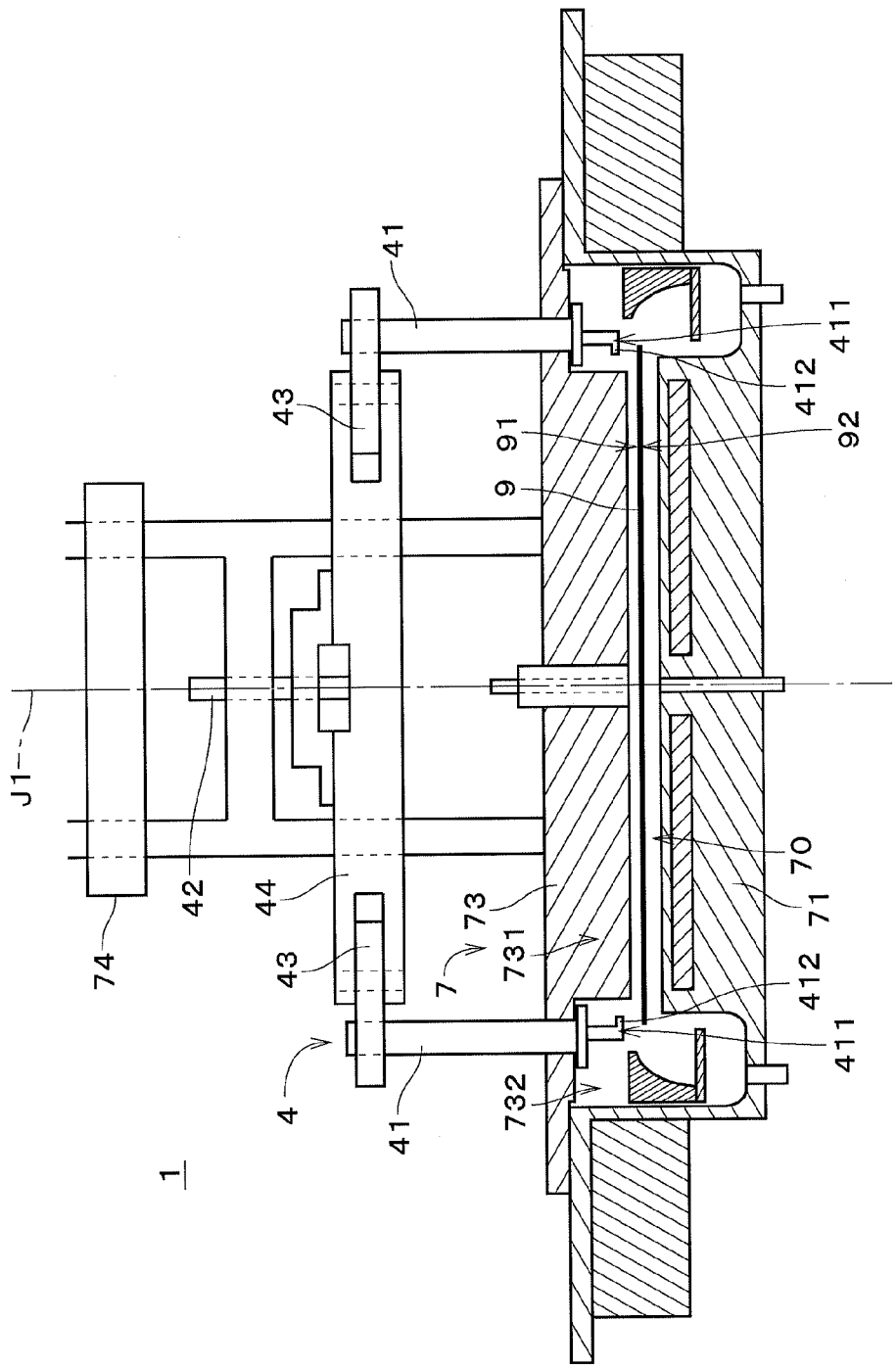
FIGS. 10 to 12 are cross sections each showing a substrate processing apparatus.

FIG. 10 is a cross section showing the substrate processing apparatus 1 taken at a position which goes through the central axis J1 and is different from that in FIG. 1. In FIG. 10, the first processing liquid supply part 31, the second processing liquid supply part 32, the third processing liquid supply part 33, the gas supply part 61, the suction part 62, and the like are omitted, and a side view of the substrate moving mechanism 4, the cover moving mechanism 74, and the like is shown (the same applies to FIGS. 11, 12, 14, 16, 17, and the like).

As shown in FIG. 10, the substrate moving mechanism 4 includes a plurality of lift pins 41, a lift pin moving mechanism 42, a plurality of lift pin rotating mechanisms 43, and a lift pin supporting part 44. The plurality of (four in this preferred embodiment) lift pins 41 are arranged at regular angular intervals in the circumferential direction about the central axis J1 above the outer edge of the substrate 9. The four lift pins 41 are disposed so as to sidestep the plurality of chuck parts 21 (see FIG. 3) in the circumferential direction. Each of the lift pins 41 is inserted into a through hole penetrating the chamber cover 73, and the through hole is sealed to avoid the flow of gas.

A lower portion of each lift pin 41 protrudes downward from the chamber cover 73. While the chamber 7 is sealed, the plurality of lift pins 41 are disposed in the upper annular space 732 around the cover protruding portion 731. In other words, the cover protruding portion 731 of the chamber cover 73 is positioned on an inner side relative to the plurality of lift pins 41 in the radial direction. Each of the lift pins 41 has a hook part 412 protruding in a substantially horizontal direction from a tip portion 411 (i.e., a lower end portion). In the state of FIG. 10, the tip portions 411 and the hook parts 412 of the lift pins 41 are positioned above the upper surface 91 of the substrate 9 held by the substrate holding part 2 (see FIG. 1). In the following discussion, a position where the lift pins 41 and the tip portions 411 thereof are located as shown in FIG. 10 is referred to an "escape position".

Respective upper portions of the lift pins 41 are supported by the lift pin supporting part 44 with the lift pin rotating mechanisms 43 interposed therebetween above the chamber cover 73. The lift pin supporting part 44 is attached to the cover moving mechanism 74 with the lift pin moving mechanism 42 interposed therebetween. In the substrate moving mechanism 4, by driving the lift pin moving mechanism 42, the lift pin supporting part 44 is moved vertically. The plurality of lift pins 41 are thereby moved in the vertical direction relatively to the chamber cover 73 while the chamber cover 73 is still.

Figure 11:
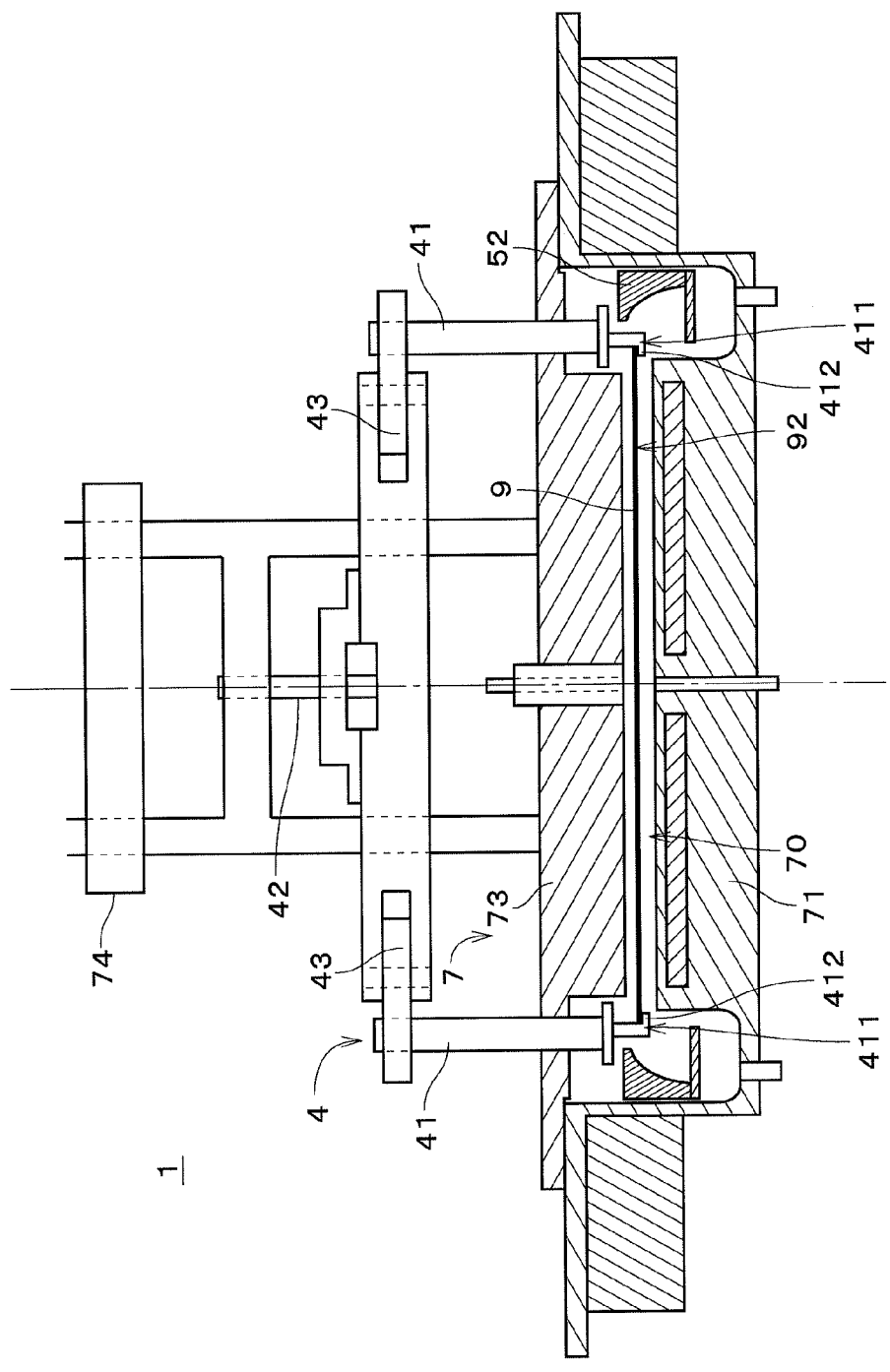

In order to unload the substrate 9 held by the substrate holding part 2 to the outside of the chamber 7, the lift pin moving mechanism 42 is driven to cause the plurality of lift pins 41 to move downward from the escape position shown in FIG. 10, and the respective tip portions 411 of the plurality of lift pins 41 are positioned to be slightly lower than the lower surface 92 of the substrate 9 as shown in FIG. 11. In the following discussion, a position where the lift pins 41 and the tip portions 411 thereof are located relatively to the chamber cover 73 as shown in FIG. 11 is referred to a "transfer position". During a period while each of the tip portions 411 is moved, the hook part 412 of the tip portion 411 is oriented in the circumferential direction. Subsequently, the plurality of lift pin rotating mechanisms 43 are driven to cause the plurality of lift pins 41 to rotate 90 degrees, respectively, and the respective hook parts 412 are directed inward in the radial direction. In this state, the respective hook parts 412 of the lift pins 41 are positioned to be slightly lower than the lower surface 92 of the substrate 9, not being in contact with the substrate 9 held by the substrate supporting part 22. Then, the chamber cover 73 is moved upward by the cover moving mechanism 74, and the plurality of lift pins 41 thereby slightly go upward to bring the hook parts 412 of the lift pins 41 into contact with the lower surface 92 of the substrate 9. Thus, the substrate 9 is transferred from the substrate holding part 2 to the plurality of lift pins 41.

In the substrate moving mechanism 4, thus, the respective tip portions 411 of the plurality of lift pins 41 are moved down from the escape position shown in FIG. 10 to the transfer position shown in FIG. 11 by the lift pin moving mechanism 42, and at the transfer position, the substrate 9 is transferred between the plurality of lift pins 41 and the substrate holding part 2 (see FIG. 1). After the plurality of lift pins 41 each rotate 90 degrees and the hook parts 412 are directed inward in the radial direction and positioned below the substrate 9, the cover moving mechanism 74 is driven to cause the constituent elements in the substrate moving mechanism 4 to go upward together with the chamber cover 73. At that time, the rotor part 52 is still and the substrate retaining part 23 is positioned at the second waiting position shown in FIG. 8. Therefore, since the second substrate contact part 233 of the substrate retaining part 23 is positioned on an outer side in the radial direction relative to the outer peripheral edge of the substrate 9, being away from the substrate 9, the substrate retaining part 23 does not block the rise of the substrate 9. Further, after the substrate 9 is moved apart from the substrate supporting part 22, the substrate supporting part 22 rotates from the first holding position shown in FIG. 5 to the first waiting position shown in FIG. 7.

Figure 12:
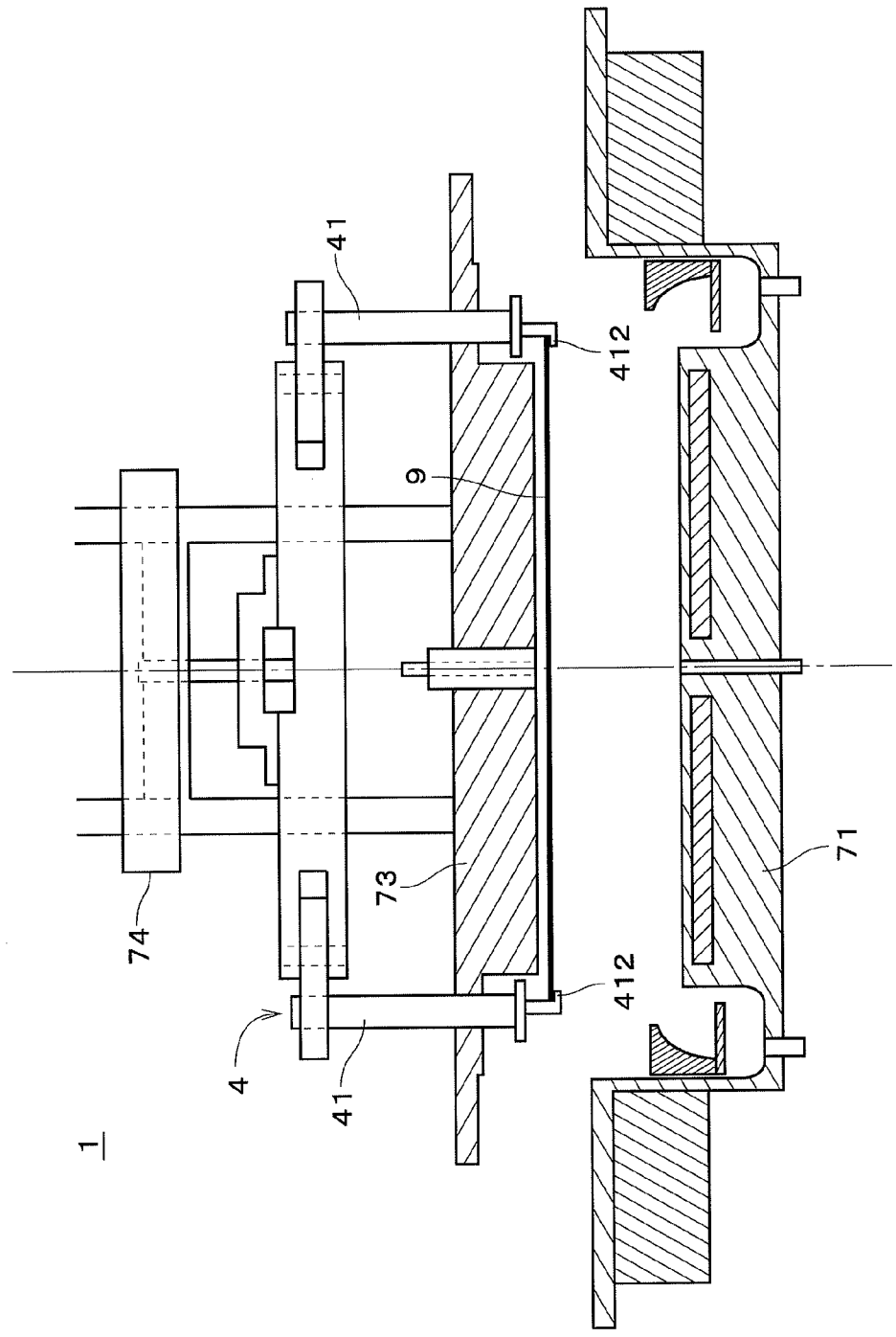

In the substrate processing apparatus 1, as shown in FIG. 12, while the chamber cover 73 is positioned above and apart from the chamber body 71, the substrate 9 held on the respective hook parts 412 of the plurality of lift pins 41 is unloaded by a not-shown arm. In the following discussion, a position of the chamber cover 73 shown in FIG. 12, i.e., a position above and away from the chamber body 71 is referred to as an "opening position". Further, a position of the chamber cover 73 shown in FIGS. 10 and 11, i.e., a position where the chamber cover 73 closes the opening of the chamber body 71 to form the internal space 70 is referred to as a "closing position".

In order to load the substrate 9 into the chamber 7, the substrate 9 held by the not-shown arm approaches the chamber cover 73 positioned at the opening position shown in FIG. 12 and is mounted on the respective hook parts 412 of the plurality of lift pins 41. Subsequently, the chamber cover 73 is moved downward by the cover moving mechanism 74, to be positioned at the closing position. In a process where the chamber cover 73 goes down, as shown in FIG. 11, the substrate 9 is transferred from the respective hook parts 412 of the plurality of lift pins 41 which are positioned at the transfer position, to the plurality of substrate supporting parts 22 of the substrate holding part 2 (see FIG. 5).

Then, after the substrate 9 is moved apart from the respective hook parts 412 of the plurality of lift pins 41, the lift pins 41 are rotated 90 degrees by the plurality of lift pin rotating mechanisms 43, respectively. The plurality of hook parts 412 are thereby moved from below the substrate 9 to the outer side in the radial direction relative to the outer peripheral edge of the substrate 9. After that, the plurality of lift pins 41 are moved upward by the lift pin moving mechanism 42, to be positioned at the escape position shown in FIG. 10. Specifically, when the chamber cover 73 is positioned at the closing position and the lift pins 41 are positioned at the escape position, the lift pins 41 are accommodated in the upper annular space 732 as shown in FIG. 10.

Next, with reference to FIG. 13, discussion will be made on an operation flow for processing the substrate 9 in the substrate processing apparatus 1. In the substrate processing apparatus 1, first, the chamber cover 73 holding the substrate 9 with the plurality of lift pins 41 shown in FIG. 12 is moved down from the opening position to the closing position shown in FIG. 11. With this movement, the internal space 70 is formed in the chamber 7 and the substrate 9 is supported from below by the plurality of substrate supporting parts 22 (see FIG. 5). After the internal space 70 is formed, the gas supply part 61 and the suction part 62 are driven, the internal space 70 is brought into a nitrogen atmosphere of normal pressure. Then, the plurality of lift pins 41 are moved upward to the escape position and the substrate rotating mechanism 5 is controlled by the rotation control part 113 of the control part 11 (see FIG. 2), to thereby start rotation of the rotor part 52, the substrate holding part 2, and the substrate 9 shown in FIG. 1 (Step S11). In the substrate holding part 2, with the centrifugal force due to the rotation exerted thereon, the retaining bodies 231 are rotated, to cause the second substrate contact parts 233 to retain the substrate 9 from above as shown in FIG. 6. The substrate 9 is thereby held by the substrate holding part 2 (Step S12).

Subsequently, the temperature control part 114 (see FIG. 2) controls the heating part 79, to heat the substrate 9 for a predetermined time period in the internal space 70 under normal pressure (Step S13). After the heating of the substrate 9 is finished, the liquid supply control part 111 controls the first processing liquid supply part 31, to continuously supply the first processing liquid which is an etching solution from the first upper nozzle 75 shown in FIG. 1 onto the upper surface 91 of the substrate 9 being rotated. The first processing liquid supplied onto the center portion of the upper surface 91 of the substrate 9 is spread toward the outer peripheral portion thereof by the rotation of the substrate 9, and the entire upper surface 91 is coated with the first processing liquid (Step S14). Further, the first processing liquid is also supplied onto the center portion of the lower surface 92 of the substrate 9 from the lower nozzle 76 and spread toward the outer peripheral portion thereof by the rotation of the substrate 9. The first processing liquid flowing from the upper surface 91 of the substrate 9 and the first processing liquid flowing from the lower surface 92 of the substrate 9 are sucked by the suction part 62 and discharged through the lower discharge parts 77 to the outside of the chamber 7.

After coating of the upper surface 91 of the substrate 9 with the first processing liquid is finished, the pressure control part 112 controls the gas supply part 61 and the suction part 62, to increase the pressure in the internal space 70 of the chamber 7 to be a predetermined pressure higher than the normal pressure (preferably, higher than the normal pressure and not higher than a pressure which is higher than the normal pressure by about 0.1 MPa). Further, the first processing liquid supply part 31 and the substrate rotating mechanism 5 are controlled, to thereby decrease the amount of first processing liquid supplied per unit time (hereinafter, referred to as "flow rate") and decrease the number of rotation of the substrate 9. When the internal space 70 of the chamber 7 comes into a predetermined pressurized atmosphere, the first processing liquid is continuously supplied at the flow rate lower than that in Step S14 onto the upper surface 91 of the substrate 9 being rotated at the number of rotation lower than that in Step S14, and an etching process is performed for a predetermined time period (Step S15).

In Step S15, after the upper surface 91 of the substrate 9 is coated with the first processing liquid, the pressure in the internal space 70 of the chamber 7 is increased to bring the internal space 70 into the pressurized atmosphere, to thereby squeeze the first processing liquid into a gap between fine patterns (hereinafter, referred to as a "pattern gap") on the substrate 9. As a result, it is possible to cause the first processing liquid to more easily enter the pattern gap. It is thereby possible to appropriately perform the etching process in the pattern gap. This suppresses vaporization of the first processing liquid on the substrate 9 as compared with under normal pressure, and further suppresses a decrease in the temperature of the substrate 9 due to the heat of vaporization as it goes from the center portion of the substrate 9 toward the peripheral portion thereof. As a result, it is possible to improve uniformity in the temperature of the upper surface 91 of the substrate 9 being subjected to the etching process using the first processing liquid and improve the uniformity of etching over the entire upper surface 91 of the substrate 9. Further, the uniformity of etching over the entire lower surface 92 of the substrate 9 can be also improved.

As discussed above, the number of rotation of the substrate 9 in the etching process performed on the substrate 9 in Step S15 is smaller than that of the substrate 9 in the process of coating the upper surface 91 of the substrate 9 with the first processing liquid in Step S14. This further suppresses vaporization of the first processing liquid from the substrate 9 and it is thereby possible to further improve the uniformity in the temperature of the upper surface 91 of the substrate 9 being subjected to the etching process. As a result, it is possible to further improve the uniformity of etching over the entire upper surface 91 of the substrate 9.

Subsequently, the pressure control part 112 controls the gas supply part 61 and suction part 62, to thereby decrease the pressure in the internal space 70 of the chamber 7 back to the normal pressure. Then, the supply of the first processing liquid from the first processing liquid supply part 31 is stopped, and the heating of the substrate 9 by the heating part 79 is also stopped.

Next, the liquid supply control part 111 controls the second processing liquid supply part 32, to thereby continuously supply the second processing liquid which is deionized water from the first upper nozzle 75 onto the upper surface 91 of the substrate 9 being rotated. The second processing liquid supplied onto the center portion of the upper surface 91 of the substrate 9 which is coated with the first processing liquid is spread toward the outer peripheral portion thereof, and the first processing liquid on the upper surface 91 is moved outward in the radial direction and spatters from the outer peripheral edge of the substrate 9 to the outside. Further, the second processing liquid is supplied from the lower nozzle 76 onto the center portion of the lower surface 92 of the substrate 9 and spread toward the outer peripheral portion thereof by the rotation of the substrate 9. Then, the second processing liquid continues to be supplied from the first upper nozzle 75 and the lower nozzle 76 and a rinse process is thereby performed on the upper surface 91 and the lower surface 92 of the substrate 9 for a predetermined time period (Step S16).

The first processing liquid and the second processing liquid spattering from the upper surface 91 of the substrate 9 is received by the liquid receiving surface 523 of the rotor part 52 (see FIG. 9) and guided downward, i.e., to the lower discharge parts 77. Then, the first and second processing liquids from the upper surface 91, together with the second processing liquid from the lower surface 92 of the substrate 9, are sucked by the suction part 62 and discharged through the lower discharge parts 77 to the outside of the chamber 7.

After the rinse process is finished, the supply of the second processing liquid from the second processing liquid supply part 32 is stopped, and the liquid supply control part 111 controls the third processing liquid supply part 33, to continuously supply the third processing liquid which is isopropyl alcohol (IPA) from the first upper nozzle 75 onto the upper surface 91 of the substrate 9 being rotated. The third processing liquid supplied onto the center portion of the upper surface 91 of the substrate 9 which is coated with the second processing liquid is spread toward the outer peripheral portion thereof between a liquid film of the second processing liquid and the upper surface 91 of the substrate 9 by the rotation of the substrate 9, to coat the upper surface 91 of the substrate 9. The liquid film of the second processing liquid is positioned on a liquid film of the third processing liquid, being away from the upper surface 91 of the substrate 9. In other words, an IPA replacement process is performed on the upper surface 91 of the substrate 9 (Step S17).

Subsequently, the pressure control part 112 controls the gas supply part 61 and the suction part 62, to bring the internal space 70 of the chamber 7 into a predetermined pressurized atmosphere (Step S18). The pressure in the internal space 70 is preferably higher than the normal pressure and not higher than a pressure which is higher than the normal pressure by about 0.1 MPa. It is thereby possible to cause the third processing liquid to more easily enter the pattern gap, and it is also possible to efficiently replace the second processing liquid in the pattern gap with the third processing liquid.

The second processing liquid on the liquid film of the third processing liquid is moved outward in the radial direction by the rotation of the substrate 9 and spatters from the outer peripheral edge of the substrate 9 to the outside. The second processing liquid spattering from the substrate 9 is received and guided downward by the liquid receiving surface 523 of the rotor part 52 and discharged by the suction part 62 through the lower discharge parts 77 to the outside of the chamber 7.

When a predetermined time passes after the internal space 70 is brought into the pressurized atmosphere, the gas supply part 61 and the suction part 62 are controlled to decrease the pressure of the internal space 70 of the chamber 7 to a predetermined pressure lower than the normal pressure (preferably, lower than the normal pressure and not lower than about 15 kPa) (Step S19). Further, the heating part 79 is controlled to heat the substrate 9.

Then, while the internal space 70 is brought into a predetermined reduced pressure atmosphere, the substrate rotating mechanism 5 is controlled to increase the number of rotation of the substrate 9, and the substrate 9 thus rotates at high speed. The third processing liquid on the upper surface 91 of the substrate 9 is thereby moved outward in the radial direction and spatters from the outer peripheral edge of the substrate 9 to the outside. The third processing liquid spattering from the substrate 9 is also received and guided downward by the liquid receiving surface 523 of the rotor part 52 and discharged by the suction part 62 through the lower discharge parts 77 to the outside of the chamber 7. In the substrate processing apparatus 1, the third processing liquid is removed from the substrate 9, and a drying process of the substrate 9 is completed (Step S20).

In Step S20, since the substrate 9 is dried while being rotated in the reduced pressure atmosphere of the internal space 70 of the chamber 7, it is possible to perform drying of the substrate 9 in a shorter time as compared with drying under normal pressure. Further, since the substrate 9 is heated by the heating part 79 concurrently with the drying of the substrate 9 in the reduced pressure atmosphere, it is possible to accelerate the drying of the substrate 9.

After the drying of the substrate 9 is completed, the rotation of the substrate 9 is stopped (Step S21), and the pressure in the internal space 70 of the chamber 7 is increased back to the normal pressure. Then, the substrate 9 is transferred from the substrate holding part 2 to the plurality of lift pins 41, and after the chamber cover 73 goes upward from the closing position to the opening position, the substrate 9 is unloaded by the not-shown arm. The same operation flow for processing the substrate 9 is performed in the second to sixth preferred embodiments discussed later.

In the substrate processing apparatus 1, as discussed above, the substrate holding part 2 holding the substrate 9 and the rotor part 52 attached to the substrate holding part 2 are disposed in the internal space 70 of the chamber 7 which is a sealed space, and the stator part 51 which generates a rotating force between itself and the rotor part 52 is disposed around the rotor part 52 outside the chamber 7. It is thereby possible to easily form the internal space 70 having excellent sealability and easily rotate the substrate 9 in the internal space 70 as compared with the apparatus provided with a servo motor or the like for rotating the substrate outside the chamber 7. As a result, it is possible to easily perform single-substrate processing of the substrate 9 in the sealed internal space 70. It is also possible to easily provide various constituent elements such as the lower nozzle 76 and the like at the chamber bottom 711 as compared with the apparatus in which the above servo motor or the like is provided below the chamber bottom.

In the substrate processing apparatus 1, since the gas supply part 61 for supplying the internal space 70 with gas, the suction part 62 for discharging gas from the internal space 70, and the pressure control part 112 for controlling the pressure in the internal space 70, processing of the substrate 9 can be performed in various atmospheres (for example, a low oxygen atmosphere) and under various pressures. It is thereby possible to shorten the time required for the processing of the substrate 9 and perform various processings on the substrate 9.

In the substrate rotating mechanism 5, as discussed above, the rotor part 52 rotates, being in a floating state in the internal space 70. Therefore, it is not necessary to provide any structure for supporting the rotor part 52 in the internal space 70, and it is thereby downsize the substrate processing apparatus 1 and simplify the configuration of this apparatus. Further, since no dust is generated due to friction between the rotor part 52 and the supporting structure, it is possible to improve cleanability of the internal space 70. Furthermore, since no friction resistance caused by the supporting structure is exerted on the rotor part 52, it is possible to easily rotate the rotor part 52 at high speed. Since the rotor part 52 is disposed in an annular space (mainly the lower annular space 717 in this preferred embodiment) formed around the substrate 9, it is possible to cause a lower surface of the cover protruding portion 731 to be close to the upper surface 91 of the substrate 9 and cause an upper surface of the chamber bottom 711 to be close to the lower surface 92 of the substrate 9. It is therefore possible to prevent the volumetric capacity of the internal space 70 from becoming larger than necessary and efficiently increase or reduce the pressure in the internal space 70.

In the substrate processing apparatus 1, as discussed above, since the first upper nozzle 75 is attached to the chamber cover 73, it is possible to easily supply the processing liquid onto the upper surface 91 of the substrate 9 disposed in the internal space 70. Further, since the lower nozzle 76 is attached to the chamber body 71, it is possible to easily supply the processing liquid onto the lower surface 92 of the substrate 9 disposed in the internal space 70.

In the substrate processing apparatus 1, as discussed above, the substrate 9 is transferred by the plurality of lift pins 41 protruding downward from the chamber cover 73 to/from the substrate holding part 2. Since it is not thereby necessary to provide a mechanism for transferring the substrate 9 below the chamber 7, for providing another structure (e.g., an ultrasonic cleaning mechanism) below the chamber 7, the degree of freedom in arrangement of the structure is improved. Further, since the chamber cover 73 includes the cover protruding portion 731 protruding downward in an inner side in the radial direction relative to the plurality of lift pins 41, it is possible to reduce a processing space on the substrate 9 while the chamber 7 is sealed to form the internal space 70. In a case where processing is performed with the processing liquid filling between the upper surface 91 of the substrate 9 and the chamber cover 73, the processing can be thereby easily performed. Further, since the lift pins 41 are accommodated in the upper annular space 732 when the substrate 9 is processed, it is possible to prevent the processing liquid flowing from the substrate 9 from hitting against the lift pins 41, splashing back, and being deposited onto the substrate 9.

In the substrate holding part 2, as discussed above, by placing the substrate 9 on the first substrate contact part 223, the substrate supporting parts 22 each rotate from the first waiting position to the first holding position to support the substrate 9 from below. Then, the substrate retaining parts 23 each rotate from the second waiting position to the second holding position by the centrifugal force due to rotation performed by the substrate rotating mechanism 5 to retain the substrate 9 from above at the second substrate contact part 233. Thus, it is possible to easily hold the substrate 9 in the sealed internal space 70 without providing any driving mechanism which is mechanically connected to the substrate supporting parts 22 and the substrate retaining parts 23 and drives the substrate supporting parts 22 and the substrate retaining parts 23 in the substrate holding part 2. It is thereby possible to downsize the substrate processing apparatus 1 and simplify the configuration of this apparatus as compared with the case where such a driving mechanism is provided. Further, it is possible to improve the sealability of the internal space 70 of the chamber 7 as compared with the case where the driving mechanism is provided outside the chamber and connected to the substrate holding part.

In the substrate holding part 2, one rotation axis 25 serves both as the rotation axis of the substrate supporting part 22 and as that of the substrate retaining part 23 in each of the chuck parts 21. It is thereby possible to simplify the configuration of the substrate holding part 2. In each of the chuck parts 21, two substrate retaining parts 23 are provided on both sides of the substrate supporting part 22 in the circumferential direction, adjacently thereto. It is thereby possible to retain the substrate 9 from above with a strong force in each of the chuck parts 21 and solidly hold the substrate 9 even when the centrifugal force of rotation exerted on the substrate retaining parts 23 is small, in other words, even when the number of rotation of the rotor part 52 is low.

In the substrate supporting part 22, the first contact surface 225 of the first substrate contact part 223 is a sloped surface which goes downward as it goes inward in the radial direction while the supporting body 221 is positioned at the first holding position. The substrate 9 placed on the first contact surface 225 slides on the first contact surface 225 by its own weight, thereby moving to a predetermined position. It is thereby possible to easily position the substrate 9 both in the vertical direction and in the horizontal direction. Further, since the first contact surface 225 of the first substrate contact part 223, which is a sloped surface, is in contact with the outer edge of the substrate 9, it is possible to reduce the contact area between the first substrate contact part 223 and the substrate 9 and decrease the possibility of contamination of the substrate 9 due to the contact with the substrate holding part 2.

In the substrate retaining part 23, the second contact surface 235 of the second substrate contact part 233 is a sloped surface which goes upward as it goes inward in the radial direction while the retaining body 231 is positioned at the second holding position. Since the second contact surface 235 of the second substrate contact part 233, which is a sloped surface, is in contact with the outer edge of the substrate 9, it is possible to suppress the contact of the second substrate contact part 233 with the upper surface 91 of the substrate 9. As a result, it is possible to decrease the possibility of contamination of the upper surface 91 of the substrate 9 due to the contact with the substrate holding part 2.

In the substrate supporting part 22, provided is the first stopper 222 for limiting the movement of first anchor part 224 at the time when the substrate 9 is placed on the first substrate contact part 223. It is thereby possible to easily position the substrate 9 in the vertical direction. Further, by changing the position of the first stopper 222 in the vertical direction, it is possible to easily change the position of the substrate 9 held by the substrate supporting parts 22 in the vertical direction. In the substrate retaining part 23, the retaining body 231 has such a shape as to prevent the second anchor part 234 and the like from coming into contact with the surrounding structure such as the chamber bottom 711 and the like at the time when the centrifugal force exerted on the second anchor part 234 is released. It is thereby possible to prevent the substrate retaining part 23 from interfering with the surrounding structure while the rotation of the substrate holding part 2 and the rotor part 52 is stopped. Further, in order to prevent any contact and interference between the second anchor part 234 and the chamber bottom 711 and the like, a stopper (not shown) may be provided to limit the range of rotation (range of movement) of the second anchor part 234 at the time when the centrifugal force exerted on the second anchor part 234 is released.

In the substrate processing apparatus 1, the rotor part 52 includes the liquid receiving surface 523 for receiving the processing liquid which spatters from the outer peripheral edge of the substrate 9 and guiding the processing liquid downward. It is thereby possible to prevent the processing liquid spattering from the substrate 9 from splashing back and being deposited onto the substrate 9. Further, it is possible to quickly guide the processing liquid spattering from the substrate 9 to the lower portion of the internal space 70 and quickly discharge the processing liquid to the outside of the chamber 7. In the substrate processing apparatus 1, since the liquid receiving surface 523 of the rotor part 52 extends upward to be higher than the upper surface 91 of the substrate 9 and goes outward in the radial direction as it goes downward, it is possible to further prevent the processing liquid spattering from the substrate 9 from splashing back. It is also possible to quickly discharge the processing liquid spattering from the substrate 9 to the outside of the chamber 7.

As discussed above, the rotor part 52 is provided with the annular protruding portion 524 protruding inward in the radial direction on the upper side of the liquid receiving surface 523. It is thereby possible to prevent the processing liquid from spattering up to above the liquid receiving surface 523. As a result, it is possible to prevent the processing liquid spattering from the substrate 9 from being deposited onto the inner peripheral surface 713 of the chamber sidewall 712 and the lower surface of the chamber cover 73. It is also possible to prevent the processing liquid from splashing back from the liquid receiving surface 523 up to above the substrate 9 and being deposited onto the substrate 9.

Figure 14:
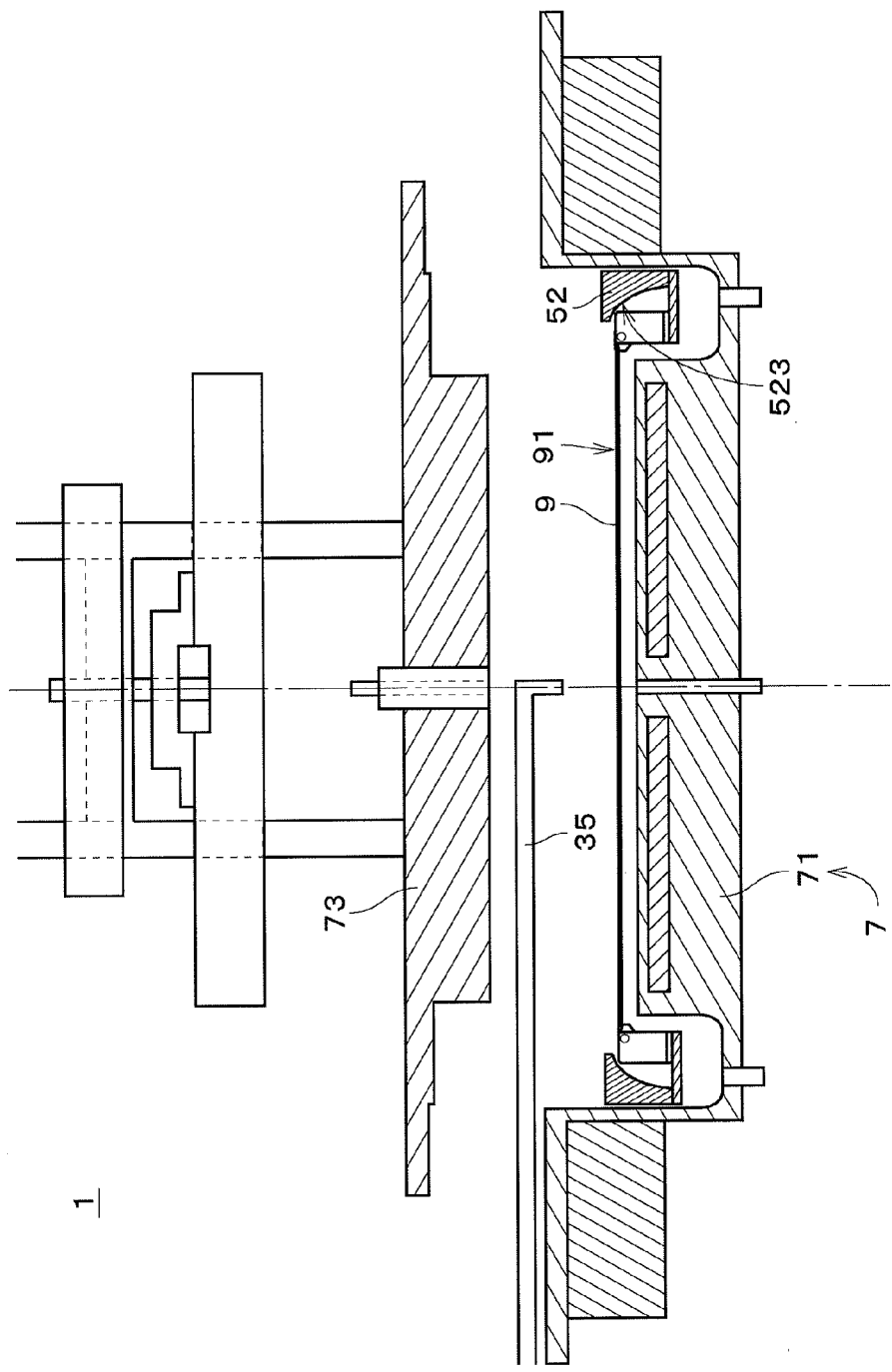
FIG. 14 is a cross section showing the substrate processing apparatus.

In the substrate processing apparatus 1, as shown in FIG. 14, the processing liquid may be supplied from a scan nozzle 35 inserted between the chamber cover 73 and the chamber body 71 onto the upper surface 91 of the substrate 9 while the chamber cover 73 is positioned above the chamber body 71, being away therefrom. The scan nozzle 35 is connected to a not-shown processing liquid supply part and continuously ejects a processing liquid while repeating a reciprocating motion in the horizontal direction above the substrate 9 being rotated. Thus, in the substrate processing apparatus 1, while the chamber 7 is open, the substrate processing can be performed by using the scan nozzle 35. Also in this case, the processing liquid spattering from the substrate 9 is received and guided downward by the liquid receiving surface 523 of the rotor part 52. It is thereby possible to prevent the processing liquid spattering from the substrate 9 from splashing back and being deposited onto the substrate 9. It is also possible to quickly discharge the processing liquid spattering from the substrate 9 to the outside of the chamber 7. Further, the position of the scan nozzle 35 in the vertical direction may be changed as appropriate depending on the kinds or the like of the substrate processing.

Figure 15:
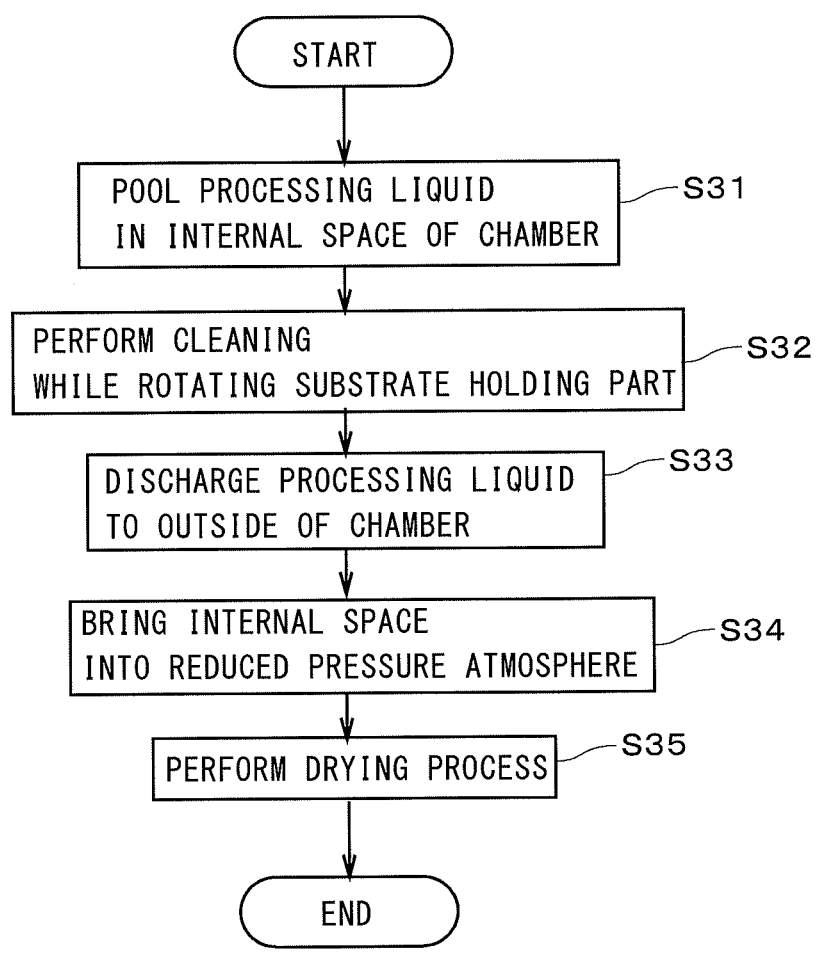
FIG. 15 is a flowchart showing an operation flow of cleaning of the inside of the chamber.
Figure 16:
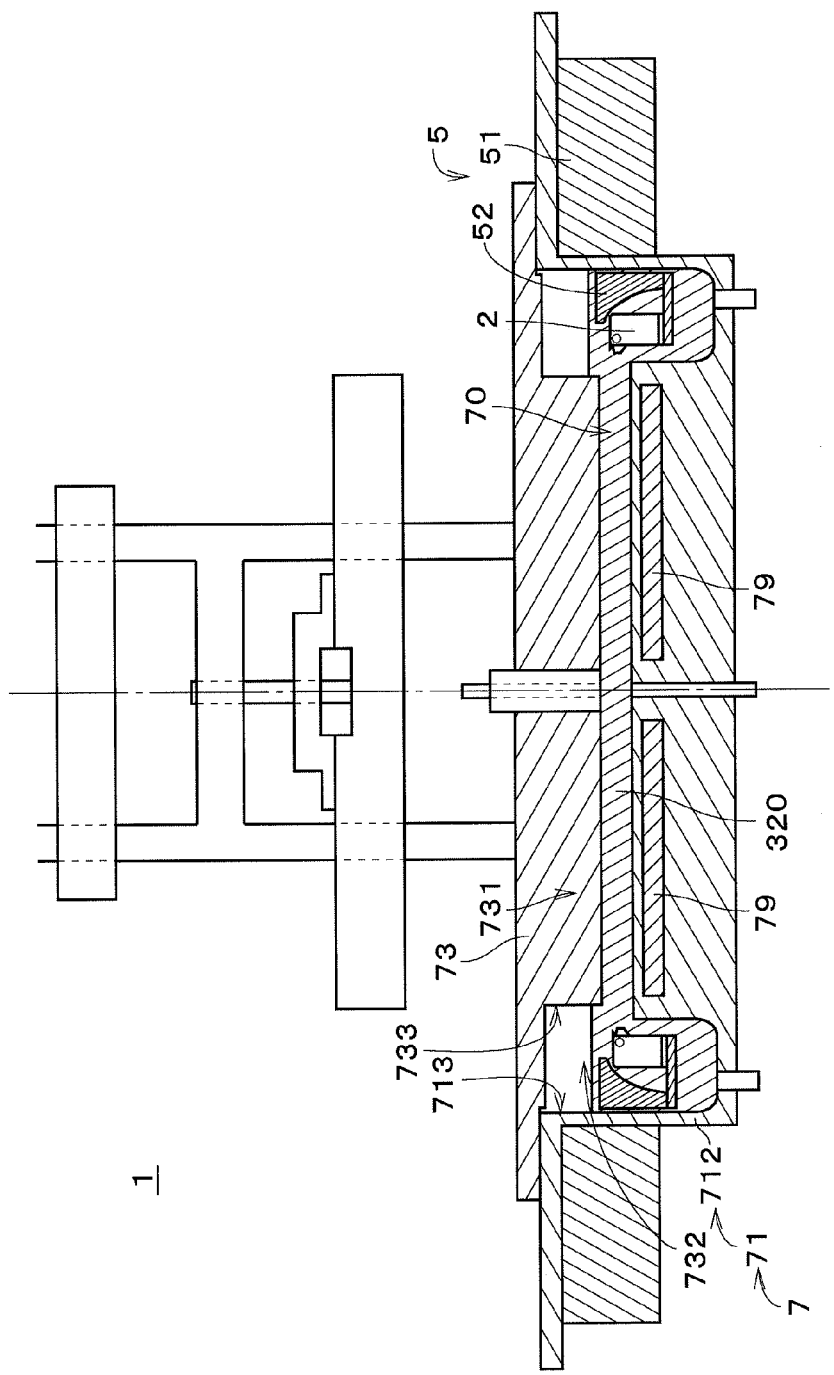
FIGS. 16 and 17 are cross sections each showing the substrate processing apparatus.

In the substrate processing apparatus 1 of FIG. 1, after the processings (the above-discussed processes of Steps S11 to S21 and the processing using the scan nozzle 35) for a predetermined number of substrates 9 are finished, the cleaning of the inside of the chamber 7 is performed. FIG. 15 is a flowchart showing an operation flow of the cleaning of the inside of the chamber 7. In the substrate processing apparatus 1, first, as shown in FIG. 16, while the substrate holding part 2 does not hold the substrate 9, the chamber cover 73 closes the upper opening of the chamber body 71, to thereby form the internal space 70. FIG. 16 shows a side view of the substrate holding part 2 and the like (the same applies to FIG. 17).

Subsequently, the liquid supply control part 111 of the control part 11 (see FIG. 2) controls the second processing liquid supply part 32 to supply the second processing liquid 320 which is deionized water (DIW) into the internal space 70 of the chamber 7. In the substrate processing apparatus 1, since the suction part 62 (see FIG. 1) is stopped, the second processing liquid 320 supplied from the second processing liquid supply part 32 is pooled in the internal space 70 of the chamber 7 (Step S31).

In the internal space 70, when the whole of the rotor part 52 and the substrate holding part 2 is immersed into the second processing liquid 320, the supply of the second processing liquid 320 from the second processing liquid supply part 32 is stopped. At that time, there is gas in the upper annular space 732 above the substrate holding part 2 and the rotor part 52. Then, while the whole of the rotor part 52 and the substrate holding part 2 is immersed into the second processing liquid 320, the rotation control part 113 (see FIG. 2) controls the substrate rotating mechanism 5 to rotate the rotor part 52 and the substrate holding part 2. The second processing liquid 320 in the internal space 70 is thereby agitated, to perform cleaning of the inside of the chamber 7 (Step S32).

Specifically, with the second processing liquid 320 agitated by the rotor part 52 and the substrate holding part 2, other processing liquids and extraneous matters deposited on an inner surface of the chamber 7 are removed. The inner peripheral surface 713 of the chamber sidewall 712, the lower surface of the chamber cover 73, and the outer peripheral surface 733 of the cover protruding portion 731 in the upper annular space 732 are cleaned with the agitated second processing liquid 320. The rotation of the substrate holding part 2 may be started concurrently with Step S31 or before Step S31.

In the Step S32, the rotor part 52 and the substrate holding part 2 may rotate only one direction in the circumferential direction, but preferably, after rotating one direction in the circumferential direction, the rotor part 52 and the substrate holding part 2 may rotate the other direction. For example, the rotor part 52 and the substrate holding part 2 rotate counterclockwise for a predetermined time period, and then rotate clockwise for another predetermined time period.

After the cleaning of the inside of the chamber 7 is finished, the second processing liquid 320 in the internal space 70 is discharged together with extraneous matters or the like removed from the inner surface of the chamber 7 to the outside of the chamber 7 by the suction part 62 (Step S33). Then, the gas supply part 61 and the suction part 62 are controlled, to bring the internal space 70 into a predetermined reduced pressure atmosphere (Step S34). The pressure in the internal space 70 is preferably lower than the normal pressure and not lower than about 15 kPa. Further, the heating part 79 is controlled, to heat the inner surface of the chamber 7 and the constituent elements in the chamber 7.

After that, while the internal space 70 is brought into a predetermined reduced pressure atmosphere, the substrate rotating mechanism 5 is controlled to increase the number of rotation of the rotor part 52, and the rotor part 52 and the substrate holding part 2 are thereby rotated at high speed. The second processing liquid 320 deposited on the rotor part 52 and the substrate holding part 2 thereby spatters into the surroundings, being guided to the lower portion of the internal space 70, and is discharged to the outside of the chamber 7 by the suction part 62. In the substrate processing apparatus 1, the second processing liquid is removed from the inner surface of the chamber 7 and from the constituent elements in the chamber 7, and the drying process is finished (Step S35).

After the drying process is finished, the rotation of the rotor part 52 and the substrate holding part 2 is stopped, the pressure in the internal space 70 of the chamber 7 is increased back to the normal pressure, and the cleaning of the inside of the chamber 7 is finished. Also in the second to sixth preferred embodiments, the same operation flow as that of cleaning the inside of the chamber 7 shown in Steps S31 to S35 is performed.

In the substrate processing apparatus 1, as discussed above, the substrate holding part 2 not holding the substrate 9 is rotated in the second processing liquid 320 pooled in the internal space 70 of the chamber 7, and the inside of the chamber 7 can be thereby easily cleaned. Further, as discussed above, since the cleaning of the inside of the chamber 7 is performed while the chamber 7 is sealed, it is possible to prevent the second processing liquid 320 and the like from spattering to the outside of the chamber 7 in the cleaning.

In the Step S32, as discussed above, by rotating the rotor part 52 and the substrate holding part 2 one direction in the circumferential direction and then the other direction, it is possible to change the direction and the rate of the flow of the second processing liquid 320 in the chamber 7. As a result, it is possible to remove even extraneous matters and the like which are hard to remove by a uniform flow and therefore improve the efficiency in the cleaning of the inside of the chamber 7.

In the Step S35, while the internal space 70 of the chamber 7 is brought into the reduced pressure atmosphere, the rotor part 52 and the substrate holding part 2 are rotated, to thereby perform the drying process. It is thereby possible to perform the drying process in a shorter time as compared with under normal pressure. Further, since the heating by the heating part 79 is performed concurrently with the drying of the inside of the chamber 7 under reduced pressure, it is possible to accelerate the drying of the inside of the chamber 7. If the drying of the inside of the chamber 7 can be completed in a relatively short time, the drying process may be performed under normal pressure.

In the substrate processing apparatus 1, the rotor part 52 to which the substrate holding part 2 is attached rotates, being in a floating state in the internal space 70, by magnetic force exerted between itself and the stator part 51. Therefore, as discussed above, it is possible to prevent dust and the like from being generated due to the friction between the rotor part 52 and the supporting structure and also easily rotate the rotor part 52 at high speed. As a result, it is possible to efficiently clean the inside of the chamber 7.

In the Step S32, the rotation of the rotor part 52 and the substrate holding part 2 does not necessarily have to be performed while the whole of the rotor part 52 and the substrate holding part 2 is immersed into the second processing liquid 320. In the substrate processing apparatus 1, the inside of the chamber 7 is cleaned by the rotation of the substrate holding part 2 while at least part of the substrate holding part 2 is immersed in the second processing liquid 320. Also in this case, like in the above case, it is possible to easily clean the inside of the chamber 7.

Figure 17:
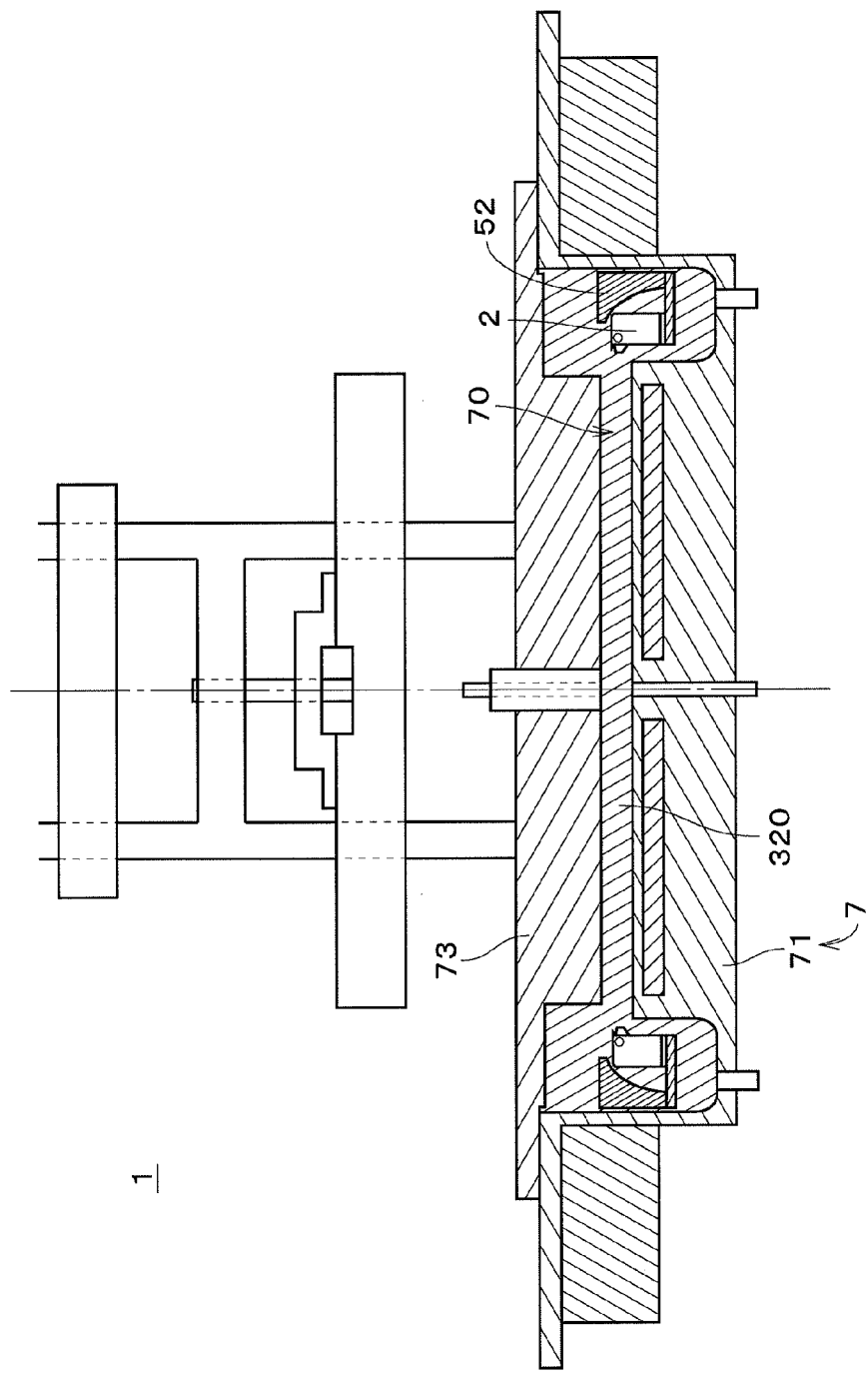

In the Step S32, as shown in FIG. 17, the inside of the chamber 7 may be cleaned by rotating the rotor part 52 and the substrate holding part 2 while the second processing liquid 320 fills the internal space 70. In this case, in Step S31, for example, while the chamber cover 73 is positioned above the chamber body 71, being slightly away therefrom, the second processing liquid 320 is supplied up to very near the upper opening of the chamber body 71. Then, by stopping the supply of the second processing liquid 320 and closing the upper opening of the chamber body 71 by the chamber cover 73, the internal space 70 is filled with the second processing liquid 320. By performing the cleaning process while the internal space 70 is filled with the second processing liquid 320, it is possible to easily clean the inside of the chamber 7 with the entire inner surface of the chamber 7 reliably brought into contact with the second processing liquid 320.

Figure 18:
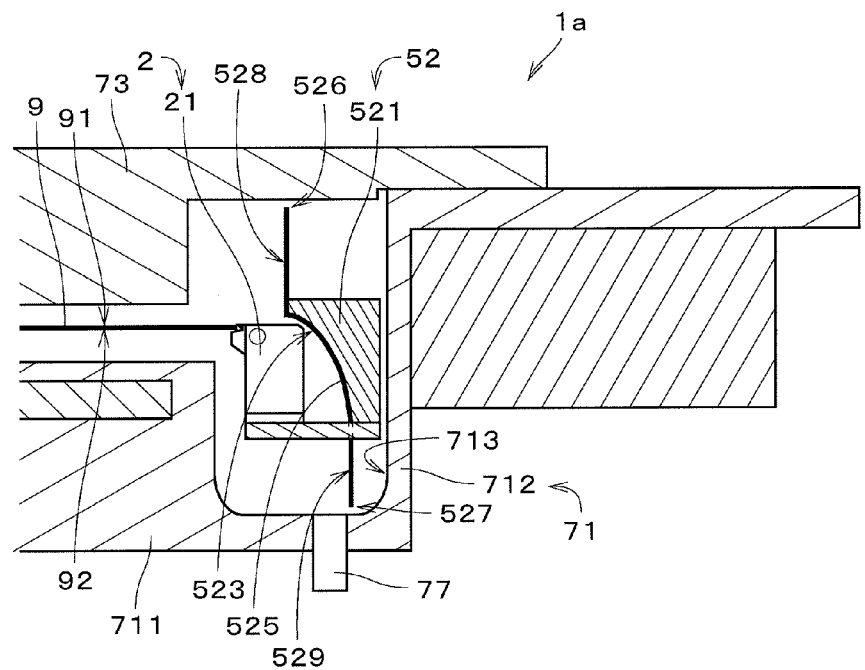
FIG. 18 is a cross section showing part of a substrate processing apparatus in accordance with a second preferred embodiment of the present invention.

FIG. 18 is a cross section showing part of a substrate processing apparatus 1a which is enlarged in accordance with the second preferred embodiment of the present invention. The substrate processing apparatus 1a has the same constitution as the substrate processing apparatus 1 shown in FIG. 1 except that the rotor part 52 includes a protective wall 525. In the following description, constituent elements identical to or corresponding to those of the substrate processing apparatus 1 shown in FIG. 1 are represented by the same reference signs.

The protective wall 525 is a thin tubular member which is disposed between the substrate 9 and the plurality of chuck parts 21 of the substrate holding part 2, and the permanent magnet 521. An upper end 526 of the protective wall 525 is positioned near the chamber cover 73 and opposed to the lower surface of the chamber cover 73 with a very narrow gap interposed therebetween. A lower end 527 of the protective wall 525 is positioned near the chamber bottom 711 and opposed to the upper surface of the chamber bottom 711 with a very narrow gap interposed therebetween. The lower end 527 of the protective wall 525 may be positioned near the chamber sidewall 712 and opposed to the inner peripheral surface 713 of the chamber sidewall 712 with a very narrow gap interposed therebetween. In other words, the lower end 527 of the protective wall 525 is opposed to the inner surface of the chamber body 71 with a very narrow gap interposed therebetween. The permanent magnet 521 of the rotor part 52 is isolated from the substrate 9 by the protective wall 525.

An inner peripheral surface of the protective wall 525 at its center portion in the vertical direction serves as the tubular liquid receiving surface 523 which is opposed to the outer peripheral edge of the substrate 9 in the radial direction and receives the processing liquid spattering from the outer peripheral edge of the substrate 9. In other words, the liquid receiving surface 523 is provided between the upper end 526 and the lower end 527 of the protective wall 525. As discussed above, the liquid receiving surface 523 extends upward to be higher than the upper surface 91 of the substrate 9 and also downward to be lower than the lower surface 92 of the substrate 9 in the vertical direction. Further, the liquid receiving surface 523 is a sloped surface which goes outward in the radial direction as it goes downward, thereby guiding the processing liquid received from the substrate 9 downward toward the lower discharge parts 77.

An upper portion 528 of the inner peripheral surface of the protective wall 525, which is positioned above the liquid receiving surface 523, is a cylindrical surface extending in substantially parallel to the vertical direction. A lower portion 529 of the inner peripheral surface of the protective wall 525, which is positioned lower than the permanent magnet 521, is also a cylindrical surface extending in substantially parallel to the vertical direction, being continuous with a lower end of the liquid receiving surface 523 to guide the processing liquid received from the substrate 9 by the liquid receiving surface 523 downward.

In the substrate processing apparatus 1a, as discussed above, since the permanent magnet 521 is isolated from the substrate 9 by the protective wall 525, even if the substrate 9 is broken, it is possible to prevent the broken pieces of the substrate 9 from hitting against a coating film (i.e., a film formed by fluorocarbon resin coating) on a surface of the permanent magnet 521 and the permanent magnet 521. As a result, it is possible to prevent the permanent magnet 521 and the above-described coating film from being damaged by the broken pieces of the substrate 9.

Figure 19:
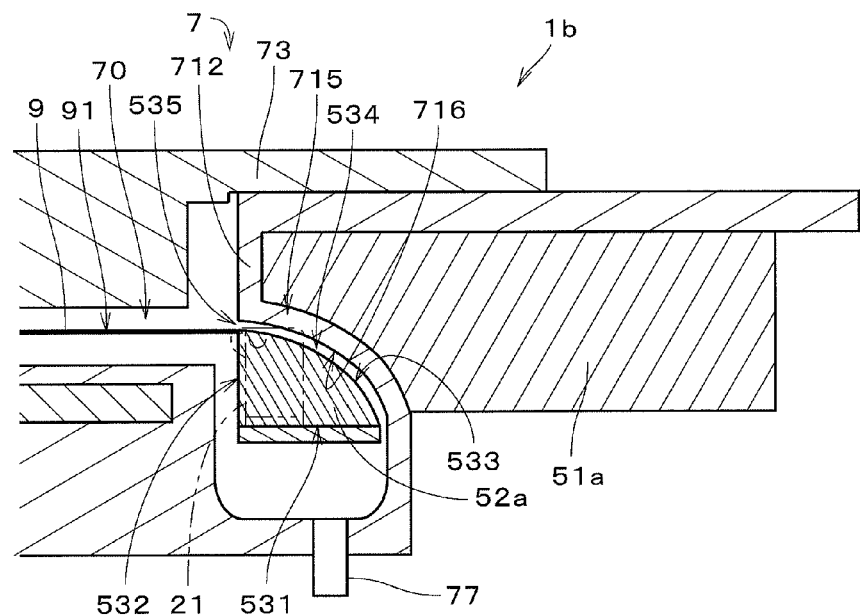
FIG. 19 is a cross section showing part of a substrate processing apparatus in accordance with a third preferred embodiment of the present invention.

FIG. 19 is a cross section showing part of a substrate processing apparatus 1b which is enlarged in accordance with the third preferred embodiment of the present invention. FIG. 19 is a cross section at a position slightly shifted in the circumferential direction from the position where the chuck part 21 is provided. The chuck part 21 is also represented by two-dot chain line. In the substrate processing apparatus 1b, instead of the stator part 51 and the rotor part 52 shown in FIG. 1, a stator part 51a and a rotor part 52a which are different in shape from the stator part 51 and the rotor part 52, respectively. Further, the shape of the chamber sidewall 712 is different from that shown in FIG. 1. Except the above constituent elements, the substrate processing apparatus 1b has almost the same constitution as that of the substrate processing apparatus 1 shown in FIG. 1, and in the following description, constituent elements identical to or corresponding to those of the substrate processing apparatus 1 shown in FIG. 1 are represented by the same reference signs.

As shown in FIG. 19, the rotor part 52a has an annular shape and includes a lower surface 531, an inner peripheral surface 532, and an upper surface 533. The lower surface 531 is a substantially ring-shaped surface extending in the horizontal direction. The inner peripheral surface 532 is a substantially cylindrical surface extending upward from an inner peripheral edge of the lower surface 531 in substantially parallel to the central axis J1 (see FIG. 1). The upper surface 533 extends outward and downward in the radial direction from an upper end edge of the inner peripheral surface 532, leading to an outer peripheral edge of the lower surface 531. The upper surface 533 is a smooth sloped surface which gradually goes downward as it goes outward in the radial direction. An inner peripheral edge of the upper surface 533, i.e., the upper end edge of the inner peripheral surface 532 is in contact with the outer peripheral edge of the upper surface 91 of the substrate 9 except portions at which the chuck parts 21 are provided. In the portions at which the chuck parts 21 are provided, recessed portions are formed in an inner peripheral portion of the rotor part 52a and the chuck parts 21 are accommodated in the recessed portions.

The chamber sidewall 712 includes an annular flow channel forming part 715 which covers above the upper surface 533, being away from the upper surface 533 of the rotor part 52a with a predetermined gap (an annular flow channel 534 described later) interposed therebetween. The flow channel forming part 715 has a lower surface 716 opposed to the upper surface 533 of the rotor part 52a, and the lower surface 716 is disposed along substantially the entire upper surface 533 of the rotor part 52a. The lower surface 716 of the flow channel forming part 715 is also a smooth sloped surface which gradually goes downward as it goes outward in the radial direction, like the upper surface 533 of the rotor part 52a. The annular flow channel 534 is formed between the lower surface 716 of the flow channel forming part 715 and the upper surface 533 of the rotor part 52a. A slit-like annular opening 535 which is an upper opening of the flow channel 534 is formed between the inner peripheral edge of the upper surface 533 of the rotor part 52a and an inner peripheral edge of the lower surface 716 of the flow channel forming part 715. The stator part 51a is provided across from the outer side of the rotor part 52a in the radial direction to the upper side of the flow channel forming part 715, to cover above the rotor part 52a.

In the substrate processing apparatus 1a, as discussed above, the inner peripheral edge of the upper surface 533 of the rotor part 52a is in contact with the outer peripheral edge of the upper surface 91 of the substrate 9, and the upper surface 533 of the rotor part 52a is continuous with the upper surface 91 of the substrate 9. Therefore, the processing liquid which is moved outward in the radial direction on the upper surface 91 of the substrate 9 by the rotation of the substrate 9 does not remain at the outer peripheral edge of the upper surface 91 of the substrate 9 by the surface tension or the like and is smoothly guided to the flow channel 534 through the annular opening 535, and further guided to the lower discharge parts 77 provided in the lower portion of the internal space 70 by the flow channel 534.

Thus, since the processing liquid moving outward in the radial direction from the outer peripheral edge of the upper surface 91 of the substrate 9 flows in the flow channel 534 and is guided to the lower discharge parts 77, it is possible to prevent the processing liquid removed from the upper surface 91 of the substrate 9 from splashing back and being deposited on the substrate 9. It is also possible to quickly discharge the processing liquid removed from the substrate 9 to the outside of the chamber 7. Further, since the lower surface 716 of the flow channel forming part 715 is a smooth sloped surface which gradually goes downward as it goes outward in the radial direction, it is possible to further prevent the processing liquid from splashing back and being deposited on the substrate 9. Furthermore, in the third preferred embodiment, it is possible to reduce the volumetric capacity of a portion which corresponds to the upper annular space 732 in the first preferred embodiment. As a result, it is possible to reduce the volumetric capacity of the internal space 70 and efficiently increase or reduce the pressure in the internal space 70.

In the substrate processing apparatus 1b, the inner peripheral edge of the upper surface 533 of the rotor part 52a does not necessarily have to come into contact with the outer peripheral edge of the upper surface 91 of the substrate 9. Only if the processing liquid on the upper surface 91 of the substrate 9 being rotated does not remain at the outer peripheral edge of the upper surface 91 of the substrate 9 by the surface tension or the like and is smoothly guided to the flow channel 534, the inner peripheral edge of the upper surface 533 of the rotor part 52a may be disposed close to the outer peripheral edge of the upper surface 91 of the substrate 9. For example, the inner peripheral edge of the upper surface 533 of the rotor part 52a may be disposed slightly on an outer side in the radial direction relative to the outer peripheral edge of the upper surface 91 of the substrate 9, being away therefrom, or slightly on a lower side, being away therefrom.

Further, the flow channel forming part 715 do not necessarily have to be provided in the chamber sidewall 721 but may be provided in the chamber cover 73. Alternatively, there may be another configuration where a portion of the flow channel forming part 715 on an inner side in the radial direction is provided in the chamber cover 73 and a portion thereof on an outer side in the radial direction is provided in the chamber sidewall 712. In other words, the flow channel forming part 715 has only to be provided in the chamber 7.

Figure 20:
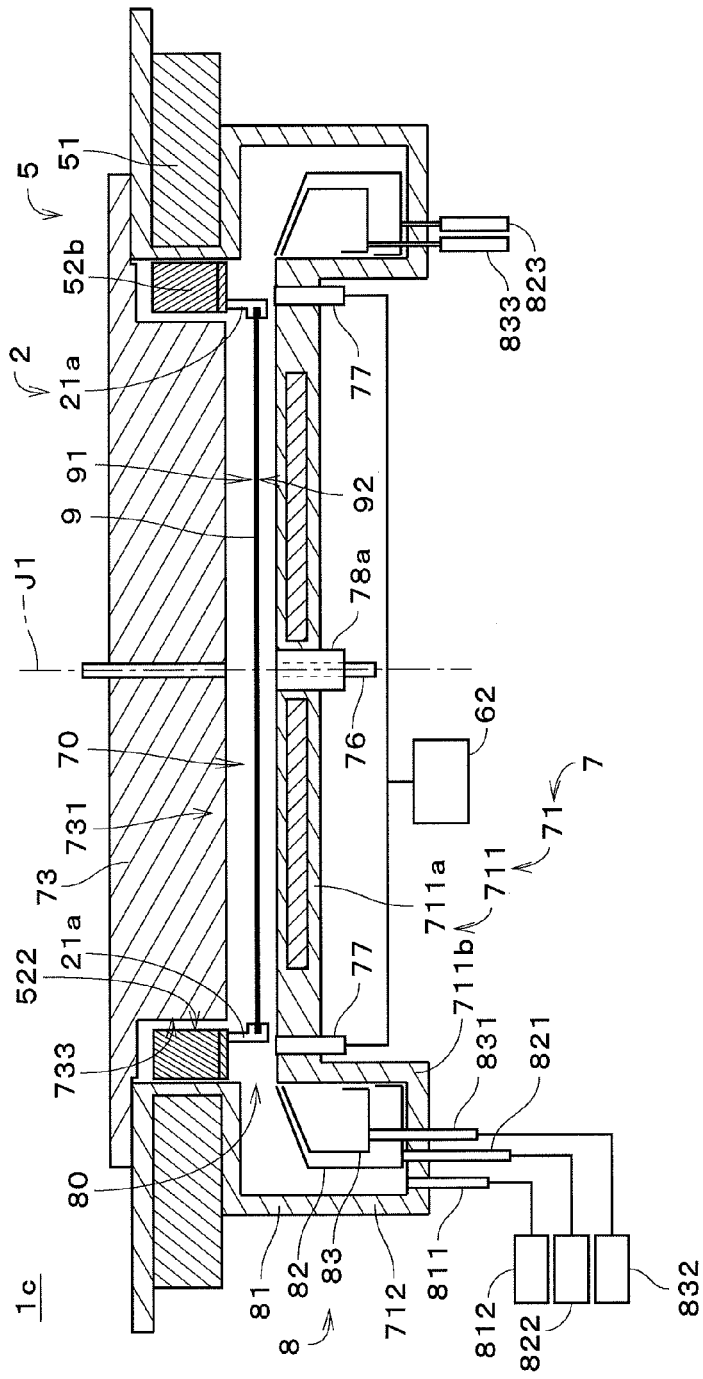
FIG. 20 is a cross section showing a substrate processing apparatus in accordance with a fourth preferred embodiment of the present invention.

FIG. 20 is a cross section showing a substrate processing apparatus 1c in accordance with the fourth preferred embodiment of the present invention. In FIG. 20, instead of the chuck part 21 and the rotor part 52 shown in FIG. 1, a chuck part 21a and a rotor part 52b which are different in structure from the chuck part 21 and the rotor part 52, respectively. Further, a liquid collecting part 8 is provided below the stator part 51, and the shape of the chamber 7 is different from that shown in FIG. 1. The liquid collecting part 8 includes a first liquid receiving part 81, a second liquid receiving part 82, a third liquid receiving part 83, and the like each of which can temporarily pool the processing liquid, as discussed later. Except the above constituent elements, the substrate processing apparatus 1b has almost the same constitution as that of the substrate processing apparatus 1 shown in FIG. 1, and in the following description, constituent elements identical to or corresponding to those of the substrate processing apparatus 1 shown in FIG. 1 are represented by the same reference signs. In FIG. 20, the first processing liquid supply part 31, the second processing liquid supply part 32, the third processing liquid supply part 33, the gas supply part 61, the cover moving mechanism 74, and the like shown in FIG. 1 are omitted, and a side view of the substrate holding part 2 and the like is shown (the same applies to FIGS. 21 and 22).

In the substrate processing apparatus 1c, a plurality of chuck parts 21a of the substrate holding part 2 are attached to the lower side of the rotor part 52b having a substantially cylindrical shape. The plurality of chuck parts 21a each sandwich the outer edge of the substrate 9 from above and below. The substrate 9 sandwiched by the plurality of chuck parts 21a is disposed below the rotor part 52b, and the upper surface 91 of the substrate 9 is positioned lower than a lower end of the rotor part 52b. Further, the rotor part 52b is not provided with the above-discussed liquid receiving surface 523 (see FIG. 9).

While the upper opening of the chamber body 71 is closed by the chamber cover 73 to form the internal space 70, the substantially cylindrical cover protruding portion 731 of the chamber cover 73 is positioned on an inner side in the radial direction relative to a substantially cylindrical inner peripheral surface 522 of the rotor part 52b. The cover protruding portion 731 is positioned above the substrate holding part 2 and the substrate 9, and an outer peripheral surface 733 of the cover protruding portion 731 is opposed to the inner peripheral surface 522 of the rotor part 52b in the radial direction, being close thereto.

The chamber bottom 711 includes a substantially disk-like center portion 711a opposed to the lower surface 92 of the substrate 9 in the vertical direction and a step portion 711b positioned around the center portion 711a, being lower than the center portion 711a. Around the lower nozzle 76 provided at the center portion 711a, provided is a lower nozzle 78a having an annular cross section which is connected to the gas supply part 61 (see FIG. 1). The step portion 711b is positioned below the stator part 51 of the substrate rotating mechanism 5. The chamber sidewall 712 extends upward from an outer peripheral edge of the step portion 711b of the chamber bottom 711. The internal space 70 of the chamber 7 thereby extends up to a portion below the stator part 51.

In the substrate processing apparatus 1c, an annular first liquid receiving part 81 for receiving the processing liquid spattering from the substrate 9 is formed by the step portion 711b and the chamber sidewall 712 of the chamber bottom 711. The first liquid receiving part 81 is positioned below the stator part 51 in the internal space 70 and extends downward from a portion surrounding the substrate 9. The first liquid receiving part 81 has an annular opening (hereinafter, referred to as a "liquid receiving opening 80") positioned around the substrate 9. The processing liquid spattering from the substrate 9 is moved to the inside of the first liquid receiving part 81 through the liquid receiving opening 80, received by the first liquid receiving part 81, and temporarily pooled therein.

A first liquid receiving and discharging part 811 is provided at a bottom portion of the first liquid receiving part 81, and a first collecting part 812 is connected to the first liquid receiving part 81 through the first liquid receiving and discharging part 811. The processing liquid received by the first liquid receiving part 81 is sucked by the first collecting part 812 to be discharged to the outside of the chamber 7 and collected. Further, the processing liquid which is supplied onto the lower surface 92 of the substrate 9 and the like and dropped onto the center portion 711a of the chamber bottom 711 is sucked by the suction part 62 through the lower discharge parts 77 provided at the center portion 711a.

Inside the first liquid receiving part 81, provided is a second liquid receiving part 82 which is another liquid receiving part for receiving the processing liquid spattering from the substrate 9. Further, inside the second liquid receiving part 82, provided is a third liquid receiving part 83 which is still another liquid receiving part for receiving the processing liquid spattering from the substrate 9. The second liquid receiving part 82 and the third liquid receiving part 83 are each an annular member positioned below the stator part 51 in the internal space 70. A upper part of the second liquid receiving part 82 has a sloped surface (conical surface) for receiving the processing liquid spattering from the substrate 9 and guiding the processing liquid downward, and a upper part of the third liquid receiving part 83 has also a sloped surface (conical surface) for receiving the processing liquid spattering from the substrate 9 and guiding the processing liquid downward. The respective sloped surfaces of the second liquid receiving part 82 and the third liquid receiving part 83 are so disposed as to overlap each other in the vertical direction. A second liquid receiving and discharging part 821 is provided at a bottom portion of the second liquid receiving part 82, and a second collecting part 822 is connected to the second liquid receiving part 82 through the second liquid receiving and discharging part 821. A third liquid receiving and discharging part 831 is provided at a bottom portion of the third liquid receiving part 83, and a third collecting part 832 is connected to the third liquid receiving part 83 through the third liquid receiving and discharging part 831. Further, a liquid receiving part up-and-down moving mechanism 823 is connected to the second liquid receiving part 82, and another liquid receiving part up-and-down moving mechanism 833 is connected to the third liquid receiving part 83. By the liquid receiving part up-and-down moving mechanisms 823 and 833, the second liquid receiving part 82 and the third liquid receiving part 83 are moved in the vertical direction, respectively, so that respective upper parts thereof may not come into contact with each other.

Figure 21:
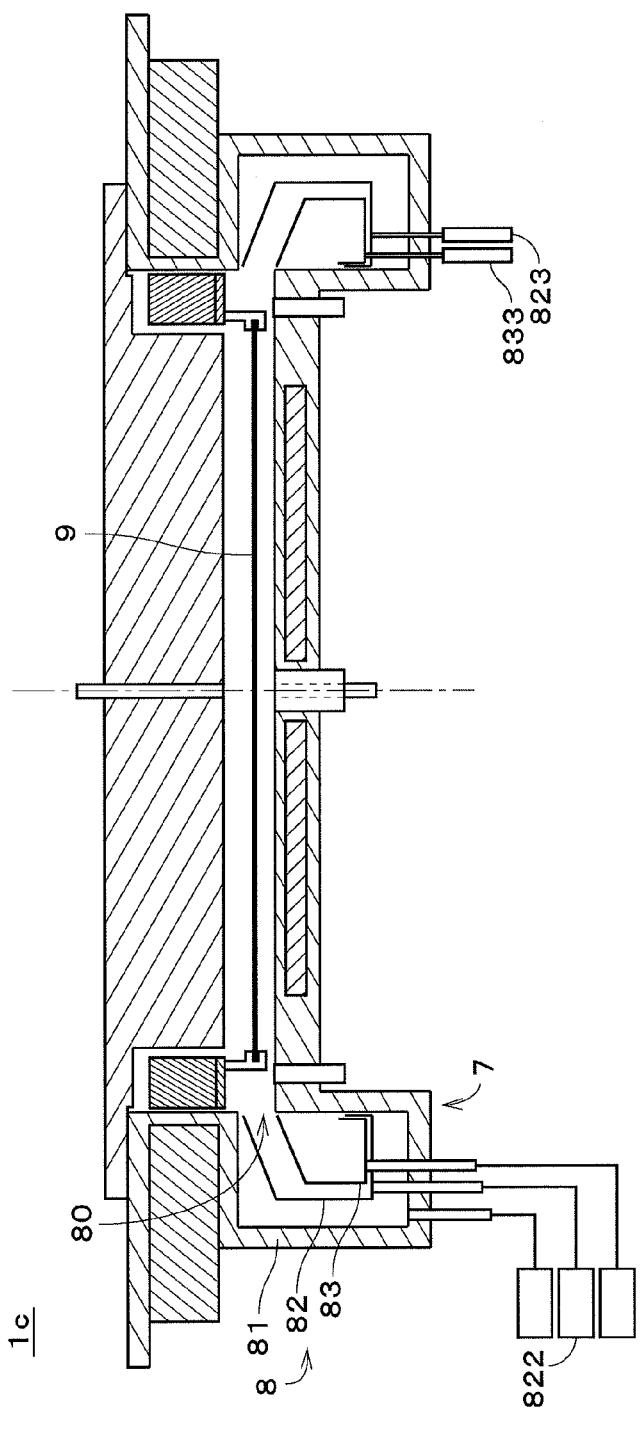
FIGS. 21 and 22 are cross sections each showing the substrate processing apparatus.

In the liquid collecting part 8, by driving the liquid receiving part up-and-down moving mechanism 823 from a state shown in FIG. 20 (hereinafter, referred to as a "first liquid receiving state"), the second liquid receiving part 82 is moved up to the position shown in FIG. 21 without moving the third liquid receiving part 83. In the following discussion, a state of the liquid collecting part 8 shown in FIG. 21 is referred to as a "second liquid receiving state". In FIG. 21, the suction part 62 is not shown (the same applies to FIG. 22). In the second liquid receiving state, the second liquid receiving part 82 extends downward from a portion surrounding the substrate 9 inside the first liquid receiving part 81, and the processing liquid spattering from the substrate 9 is moved to the inside of the second liquid receiving part 82 through the liquid receiving opening 80, received by the second liquid receiving part 82, and temporarily pooled therein. The processing liquid received by the second liquid receiving part 82 is sucked by the second collecting part 822 to be discharged to the outside of the chamber 7 and collected.

Figure 22:
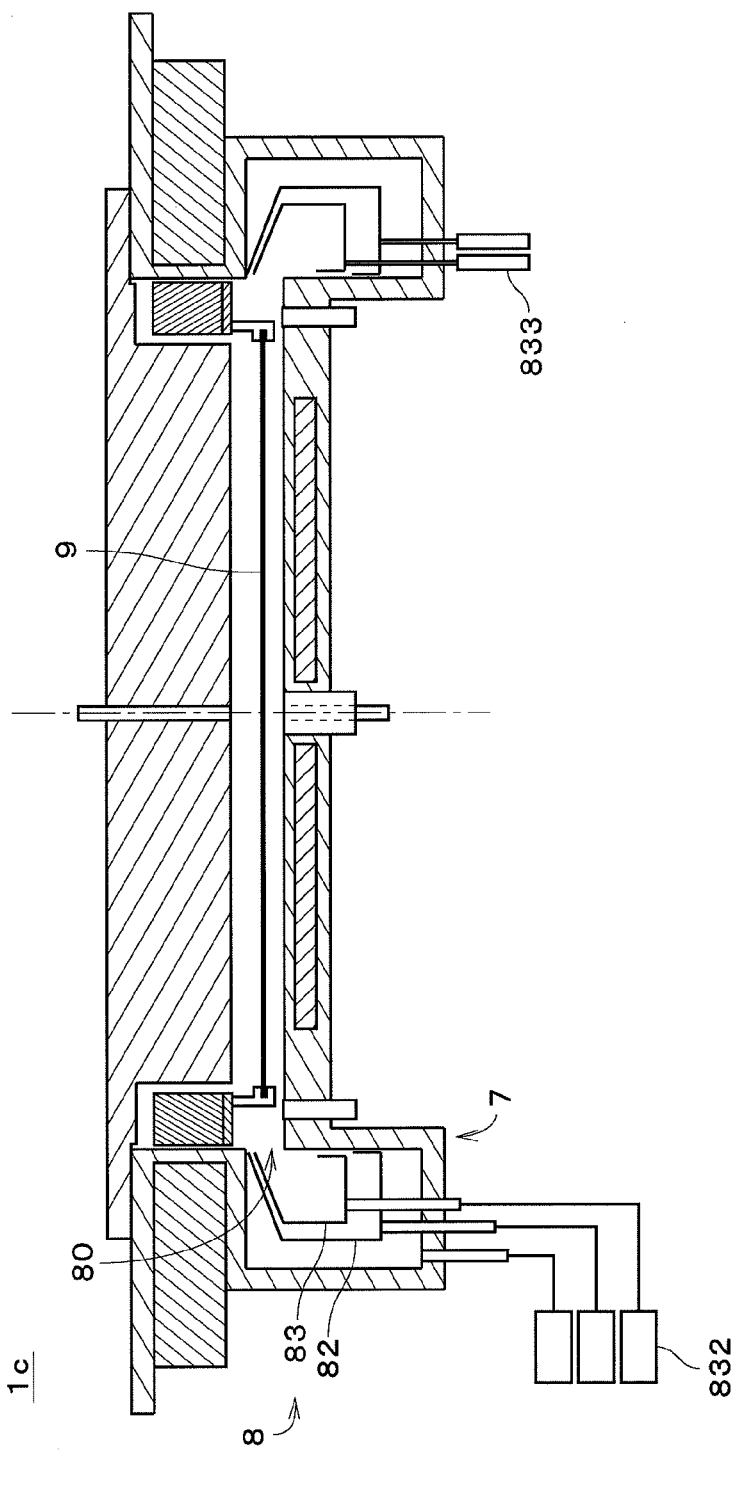

Further, in the liquid collecting part 8, by the driving liquid receiving part up-and-down moving mechanism 833 from the second liquid receiving state shown in FIG. 21, the third liquid receiving part 83 is moved up to the position shown in FIG. 22. In the following discussion, a state of the liquid collecting part 8 shown in FIG. 22 is referred to as a "third liquid receiving state"). In the third liquid receiving state, the third liquid receiving part 83 extends downward from a portion surrounding the substrate 9 inside the second liquid receiving part 82, and the processing liquid spattering from the substrate 9 is moved to the inside of the third liquid receiving part 83 through the liquid receiving opening 80, received by the third liquid receiving part 83, and temporarily pooled therein. The processing liquid received by the third liquid receiving part 83 is sucked by the third collecting part 832 to be discharged to the outside of the chamber 7 and collected.

Thus, in the substrate processing apparatus 1c, since the second liquid receiving part 82 and the third liquid receiving part 83 are moved in the vertical direction by the liquid receiving part up-and-down moving mechanisms 823 and 833, respectively, the receipt of the processing liquid by the first liquid receiving part 81, that of the processing liquid by the second liquid receiving part 82, and that of the processing liquid by the third liquid receiving part 83 are selectively switched. Then, the respective processing liquids received by the first liquid receiving part 81, the second liquid receiving part 82, and the third liquid receiving part 83 are discharged to the outside of the chamber 7 by the first collecting part 812, the second collecting part 822, and the third collecting part 832 each of which serves as a processing liquid discharge part, respectively.

In the substrate processings shown in the above-discussed Steps S11 to S21, for example, between the etching process in Step S15 and the rinse process in Step S16, the number of rotation of the substrate 9 is increased with the liquid collecting part 8 brought into the second liquid receiving state shown in FIG. 21. The first processing liquid which is an etching solution thereby spatters from the substrate 9, and the first processing liquid is received by the second liquid receiving part 82 and collected by the second collecting part 822. The first processing liquid collected by the second collecting part 822 is recycled for the substrate processings or the like in the substrate processing apparatus 1c after removing impurities and performing the like processes.

Subsequently, after the liquid receiving part up-and-down moving mechanism 833 is driven to bring the liquid collecting part 8 into the third liquid receiving state shown in FIG. 22, the rinse process in Step S16 is performed. The second processing liquid which is deionized water thereby spatters together with the first processing liquid remaining on the substrate 9 from the substrate 9, and the processing liquids are received by the third liquid receiving part 83 and collected by the third collecting part 832. Further, the second processing liquid which spatters from on the substrate 9 in Steps S17 and S18 is also received by the third liquid receiving part 83 and collected by the third collecting part 832. The processing liquid collected by the third collecting part 832 is discarded.

Next, the liquid receiving part up-and-down moving mechanisms 823 and 833 are driven to bring the liquid collecting part 8 into the first liquid receiving state, the drying process in Step S20 is performed. The third processing liquid which is isopropyl alcohol (IPA) thereby spatters from the substrate 9, and the third processing liquid is received by the first liquid receiving part 81 and collected by the first collecting part 812. The third processing liquid collected by the first collecting part 812 is recycled for the substrate processings or the like in the substrate processing apparatus 1c after removing impurities and performing the like processes.

In the substrate processing apparatus 1c, as discussed above, the upper surface 91 of the substrate 9 held by the substrate holding part 2 is positioned on the lower side relative to the lower end of the rotor part 52b. It is thereby possible to prevent the processing liquid spattering from the substrate 9 from hitting against the rotor part 52b. As a result, it is possible to easily discharge the processing liquid to the outside of the chamber 7 while preventing the processing liquid from splashing from the rotor part 52b back to the substrate 9.

In the substrate processing apparatus 1c, as discussed above, the first liquid receiving part 81 is provided to be positioned below the stator part 51 in the internal space 70 of the chamber 7, and the processing liquid received by the first liquid receiving part 81 and temporarily pooled therein is discharged by the first collecting part 812 to the outside of the chamber 7. It is thereby possible to temporarily pool the processing liquid spattering from the substrate 9 at a position away from the substrate 9 and easily discharge the processing liquid to the outside of the chamber 7 while preventing the processing liquid from being deposited again on the substrate 9 even when processing using a large amount of processing liquid is performed while the chamber 7 is sealed.

Further, in the liquid collecting part 8, since the second liquid receiving part 82 is provided inside the first liquid receiving part 81 and the second liquid receiving part 82 is moved in the vertical direction, the receipt of the processing liquid by the first liquid receiving part 81 and that of the processing liquid by the second liquid receiving part 82 are selectively switched. It is thereby possible to collect a plurality of kinds of processing liquids individually and increase the collection efficiency of the processing liquid. Further, since the third liquid receiving part 83 is provided inside the second liquid receiving part 82 and the third liquid receiving part 83 is movable in the vertical direction independently of the second liquid receiving part 82, the receipt of the processing liquid by the first liquid receiving part 81, that of the processing liquid by the second liquid receiving part 82, and that of the processing liquid by the third liquid receiving part 83 are selectively switched. As a result, it is thereby possible to further increase the collection efficiency of the processing liquid. In the liquid collecting part 8, the first liquid receiving part 81, the second liquid receiving part 82, and the third liquid receiving part 83 are so disposed as to overlap one another (in other words, overlap in a plan view) in the vertical direction, and the whole of the liquid collecting part 8 is disposed below the stator part 51. Thus, since the space below the stator part 51 is efficiently used, it is possible to downsize the substrate processing apparatus 1c.

In the substrate processing apparatus 1c, the cover protruding portion 731 of the chamber cover 73 is positioned on the inner side in the radial direction relative to the inner peripheral surface 522 of the rotor part 52b, and the outer peripheral surface 733 of the cover protruding portion 731 is opposed to the inner peripheral surface 522 of the rotor part 52b in the radial direction. With this structure, even if the substrate 9 is broken, it is possible to prevent the broken pieces of the substrate 9 from being scattered in a wide range. Further, the cover protruding portion 731 may have a substantially cylindrical shape about the central axis J1.

Figure 23:
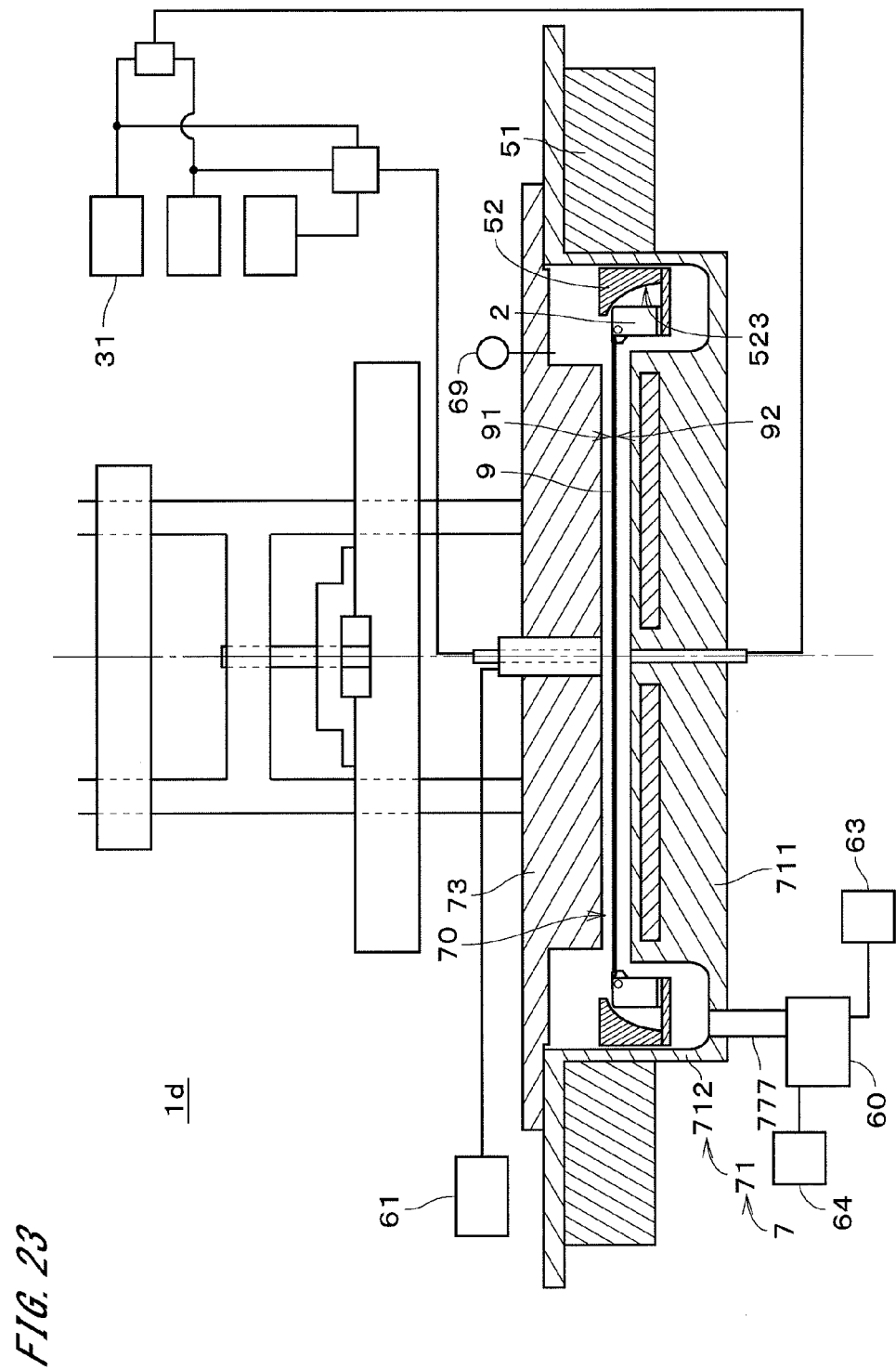
FIG. 23 is a cross section showing a substrate processing apparatus in accordance with a fifth preferred embodiment of the present invention.

FIG. 23 is a cross section showing a substrate processing apparatus 1d in accordance with the fifth preferred embodiment of the present invention. In the substrate processing apparatus 1d, instead of the lower discharge parts 77 and the suction part 62 shown in FIG. 1, a connecting pipe 777, a buffer tank 60, a gas discharge part 64, and a processing liquid discharge part 63 are provided. Further, in the chamber 7, provided is a pressure gauge 69 for measuring the pressure of the internal space 70. Except the above constituent elements, the substrate processing apparatus 1d has almost the same constitution as that of the substrate processing apparatus 1 shown in FIG. 1, and in the following description, constituent elements identical to or corresponding to those of the substrate processing apparatus 1 shown in FIG. 1 are represented by the same reference signs.

The connecting pipe 777 is provided in an outer peripheral portion of the chamber bottom 711, penetrating the chamber bottom 711. The connecting pipe 777 has a relatively large inner diameter, and a lower end of the connecting pipe 777 is connected to the buffer tank 60 disposed below the chamber 7. To the buffer tank 60, connected are the gas discharge part 64 and the processing liquid discharge part 63. The gas discharge part 64 is controlled by the pressure control part 112 shown in FIG. 2.

Figure 24:
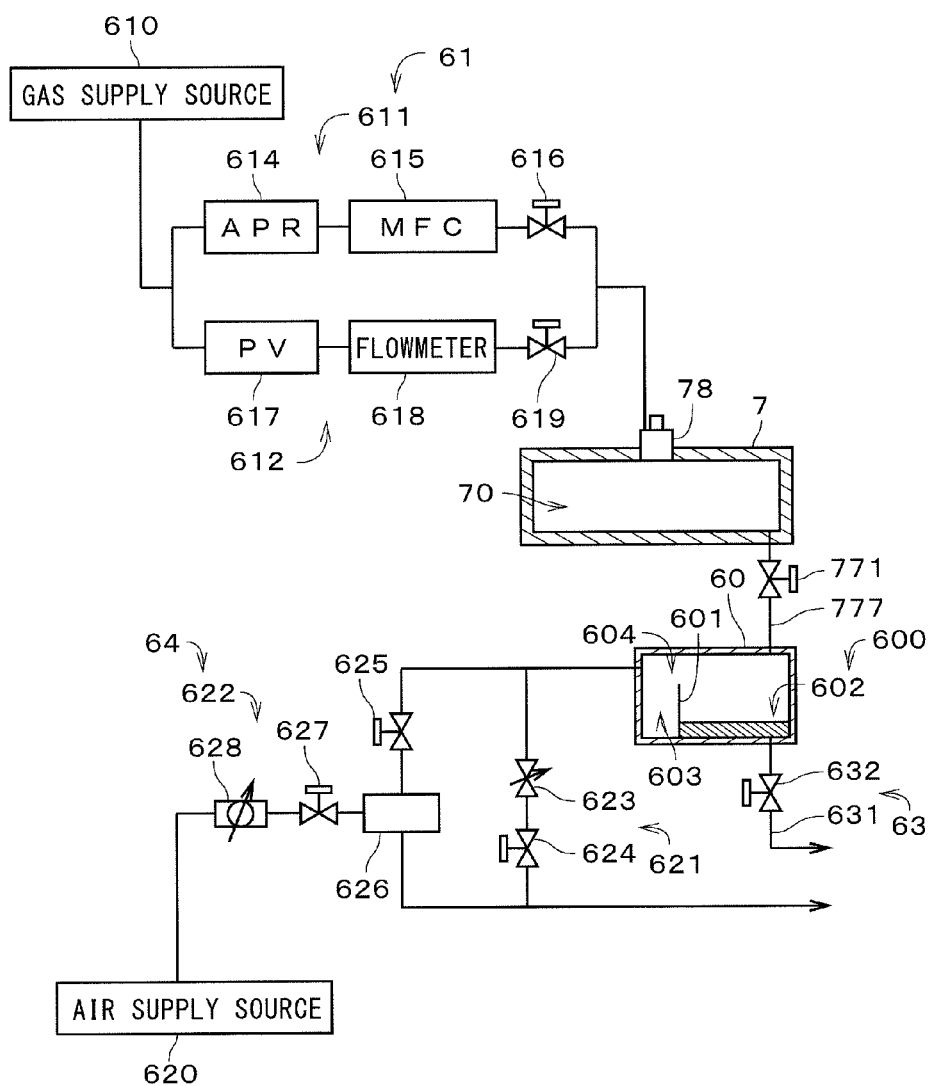
FIG. 24 is a view showing a detailed configuration relating to pressure control.

FIG. 24 is a view showing a detailed configuration relating to the control of the pressure in the internal space 70 of the chamber 7, which is performed by the pressure control part 112. In FIG. 24, for convenience of illustration, the chamber 7 is illustrated to be smaller and as a simplified rectangle. Further, FIG. 24 shows a cross section of the chamber 7 and the buffer tank 60. The same applies to FIG. 26.

As shown in FIG. 24, the gas supply part 61 includes a first gas supply part 611 and a second gas supply part 612. The first gas supply part 611 and the second gas supply part 612 are connected to the chamber 7 in parallel through the second upper nozzle 78. The first gas supply part 611 and the second gas supply part 612 are also connected to a gas supply source 610.

The first gas supply part 611 includes an air pressure regulator (APR) 614, a massflow controller (MFC) 615, and a valve 616. In the first gas supply part 611, the air pressure regulator 614, the massflow controller 615, and the valve 616 are provided in this order from the gas supply source 610 toward the chamber 7. The second gas supply part 612 includes a piezoelectric valve (PV) 617, a flowmeter 618, and a valve 619. In the second gas supply part 612, the piezoelectric valve 617, the flowmeter 618, and the valve 619 are provided in this order from the gas supply source 610 toward the chamber 7. In this preferred embodiment, as each of the valves 616 and 619, a mechanical valve is used, but other types of valves may be used (the same applies to other valves described later).

In the gas supply part 61, the first gas supply part 611 and the second gas supply part 612 are selectively used to supply gas into the internal space 70 of the chamber 7. Specifically, by opening the valve 616 and closing the valve 619, the gas from the gas supply source 610 is supplied into the internal space 70 of the chamber 7 through the first gas supply part 611 and the second upper nozzle 78. Alternatively, by closing the valve 616 and opening the valve 619, the gas from the gas supply source 610 is supplied into the internal space 70 of the chamber 7 through the second gas supply part 612 and the second upper nozzle 78. In this preferred embodiment, nitrogen gas ($N_2$) is supplied into the chamber 7 by the gas supply part 61.

The buffer tank 60 positioned below the chamber 7 is connected to the internal space 70 of the chamber 7 through the connecting pipe 777. The connecting pipe 777 is provided with a mechanical connection valve 771 thereon. The processing liquid supplied into the internal space 70 of the chamber 7 is guided to the buffer tank 60 through the connecting pipe 777.

In a buffer space 600 which is a space inside the buffer tank 60, provided is a barrier rib 601 extending upward from an inner bottom surface of the buffer tank 60 (a bottom side of the buffer space 600). The barrier rib 601 is away from an inner upper surface of the buffer tank 60, and a lower portion of the buffer space 600 is divided into two spaces 602 and 603 by the barrier rib 601. The connecting pipe 777 is connected to an upper portion of the buffer tank 60 over the space 602. The processing liquid guided to the buffer tank 60 from the internal space 70 of the chamber 7 through the connecting pipe 777 is temporarily pooled in the space 602 and does not flow out of the space 602 in the buffer space 600.

In the following discussion, the spaces 602 and 603 are referred to as a "liquid pooling space 602" and a "separating space 603", respectively, and a space over the liquid pooling space 602 and the separating space 603 is referred to as an "upper space 604". The connecting pipe 777 is connected to the upper space 604 in which no processing liquid is pooled. In the substrate processing apparatus 1d, since the connecting pipe 777 has a relatively large inner diameter, the connecting pipe 777 is not filled with the processing liquid when the processing liquid flows in the connecting pipe 777. Therefore, the gas in the buffer tank 60 (specifically, the gas in the upper space 604 and the separating space 603) is always continuous with the gas in the internal space 70 of the chamber 7 with the gas in the connecting pipe 777 interposed therebetween.

The processing liquid discharge part 63 is connected to the bottom portion of the liquid pooling space 602 in the buffer tank 60. The processing liquid discharge part 63 includes a pipe 631 extending downward from the buffer tank 60 and a valve 632 provided on the pipe 631. The processing liquid discharge part 63 discharges the processing liquid pooled in the buffer tank 60 to the outside of the substrate processing apparatus 1d. The valve 632 is closed when the processing of the substrate 9 is performed, and the processing liquid used for the processing of the substrate 9 is pooled in the liquid pooling space 602 of the buffer tank 60. Then, by opening the valve 632 when the processing of the substrate 9 is finished or the like, the processing liquid in the liquid pooling space 602 is discharged to the outside of the substrate processing apparatus 1d through the pipe 631 by the gravity.

The gas discharge part 64 includes a slow leak part 621 and a forced exhaust part 622. The slow leak part 621 and the forced exhaust part 622 are connected to the buffer tank 60 in parallel. The slow leak part 621 and the forced exhaust part 622 are further connected to the upper space 604 over the separating space 603. It is thereby possible to prevent the processing liquid guided from the chamber 7 to the buffer tank 60 from flowing in the gas discharge part 64.

The slow leak part 621 includes a throttle 623 and a valve 624 provided in this order from the side of the buffer tank 60. The forced exhaust part 622 includes a valve 625 and a vacuum ejector 626 provided in this order from the side of the buffer tank 60. The vacuum ejector 626 is connected to an air supply source 620 through a valve 627 and an electropneumatic regulator 628. As the vacuum ejector 626, for example, the CONVUM of Myotoku Ltd. is used.

In the gas discharge part 64, the slow leak part 621 and the forced exhaust part 622 are selectively used, to discharge the gas in the buffer tank 60 to the outside of the substrate processing apparatus 1d. Specifically, by opening the valve 624 and closing the valves 625 and 627, the gas is discharged from the buffer space 600 in the buffer tank 60 to the outside of the substrate processing apparatus 1d through the slow leak part 621. In the slow leak part 621, by controlling the degree of opening of the throttle 623, the flow rate of the gas to be discharged from the buffer tank 60 is controlled.

Alternatively, by closing the valve 624 and opening the valves 625 and 627, compressed air is supplied from the air supply source 620 into the vacuum ejector 626, and the gas in the buffer space 600 of the buffer tank 60 is sucked by the vacuum ejector 626. The gas inside the buffer tank 60 is thereby forcedly discharged to the outside of the substrate processing apparatus 1d through the forced exhaust part 622.

In the substrate processing apparatus 1d, the pressure control part 112 shown in FIG. 2 controls the gas supply part 61 and the gas discharge part 64 on the basis of the output from the pressure gauge 69, to thereby control the pressure in the internal space 70 of the chamber 7. In order to increase the pressure in the internal space 70 to be higher than the normal pressure (atmospheric pressure) to bring the internal space 70 into a pressurized atmosphere, the first gas supply part 611 is selected in the gas supply part 61 and the slow leak part 621 is selected in the gas discharge part 64 shown in FIG. 24. Then, the massflow controller 615 of the first gas supply part 611 controls the amount of gas to be supplied into the internal space 70 of the chamber 7 on the basis of a measured value of the pressure in the internal space 70, which is outputted from the pressure gauge 69. In the slow leak part 621, the degree of opening of the throttle 623 is constant, and the gas in the buffer tank 60 is discharged (leaked) outside through the slow leak part 621 by a small flow rate. The internal space 70 of the chamber 7 and the buffer space 600 of the buffer tank 60 are thereby maintained in a predetermined pressurized atmosphere.

On the other hand, in order to decrease the pressure in the internal space 70 to be lower than the normal pressure to bring the internal space 70 into a reduced pressure atmosphere, the second gas supply part 612 is selected in the gas supply part 61 and the forced exhaust part 622 is selected in the gas discharge part 64. Then, while the amount of gas to be discharged from the buffer tank 60 is maintained constant by the forced exhaust part 622, the piezoelectric valve 617 of the first gas supply part 611 controls the amount of gas to be supplied into the internal space 70 of the chamber 7 on the basis of the measured value of the pressure in the internal space 70, which is outputted from the pressure gauge 69. The internal space 70 of the chamber 7 and the buffer space 600 of the buffer tank 60 are thereby maintained in a predetermined reduced pressure atmosphere.

In the substrate processing apparatus 1d, the flow rate of compressed air to be supplied from the air supply source 620 into the vacuum ejector 626 may be controlled on the basis of the output from the pressure gauge 69 while the supply of gas from the first gas supply part 611 into the chamber 7 is maintained constant. The amount of gas to be discharged from the buffer tank 60 is thereby controlled, and the internal space 70 of the chamber 7 and the buffer space 600 of the buffer tank 60 are thereby maintained in a predetermined reduced pressure atmosphere.

Further, in a case where the gas is supplied into the internal space 70 while the pressure in the internal space 70 is maintained at normal pressure, the first gas supply part 611 is selected in the gas supply part 61 and the slow leak part 621 is selected in the gas discharge part 64, like in the case where the internal space 70 is brought into a pressurized atmosphere.

Figure 13:
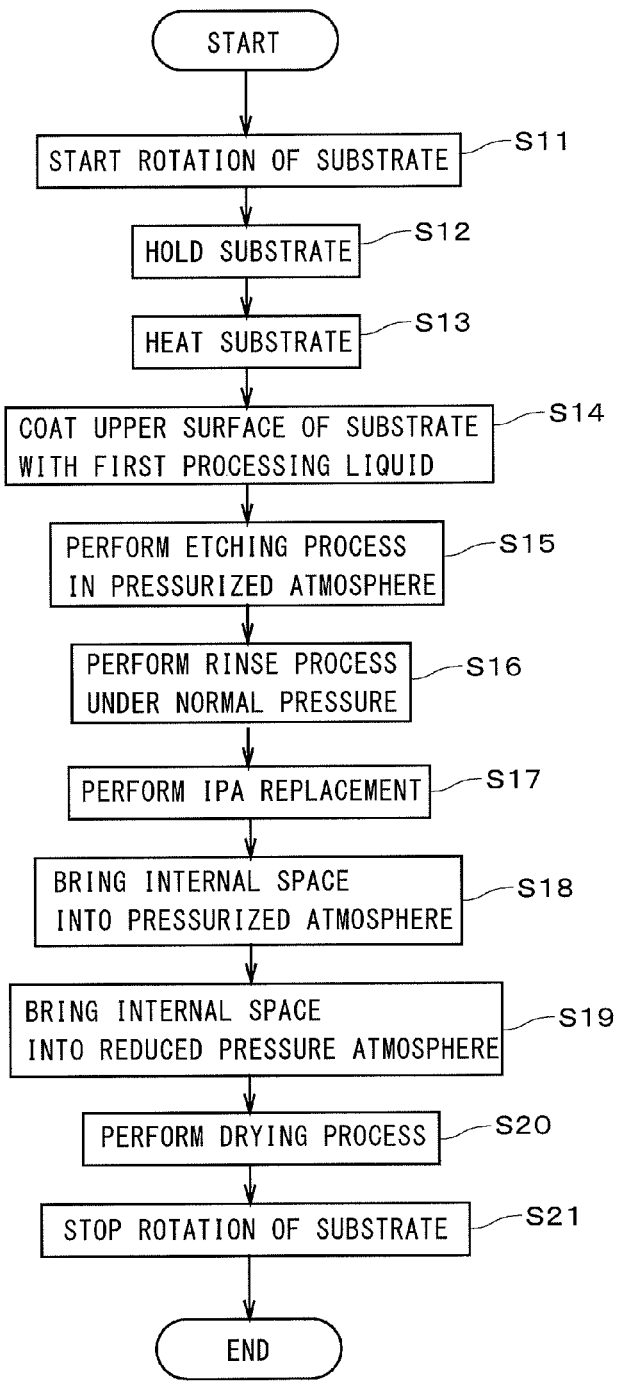
FIG. 13 is a flowchart showing an operation flow of substrate processing.

An operation flow of processing the substrate 9 in the substrate processing apparatus 1d is almost the same as that of Steps S11 to S21 shown in FIG. 13. In the substrate processing apparatus 1d, in Step S14, the first processing liquid flowing out from the upper surface 91 and the lower surface 92 of the substrate 9 is guided to the buffer tank 60 through the connecting pipe 777. The valve 632 of the processing liquid discharge part 63 (see FIG. 24) is closed, and the processing liquid guided to the buffer tank 60 is temporarily pooled in the liquid pooling space 602 of the buffer space 600.

In the substrate processing apparatus 1d, between Steps S15 and S16, after stopping the supply of the first processing liquid from the first processing liquid supply part 31, the valve 632 may be opened in the processing liquid discharge part 63, and after the first processing liquid in the liquid pooling space 602 is discharged to the outside of the substrate processing apparatus 1d, the valve 632 may be closed again. Further, in Step S16, the first processing liquid and the second processing liquid spattering from the upper surface 91 of the substrate 9 are received and guided downward by the liquid receiving surface 523 of the rotor part 52 and then guided to the buffer tank 60 through the connecting pipe 777 to be temporarily pooled in the liquid pooling space 602.

In Step S18, the second processing liquid spattering from the substrate 9 is received and guided downward by the liquid receiving surface 523 of the rotor part 52 and then guided to the buffer tank 60 through the connecting pipe 777 to be temporarily pooled in the liquid pooling space 602. In the processing liquid discharge part 63, after the valve 632 is opened and the second processing liquid in the liquid pooling space 602 is discharged to the outside of the substrate processing apparatus 1d, the valve 632 may be closed again.

Figure 25:
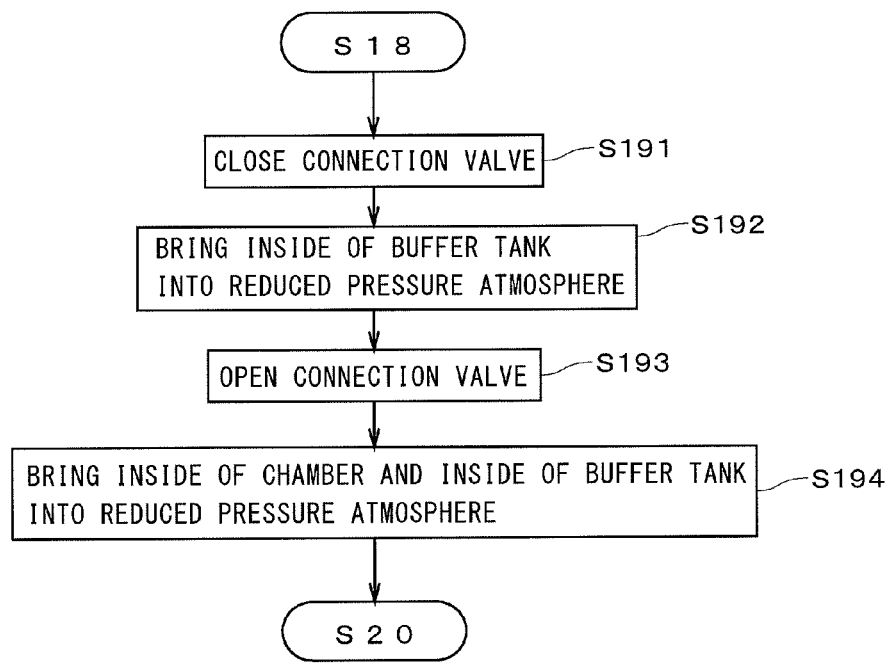
FIG. 25 is a flowchart showing part of an operation flow of substrate processing.

FIG. 25 is a flowchart showing a detailed operation flow of Step S19 in the substrate processing apparatus 1d. In the substrate processing apparatus 1d, first, after the pressure in the internal space 70 of the chamber 7 is decreased back to the normal pressure, the connection valve 771 provided on the connecting pipe 777 shown in FIG. 24 is closed and the internal space 70 of the chamber 7 and the buffer space 600 of the buffer tank 60 are not continuous with each other (Step S191). Then, by driving the forced exhaust part 622 with the connection valve 771 closed, the gas in the buffer space 600 of the buffer tank 60 is discharged to the outside of the substrate processing apparatus 1d and the buffer tank 60 is thereby brought into a reduced pressure atmosphere (Step S192).

After that, the connection valve 771 is opened (Step S193), and the forced exhaust part 622 is continuously driven while the internal space 70 of the chamber 7 and the buffer space 600 of the buffer tank 60 are continuous with each other. The gas in the chamber 7 is also forcedly discharged to the outside of the substrate processing apparatus 1d through the buffer tank 60, and the internal space 70 of the chamber 7 and the buffer space 600 of the buffer tank 60 are thereby brought into a predetermined reduced pressure atmosphere (Step S194).

In the substrate processing apparatus 1d, in Step S20, the third processing liquid spattering from the substrate 9 is also received and guided downward by the liquid receiving surface 523 of the rotor part 52 and then guided to the buffer tank 60 through the connecting pipe 777 to be temporarily pooled in the liquid pooling space 602. Further, after Step S21, the pressure in the internal space 70 of the chamber 7 is increased back to the normal pressure, and then, in the processing liquid discharge part 63, the valve 632 is opened and the processing liquid in the liquid pooling space 602 is discharged to the outside of the substrate processing apparatus 1d.

In the substrate processing apparatus 1d, since the liquid receiving surface 523 is provided, it is possible to quickly guide the processing liquid spattering from the substrate 9 to the lower portion of the internal space 70 and quickly guide the processing liquid to the buffer tank 60 through the connecting pipe 777. Further, since the liquid receiving surface 523 extends upward to be higher than the upper surface 91 of the substrate 9 and goes outward in the radial direction as it goes downward, it is possible to more quickly guide the processing liquid spattering from the substrate 9 to the buffer tank 60.

In the substrate processing apparatus 1d, since the gas supply part 61 for supplying gas into the internal space 70, the gas discharge part 64 for discharging the gas from the internal space 70, and the pressure control part 112 for controlling the pressure in the internal space 70 are provided, it is possible to process the substrate 9 in various atmospheres (for example, in a low oxygen atmosphere) and under various pressures. It is thereby possible to shorten the time required for the processing of the substrate 9 and perform various processings on the substrate 9.

In the substrate processing apparatus 1*d*, as discussed above, the buffer tank 60 which is connected to the internal space 70 of the chamber 7 through the connecting pipe 777 and temporarily pools the processing liquid guided from the internal space 70 is provided below the chamber 7. Then, the gas in the buffer space 600 of the buffer tank 60 is always continuous with the gas in the internal space 70 of the chamber 7 with the gas in the connecting pipe 777 interposed therebetween. It is thereby possible to always make the sealed internal space 70 continuous with the gas discharge part 64 through the gas. As a result, even in the case where processing using a large amount of processing liquid is performed in the internal space 70, it is possible to always control the pressure in the internal space 70 of the chamber 7 with high accuracy and maintain the pressure in the internal space 70 at a desired pressure. Further, by supplying gas from the upper portion of the chamber 7 into the internal space 70 and discharging the gas from the lower portion of the internal space 70, a downward airflow (so-called downflow) is formed in the internal space 70. It is thereby possible to prevent particles or the like from being deposited on the substrate 9 and improve the cleanability of the substrate 9.

In the substrate processing apparatus 1*d*, the connecting pipe 777 for making the gas in the buffer tank 60 always continuous with the gas in the chamber 7 may be connected to an upper portion of the chamber sidewall 712 or the chamber cover 73 and a barrier rib or the like for preventing the processing liquid from reaching the connecting part may be provided. In this case, the chamber bottom 711 is provided with another pipe for guiding the processing liquid in the chamber 7 to the buffer tank 60. Also this structure can always control the pressure in the internal space 70 of the chamber 7 with high accuracy. As shown in this preferred embodiment, however, with the structure in which the processing liquid in the chamber 7 is guided to the buffer tank 60 through the connecting pipe 777, it is possible to simplify the configuration of the substrate processing apparatus 1*d*.

In the gas discharge part 64, since the slow leak part 621 and the forced exhaust part 622 which are connected to the buffer tank 60 in parallel are provided, it is possible to easily control the atmosphere in the internal space 70 of the chamber 7 between the pressurized atmosphere and the reduced pressure atmosphere. Further, in Step S19, after the inside of the buffer tank 60 is brought into a reduced pressure atmosphere in advance, the buffer tank 60 is made continuous with the chamber 7 and the pressure in the chamber 7 is decreased. It is thereby possible to quickly bring the internal space 70 of the chamber 7 into a predetermined reduced pressure atmosphere. The pressure in the buffer tank 60 in Step S192 may be not lower than the respective pressures in the chamber 7 and the buffer tank 60 in Step S194, but it is preferable that the pressure in Step S192 should be lower than the pressures in Step S194. It is thereby possible to more quickly bring the internal space 70 of the chamber 7 into a predetermined reduced pressure atmosphere.

In the substrate processing apparatus 1*d*, like in the substrate processing apparatus 1 shown in FIG. 14, the processing liquid may be supplied onto the upper surface 91 of the substrate 9 from the scan nozzle 35 inserted between the chamber cover 73 and the chamber body 71 while the chamber cover 73 is positioned above the chamber body 71, being away therefrom. Also in this case, the processing liquid spattering from the substrate 9 is received and guided downward by the liquid receiving surface 523 of the rotor part 52. It is thereby possible to prevent the processing liquid spattering from the substrate 9 from splashing back and being deposited onto the substrate 9. It is also possible to quickly guide the processing liquid spattering from the substrate 9 to the buffer tank 60.

An operation flow of cleaning the inside of the chamber 7 in the substrate processing apparatus 1*d* is almost the same as that of Steps S31 to S35 shown in FIG. 16. In the substrate processing apparatus 1*d*, in Step S31, when the second processing liquid is pooled in the internal space 70 of the chamber 7, the connection valve 711 (see FIG. 24) is closed. In Step S33, by opening the connection valve 771 and also opening the valve 632 in the processing liquid discharge part 63, the second processing liquid in the internal space 70 is discharged together with extraneous matters or the like removed from the inner surface of the chamber 7 to the outside of the substrate processing apparatus 1*d* through the buffer tank 60. In Step S34, by closing the valve 632 and controlling the gas supply part 61 and the gas discharge part 64, the internal space 70 and the buffer space 600 are brought into a predetermined reduced pressure atmosphere. Step S34 is executed by the same procedure of Steps S191 to S194 shown in FIG. 25. It is thereby possible to quickly bring the inside of the chamber 7 into a predetermined reduced pressure atmosphere. In Step S35, the second processing liquid deposited on the rotor part 52 and the substrate holding part 2 spatters into the surroundings, being guided to the lower portion of the internal space 70, and is guided to the buffer tank 60 through the connecting pipe 777.

Figure 26:
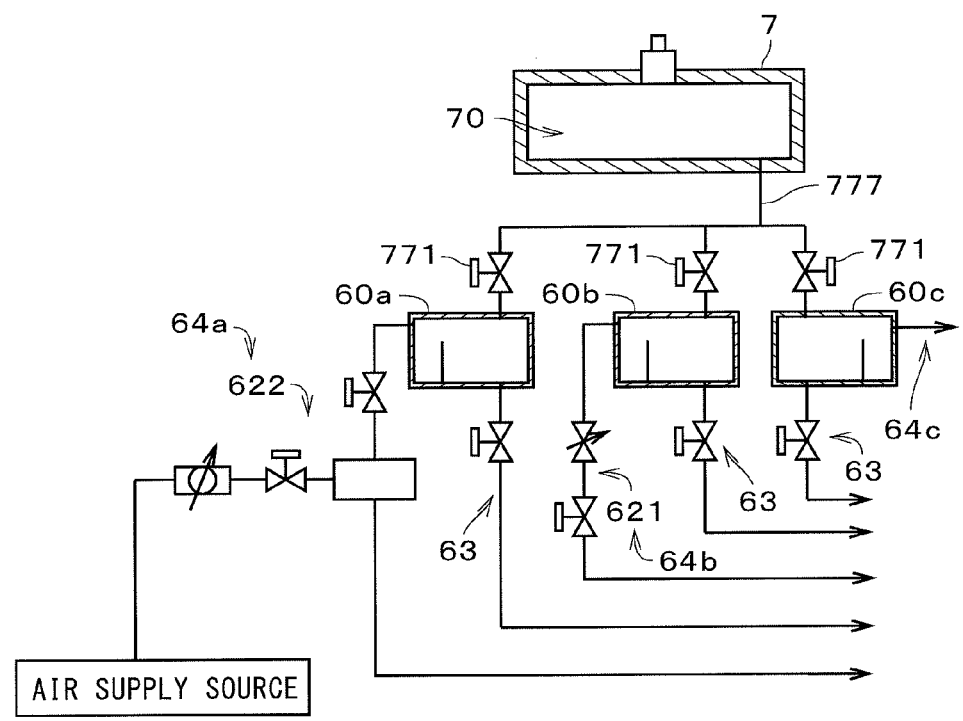
FIG. 26 is a view showing another detailed configuration relating to pressure control.

FIG. 26 is a view showing in detail another preferable configuration relating to the control of the pressure in the internal space 70 of the chamber 7. In FIG. 26, the gas supply part 61 is not shown. In the exemplary configuration of FIG. 26, three buffer tanks 60*a*, 60*b*, and 60*c* are provided below the chamber 7. In the following discussion, the buffer tanks 60*a*, 60*b*, and 60*c* are referred to as a "first buffer tank 60*a*", a "second buffer tank 60*b*", and a "third buffer tank 60*c*", respectively.

The first buffer tank 60*a*, the second buffer tank 60*b*, and the third buffer tank 60*c* are connected in parallel to the internal space 70 of the chamber 7 through the connecting pipe 777. The connecting pipe 777 is provided with three connection valves 771 corresponding to the first buffer tank 60*a*, the second buffer tank 60*b*, and the third buffer tank 60*c*, respectively, and by switching opening/closing of these connection valves 771, the first buffer tank 60*a*, the second buffer tank 60*b*, and the third buffer tank 60*c* are selectively used. The gas in the used buffer tank is always continuous with the gas in the internal space 70 of the chamber 7 with the gas in the connecting pipe 777 interposed therebetween.

The above-described processing liquid discharge part 63 is connected to each of the first buffer tank 60*a*, the second buffer tank 60*b*, and the third buffer tank 60*c*. To an upper portion of the first buffer tank 60*a*, connected is the above-described forced exhaust part 622 as a gas discharge part 64*a*. To an upper portion of the second buffer tank 60*b*, connected is the above-described slow leak part 621 as a gas discharge part 64*b*. To an upper portion of the third buffer tank 60*c*, connected is a discharge pipe which is open to the air as a gas discharge part 64*c*.

In the exemplary configuration of FIG. 26, when the etching process is performed in the pressurized atmosphere in Step S15, the second buffer tank 60*b* connected to the slow leak part 621 is selectively used. The first processing liquid which is an etching solution is temporarily pooled in the second buffer tank 60*b* and then collected through the processing liquid discharge part 63. The collected first processing liquid is recycled for the substrate processings or the like in the substrate processing apparatus 1*d* after removing impurities and performing the like processes.

Further, when the rinse process is performed under normal pressure in Step S16, the third buffer tank 60*c* is selectively used, and the second processing liquid which is a rinse liquid is temporarily pooled in the third buffer tank 60*c*. The second processing liquid is discharged to the outside of the substrate processing apparatus 1*d* through the processing liquid discharge part 63 and discarded.

When the drying process is performed in the reduced pressure atmosphere in Step S20, the first buffer tank 60*a* connected to the forced exhaust part 622 is selectively used. The third processing liquid which is isopropyl alcohol (IPA) is temporarily pooled in the first buffer tank 60*a* and then collected through the processing liquid discharge part 63. The collected third processing liquid is recycled for the substrate processings or the like in the substrate processing apparatus 1*d* after removing impurities and performing the like processes.

Thus, in the exemplary configuration of FIG. 26, the first buffer tank 60*a*, the second buffer tank 60*b*, and the third buffer tank 60*c* are selectively used, and it is thereby possible to collect a plurality of kinds of processing liquids individually and increase the collection efficiency of the processing liquid. Further, since a plurality of buffer tanks are provided, it is possible to reduce the volumetric capacity of each buffer tank. As a result, it is possible to reduce the time required to increase or decrease the pressure in the internal space 70 of the chamber 7.

In the exemplary configuration of FIG. 26, the slow leak part 621 and the forced exhaust part 622 may be connected to each of the first buffer tank 60*a*, the second buffer tank 60*b*, and the third buffer tank 60*c*. In this case, since the buffer tank which is not connected to the internal space 70 of the chamber 7 in the reduced pressure atmosphere is brought into the reduced pressure atmosphere in advance like in the internal space 70, it is possible to switch from the currently used buffer tank to another buffer tank while preventing variation in the pressure in the chamber 7 during the processing of the substrate 9 in the reduced pressure atmosphere. Further, if a gas supply part like the above-described gas supply part 61 is connected to each of the buffer tanks, it is possible to switch the buffer tank while preventing variation in the pressure in the chamber 7, even during the processing of the substrate 9 in the pressurized atmosphere.

In the substrate processing apparatus 1*d*, the rotor part 52 may be provided with the protective wall 525 shown in FIG. 18. In this case, the processing liquid from the substrate 9 is guided downward by the protective wall 525 and further guided to the buffer tank 60 (see FIG. 23) through the connecting pipe 777 provided below the internal space 70. Further, in the substrate processing apparatus 1*d*, instead of the stator part 51 and the rotor part 52 shown in FIG. 23, the stator part 51*a* and the rotor part 52*a* shown in FIG. 19 may be provided and the chamber sidewall 712 may have the same shape as that shown in FIG. 19. In this case, the processing liquid on the upper surface 91 of the substrate 9 is guided to the connecting pipe 777 provided below the internal space 70 through the flow channel 534 and further guided to the buffer tank 60 through the connecting pipe 777.

Figure 27:
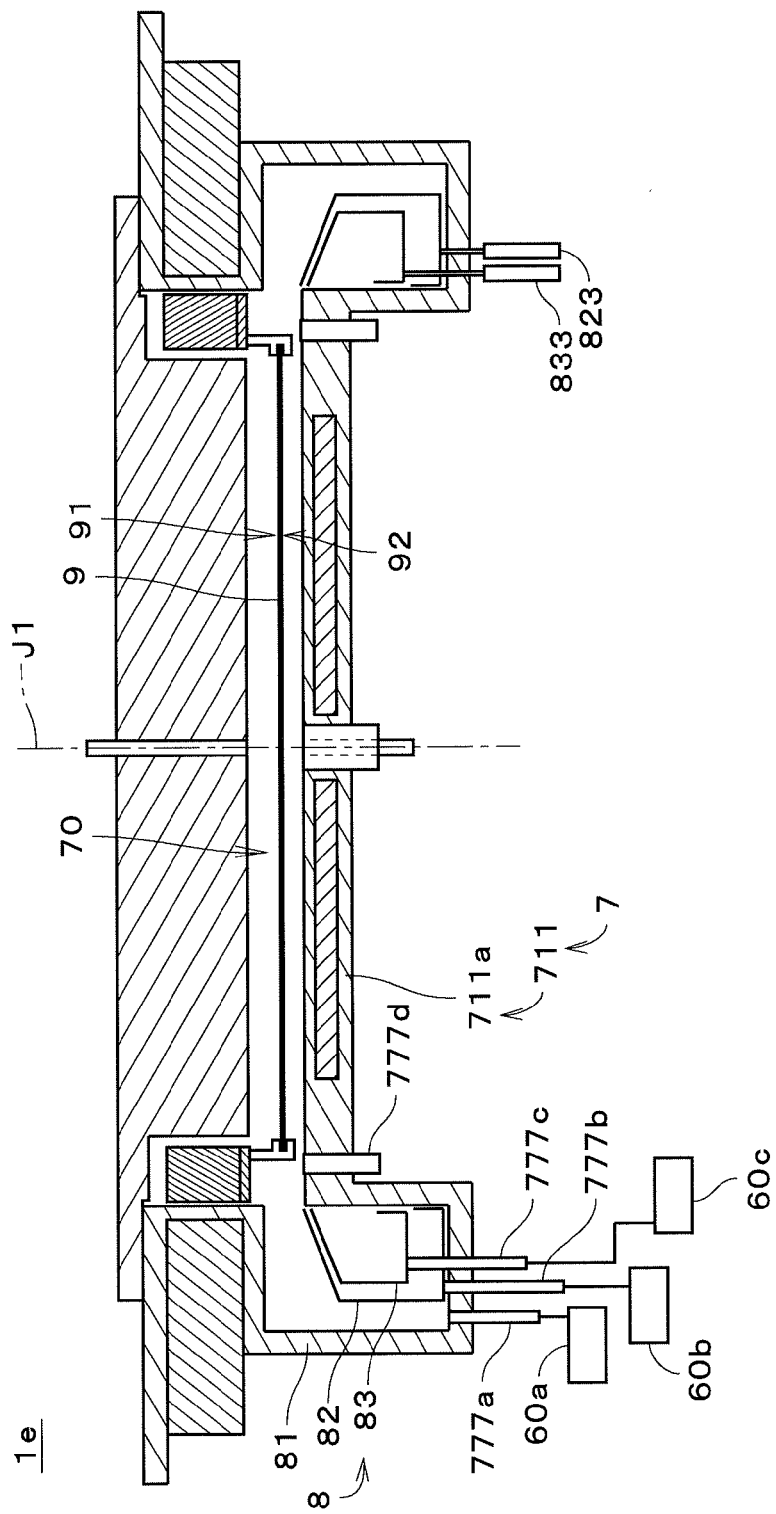
FIG. 27 is a cross section showing a substrate processing apparatus in accordance with a sixth preferred embodiment of the present invention.

FIG. 27 is a cross section showing a substrate processing apparatus 1*e* in accordance with the sixth preferred embodiment of the present invention. In the substrate processing apparatus 1*e*, a connecting pipe and a buffer tank like the connecting pipe 777 and the buffer tank 60 in the substrate processing apparatus 1*d* shown in FIG. 23, respectively, are connected to the liquid collecting part 8 in the substrate processing apparatus 1*c* shown in FIG. 20. Except the above constituent elements, the substrate processing apparatus 1*e* has almost the same constitution as that of the substrate processing apparatus 1*c* shown in FIG. 20, and in the following description, constituent elements identical to or corresponding to those of the substrate processing apparatus 1*c* are represented by the same reference signs.

As shown in FIG. 27, to the bottom portion of the first liquid receiving part 81, connected is a first connecting pipe 777*a*, and the first buffer tank 60*a* shown in FIG. 26 is connected to the first liquid receiving part 81 through the first connecting pipe 777*a*. To the first buffer tank 60*a*, connected are the gas discharge part 64*a* and the processing liquid discharge part 63 as shown in FIG. 26. The processing liquid received by the first liquid receiving part 81 shown in FIG. 27 is guided to the first buffer tank 60*a* through the first connecting pipe 777*a* and temporarily pooled therein. Further, the processing liquid supplied onto the lower surface 92 of the substrate 9 and the like and dropped onto the center portion 711*a* of the chamber bottom 711 is guided to a not-shown buffer tank through a connecting pipe 777*d* provided at the center portion 711*a*.

To a bottom portion of the second liquid receiving part 82, provided is a second connecting pipe 777*b*, and the second buffer tank 60*b* is connected to the second liquid receiving part 82 through the second connecting pipe 777*b*. The processing liquid received by the second liquid receiving part 82 is guided to the second buffer tank 60*b* through the second connecting pipe 777*b* and temporarily pooled therein. Further, to a bottom portion of the third liquid receiving part 83, provided is a third connecting pipe 777*c*, and the third buffer tank 60*c* is connected to the third liquid receiving part 83 through the third connecting pipe 777*c*. The processing liquid received by the third liquid receiving part 83 is guided to the third buffer tank 60*c* through the third connecting pipe 777*c* and temporarily pooled therein.

In the substrate processing apparatus 1*e*, like in the substrate processing apparatus 1*c* of FIG. 20, the second liquid receiving part 82 and the third liquid receiving part 83 are moved in the vertical direction by the liquid receiving part up-and-down moving mechanisms 823 and 833, respectively, and the receipt of the processing liquid by the first liquid receiving part 81, that of the processing liquid by the second liquid receiving part 82, and that of the processing liquid by the third liquid receiving part 83 are thereby selectively switched. Then, the respective processing liquids received by the first liquid receiving part 81, the second liquid receiving part 82, and the third liquid receiving part 83 are temporarily pooled in the first buffer tank 60*a*, the second buffer tank 60*b*, and the third buffer tank 60*c*, respectively.

Figure 28:
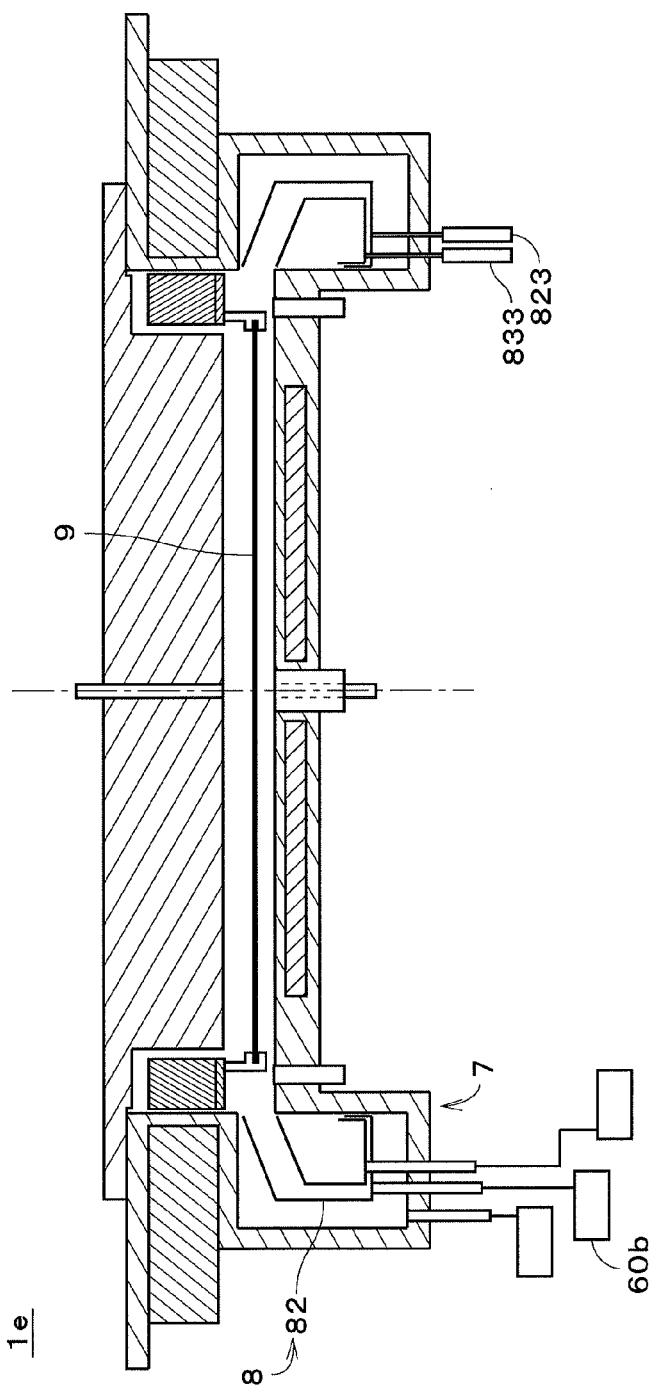
FIGS. 28 and 29 are cross sections each showing the substrate processing apparatus.

In the substrate processing of above-discussed Steps S11 to S21, in Step S15, by using the slow leak part 621 of the gas discharge part 64*b* connected to the second buffer tank 60*b*, the internal space 70 of the chamber 7 and the inside of the second buffer tank 60*b* are brought into a pressurized atmosphere. Then, between the etching process in Step S15 and the rinse process in Step S16, the liquid collecting part 8 is brought into the second liquid receiving state shown in FIG. 28 and the number of rotation of the substrate 9 is increased. The first processing liquid which is an etching solution spatters from the substrate 9, and is received by the second liquid receiving part 82 and temporarily pooled in the second buffer tank 60b. The first processing liquid in the second buffer tank 60b is discharged to the outside of the substrate processing apparatus 1e by the processing liquid discharge part 63 (see FIG. 26) and collected, and recycled for the substrate processings or the like in the substrate processing apparatus 1e after removing impurities and performing the like processes.

Figure 29:
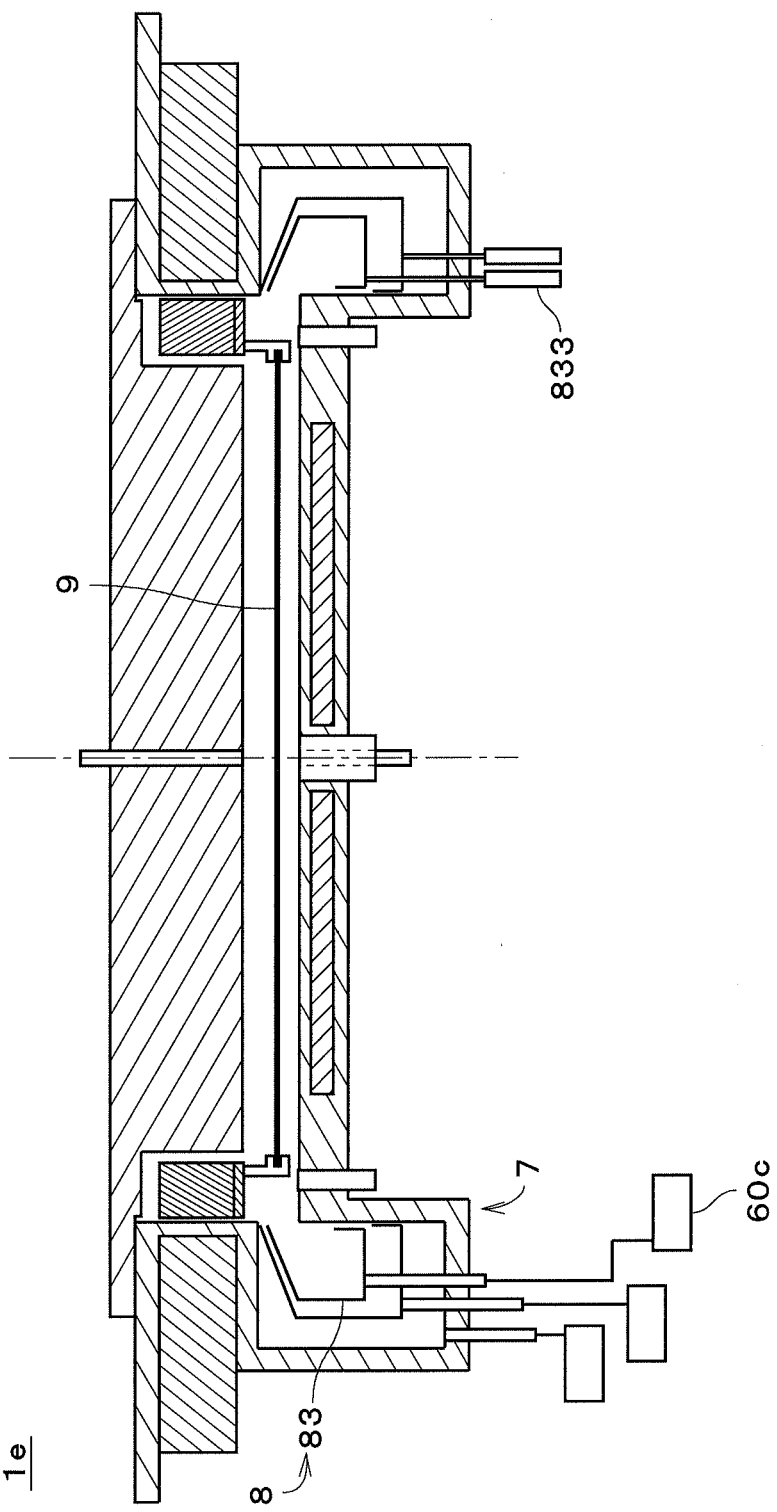

Subsequently, after the liquid receiving part up-and-down moving mechanism 833 is driven to bring the liquid collecting part 8 into the third liquid receiving state shown in FIG. 29, by performing the rinse process in Step S16, the second processing liquid which is deionized water spatters together with the first processing liquid remaining on the substrate 9 from the substrate 9, and the processing liquids are received by the third liquid receiving part 83 and temporarily pooled in the third buffer tank 60c. Further, in Steps S17 and S18, the second processing liquid spattering from the substrate 9 is also received by the third liquid receiving part 83 and temporarily pooled in the third buffer tank 60c. The second processing liquid in the third buffer tank 60c is discharged to the outside of the substrate processing apparatus 1e by the processing liquid discharge part 63 and discarded.

Next, after the liquid receiving part up-and-down moving mechanisms 823 and 833 are driven to bring the liquid collecting part 8 into the first liquid receiving state shown in FIG. 27, in Step S19, by using the forced exhaust part 622 of the gas discharge part 64a (see FIG. 26) connected to the first buffer tank 60a, the internal space 70 of the chamber 7 and the inside of the first buffer tank 60a are brought into a reduced pressure atmosphere. Then, by performing the drying process in Step S20, the third processing liquid which is isopropyl alcohol (IPA) spatters from the substrate 9, and the third processing liquid is received by the first liquid receiving part 81 and temporarily pooled in the first buffer tank 60a. The third processing liquid in the first buffer tank 60a is discharged to the outside of the substrate processing apparatus 1e by the processing liquid discharge part 63 and collected, and recycled for the substrate processings or the like in the substrate processing apparatus 1e after removing impurities and performing the like processes.

In the substrate processing apparatus 1e, as discussed above, the first buffer tank 60a, the second buffer tank 60b, and the third buffer tank 60c are connected to the first liquid receiving part 81, the second liquid receiving part 82, and the third liquid receiving part 83, respectively. Then, when the processing of the substrate 9 is performed, the first buffer tank 60a, the second buffer tank 60b, and the third buffer tank 60c are selectively used. The gas in the used buffer tank is always continuous with the gas in the internal space 70 of the chamber 7 with the gas in the connecting pipe interposed therebetween. It is thereby possible to always control the pressure in the internal space 70 of the chamber 7 with high accuracy and maintain the pressure in the internal space 70 at a desired pressure, like in the substrate processing apparatus 1d of FIG. 23.

Though the preferred embodiments of the present invention have been discussed above, the present invention is not limited to the above-discussed preferred embodiments, but allows various variations.

For example, the respective shapes and structures of the stator parts 51 and 51a and the rotor parts 52, 52a, and 52b in the substrate rotating mechanism 5 may be changed in various ways. The structures of the chuck parts 21 and 21a in the substrate holding part 2 and the positions where the chuck parts 21 and 21a are attached to the rotor part may be changed in various ways. For example, there may be a case where the substrate 9 is held by the substrate holding part 2 while the chuck parts are attached to an upper portion of the rotor part and the lower surface 92 of the substrate 9 is positioned to be higher than the upper end of the rotor part.

In the chuck part 21 of FIG. 4, one rotation axis 25 does not necessarily have to serve both as the rotation axis of the substrate supporting part 22 and as that of the substrate retaining part 23, but the substrate supporting part 22 and the substrate retaining part 23 may have respective rotation axes. Further, adjacently to the substrate supporting part 22, only one substrate retaining part 23 may be provided, or three or more substrate retaining parts 23 may be provided. A surface of the substrate supporting part 22 which is in contact with the substrate 9 and a surface of the substrate retaining part 23 which is in contact with the substrate 9 may extend in the horizontal direction.

The above-discussed rotor part do not necessarily have to rotate in a floating state, but a structure such as guide or the like for mechanically support the rotor part is provided in the internal space 70 and the rotor part may rotate along the guide.

In the rotor part 52 of FIG. 9, if the processing liquid from the substrate 9 does not spatter a lot up to be higher than the liquid receiving surface 523, the annular protruding portion 524 does not necessarily have to be provided. Further, the liquid receiving surface 523 does not necessarily have to be a sloped surface which goes outward in the radial direction as it goes downward, but may be, for example, a cylindrical surface in substantially parallel to the vertical direction. In the substrate processing apparatus 1b of FIG. 19, only if the flow channel 534 is formed between the rotor part 52a and the flow channel forming part 715, the lower surface 716 of the flow channel forming part 715 does not necessarily have to be a smooth sloped surface which gradually goes downward as it goes outward in the radial direction but may have various shapes.

In the substrate processing apparatus 1c of FIG. 20 and the substrate processing apparatus 1e of FIG. 27, when it is not necessary to individually collect a plurality of kinds of processing liquids, the second liquid receiving part 82 and the third liquid receiving part 83 may be omitted. Further, even when the processing using a large amount of processing liquid is performed while the chamber 7 is sealed, only if the processing liquid spattering from the substrate 9 can be discharged to the outside of the chamber 7 while the processing liquid is prevented from being deposited on the substrate 9 again, the first liquid receiving part 81 may be also omitted. In this case, in the substrate processing apparatus 1e, the first buffer tank 60a, the second buffer tank 60b, and the third buffer tank 60c shown in FIG. 27 are connected to the chamber 7 in parallel through the connecting pipe 777.

In the above-discussed substrate processing apparatuses, load and unload of the substrate 9 into/from the chamber 7 may be performed by various mechanisms other than the above-discussed substrate moving mechanism 4. Further, in the chamber cover 73, the cover protruding portion 731 does not necessarily have to be provided.

In the processing of Steps S11 to S21, the heating of the substrate 9 by the heating part 79 in Step S13 may be performed while the internal space 70 of the chamber 7 is brought into the reduced pressure atmosphere. It is thereby prevent heat from transferring from the substrate 9 to the surrounding gas and heat the substrate 9 in a shorter time as compared with under normal pressure. Further, the heating part 79 is not limited to a heater. For example, the chamber bottom 711 and the chamber cover 73 are formed of a material such as quartz or the like having transparency, and by emitting light to the substrate 9 from a light emitting part through the chamber bottom 711 and the chamber cover 73, the substrate 9 may be heated.

The coating of the upper surface 91 of the substrate 9 with the first processing liquid in Step S14 may be performed while the internal space 70 of the chamber 7 is brought into the reduced pressure atmosphere. Since the first processing liquid thereby quickly spreads on the upper surface 91 of the substrate 9 from the center portion to the outer peripheral portion thereof, it is possible to coat the upper surface 91 of the substrate 9 with the first processing liquid in a shorter time as compared with under normal pressure. Further, since the amount of gas in the pattern gap on the substrate 9 is reduced as compared with under normal pressure, the first processing liquid supplied onto the upper surface 91 of the substrate 9 can more easily enter the pattern gap. It is thereby possible to more appropriately perform the etching process in the pattern gap.

In Step S16, while the internal space 70 of the chamber 7 is brought into the reduced pressure atmosphere, after the upper surface 91 of the substrate 9 is coated with the second processing liquid, the pressure in the internal space 70 may be increased back to the normal pressure. Since the second processing liquid thereby quickly spreads on the upper surface 91 of the substrate 9 from the center portion to the outer peripheral portion thereof, it is possible to replace the first processing liquid with the second processing liquid and coat the upper surface 91 of the substrate 9 with the second processing liquid in a shorter time as compared with under normal pressure. Further, by increasing the pressure in the internal space 70 after coating the upper surface 91 of the substrate 9 with the second processing liquid, the second processing liquid is squeezed into the pattern gap. As a result, the second processing liquid can more easily enter the pattern gap, and it is thereby possible to more reliably replace the first processing liquid with the second processing liquid.

In Step S16, the rinse process may be performed on the substrate 9 while the internal space 70 of the chamber 7 is brought into the pressurized atmosphere. It is thereby possible to more reliably prevent the second processing liquid on the substrate 9 from vaporizing as compared with under normal pressure and prevent the temperature of the substrate 9 from being decreased by the heat of vaporization as it goes from the center portion to the outer peripheral portion of the substrate 9. As a result, it is possible to improve the uniformity in the temperature of the upper surface 91 of the substrate 9 in the rinse process using the second processing liquid, and further possible to improve the uniformity in the rinse process in the entire upper surface 91 of the substrate 9. It is also possible to improve the uniformity in the rinse process in the entire lower surface 92 of the substrate 9.

The coating of the upper surface 91 of the substrate 9 with the third processing liquid in Step S17 may be performed while the internal space 70 of the chamber 7 is brought into the reduced pressure atmosphere. Since the third processing liquid thereby quickly spreads on the upper surface 91 of the substrate 9 from the center portion to the outer peripheral portion thereof, it is possible to coat the upper surface 91 of the substrate 9 with the third processing liquid in a shorter time as compared with under normal pressure.

In the substrate processing apparatus 1d of FIG. 23, in Step S19, the buffer tank 60 which are brought into the reduced pressure atmosphere in advance do not necessarily have to be connected to the chamber 7, but the buffer tank 60 and the chamber 7 which are connected to each other through the connecting pipe 777 under normal pressure may be brought into the reduced pressure atmosphere. Further, if a gas supply part like the gas supply part 61 is connected to the buffer tank 60, when the internal space 70 of the chamber 7 is brought into the pressurized atmosphere in Steps S15 and S18, the buffer space 600 of the buffer tank 60 is brought into the pressurized atmosphere in advance, and then the pressure in the internal space 70 of the chamber 7 may be increased by opening the connection valve 771. It is thereby possible to more quickly bring the internal space 70 of the chamber 7 into a predetermined pressurized atmosphere.

In the processing of the substrate 9, it is not always necessary to supply the processing liquid onto the lower surface 92 of the substrate 9. Further, in the above-discussed substrate processing apparatuses, various processings other than the processes shown in Steps S11 to S21 may be performed by supplying various kinds of processing liquids onto the substrate 9. The atmosphere in the internal space 70 of the chamber 7 may be changed in various ways.

In Steps S31 to S35, a processing liquid other than the deionized water (e.g., dilute hydrochloric acid or hydrogen peroxide water) may be pooled in the internal space 70 of the chamber 7, and the inside of the chamber 7 may be cleaned by using such a processing liquid. Further, after the cleaning process using the processing liquid other than the deionized water, the cleaning process of Steps S31 to S35 may be performed again by using the deionized water as the processing liquid. Furthermore, the processing liquid used in Steps S31 to S35 may be supplied to the inside of the chamber 7 by the first processing liquid supply part 31 or the third processing liquid supply part 33 through the first upper nozzle 75 shown in FIG. 1, or may be supplied to the inside of the chamber 7 through the scan nozzle 35 shown in FIG. 14 or other nozzles.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2012-177600 filed in the Japan Patent Office on Aug. 9, 2012, Japanese Patent Application No. 2012-190473 filed in the Japan Patent Office on Aug. 30, 2012, Japanese Patent Application No. 2012-190472 filed in the Japan Patent Office on Aug. 30, 2012, Japanese Patent Application No. 2012-212786 filed in the Japan Patent Office on Sep. 26, 2012, and Japanese Patent Application No. 2012-212787 filed in the Japan Patent Office on Sep. 26, 2012, the entire disclosures of which are incorporated herein by reference.

REFERENCE SIGNS LIST 1, 1a to 1e Substrate processing apparatus
2 Substrate holding part
5 Substrate rotating mechanism
7 Chamber
9 Substrate
11 Control part
22 Substrate supporting part
23 Substrate retaining part
25 Rotation axis 31 First processing liquid supply part
32 Second processing liquid supply part
33 Third processing liquid supply part
35 Scan nozzle
41 Lift pin
42 Lift pin moving mechanism
51, 51a Stator part
52, 52a, 52b Rotor part
60 Buffer tank
60a First buffer tank
60b Second buffer tank
60c Third buffer tank
61 Gas supply part
62 Suction part
63 Processing liquid discharge part
64, 64a to 64c Gas discharge part
70 Internal space
71 Chamber body
73 Chamber cover
75 First upper nozzle
76 Lower nozzle
91 Upper surface (of Substrate)
92 Lower surface (of Substrate)
112 Pressure control part
222 First stopper
223 First substrate contact part
224 First anchor part
225 First contact surface
232 Second stopper
233 Second substrate contact part
234 Second anchor part
235 Second contact surface
411 Tip portion
521 Permanent magnet
523 Liquid receiving surface
524 Annular protruding portion
525 Protective wall
526 Upper end (of Protective wall)
527 Lower end (of Protective wall)
533 Upper surface (of Rotor part)
534 Flow channel
535 Annular opening
621 Slow leak part
622 Forced exhaust part
711 Chamber bottom
715 Flow channel forming part
731 Cover protruding portion
771 Connection valve
777, 777a to 777d Connecting pipe
812 First collecting part
822 Second collecting part
832 Third collecting part
J1 Central axis
S11 to S21, S31 to S35, S191 to S194 Step

The invention claimed is:

1. A substrate processing apparatus for processing a substrate, comprising:
a chamber having a chamber body and a chamber cover and forming an internal space which is sealed by closing an upper opening of said chamber body by said chamber cover;
a substrate holding part disposed in said internal space of said chamber, for holding a substrate horizontally;
a substrate rotating mechanism for rotating said substrate together with said substrate holding part about a central axis oriented in a vertical direction;
a processing liquid discharge part for discharging a processing liquid supplied onto said substrate to the outside of said chamber,
a plurality of lift pins arranged in a circumferential direction about said central axis and protruding downward from said chamber cover; and
a lift pin moving mechanism for moving said plurality of lift pins in said vertical direction relative to said chamber cover,
wherein said substrate rotating mechanism comprises:
an annular rotor part disposed in said internal space of said chamber, to which said substrate holding part is attached; and
a stator part disposed around said rotor part outside said chamber, for generating a rotating force between itself and said rotor part,
wherein respective tip portions of said plurality of lift pins are moved down from an escape position to a transfer position by said lift pin moving mechanism, and said substrate is transferred between said plurality of lift pins and said substrate holding part at said transfer position.

2. The substrate processing apparatus according to claim 1, wherein
said chamber cover comprises a cover protruding portion protruding downward on an inner side relative to said plurality of lift pins in a radial direction about said central axis.

3. The substrate processing apparatus according to claim 1, wherein
said processing liquid discharge part discharges said processing liquid from a lower portion of said internal space,
said rotor part is disposed around said substrate holding part, and
said rotor part comprises a liquid receiving surface opposed to an outer peripheral edge of said substrate in a radial direction, for receiving said processing liquid spattering from said outer peripheral edge of said substrate and guiding said processing liquid downward.

4. The substrate processing apparatus according to claim 3, wherein
said liquid receiving surface extends upward to be higher than an upper surface of said substrate and goes outward in said radial direction as it goes downward.

5. The substrate processing apparatus according to claim 3, wherein
said rotor part further comprises an annular protruding portion protruding inward in said radial direction at an upper side of said liquid receiving surface.

6. The substrate processing apparatus according to claim 3, wherein
said rotor part further comprises:
an annular permanent magnet, and
a protective wall disposed between said permanent magnet and said substrate, for isolating said permanent magnet from said substrate,
an upper end of said protective wall is opposed to a lower surface of said chamber cover with a very narrow gap interposed therebetween,
a lower end of said protective wall is opposed to an inner surface of said chamber body with a very narrow gap interposed therebetween, and
said liquid receiving surface is provided between said upper end and lower end of said protective wall.

7. The substrate processing apparatus according to claim 3, wherein said rotor part rotates, being in a floating state in said internal space, by magnetic force exerted between itself and said stator part.

8. A substrate processing apparatus for processing a substrate, comprising:
a chamber having a chamber body and a chamber cover and forming an internal space which is sealed by closing an upper opening of said chamber body by said chamber cover;
a substrate holding part disposed in said internal space of said chamber, for holding a substrate horizontally;
a substrate rotating mechanism for rotating said substrate together with said substrate holding part about a central axis oriented in a vertical direction; and
a processing liquid discharge part for discharging a processing liquid supplied onto said substrate to the outside of said chamber,
wherein said substrate rotating mechanism comprises:
an annular rotor part disposed in said internal space of said chamber, to which said substrate holding part is attached; and
a stator part disposed around said rotor part outside said chamber, for generating a rotating force between itself and said rotor part,
wherein said substrate holding part comprises:
a plurality of substrate supporting parts for supporting said substrate from below; and
a plurality of substrate retaining parts for retaining said substrate from above,
each substrate supporting part of said plurality of substrate supporting parts is rotatable about a first rotation axis oriented horizontally between a first waiting position and a first holding position and rotates from said first waiting position to said first holding position by placing said substrate on a first substrate contact part, to thereby support said substrate from below, and
each substrate retaining part of said plurality of substrate retaining parts is rotatable about a second rotation axis oriented horizontally between a second waiting position and a second holding position and rotates from said second waiting position to said second holding position by centrifugal force due to rotation performed by said substrate rotating mechanism, to thereby retain said substrate from above at a second substrate contact part.

9. The substrate processing apparatus according to claim 8, wherein
said first rotation axis of said each substrate supporting part is the same as said second rotation axis of one of said plurality of substrate retaining parts which is disposed adjacently to said each substrate supporting part.

10. The substrate processing apparatus according to claim 8, wherein
two substrate retaining parts are arranged adjacently to said each substrate supporting part on both sides thereof in a circumferential direction.

11. The substrate processing apparatus according to claim 8, wherein
said each substrate supporting part is positioned at said first holding position while said first substrate contact part has a sloped surface which goes downward as it goes inward in a radial direction about said central axis and an outer edge of said substrate is in contact with said sloped surface.

12. The substrate processing apparatus according to claim 8, wherein
said each substrate retaining part is positioned at said second holding position while said second substrate contact part has a sloped surface which goes upward as it goes inward in a radial direction about said central axis and an outer edge of said substrate is in contact with said sloped surface.

13. The substrate processing apparatus according to claim 8, wherein
said each substrate supporting part comprises:
a first anchor part positioned lower than said first rotation axis; and
a first stopper for limiting a movement of said first anchor part at the time when said substrate is placed on said first substrate contact part.

14. The substrate processing apparatus according to claim 8, wherein
said rotor part rotates, being in a floating state in said internal space, by magnetic force exerted between itself and said stator part.

15. The substrate processing apparatus according to claim 8, wherein
said processing liquid discharge part discharges said processing liquid from a lower portion of said internal space,
said rotor part is disposed around said substrate holding part, and
said rotor part comprises a liquid receiving surface opposed to an outer peripheral edge of said substrate in a radial direction, for receiving said processing liquid spattering from said outer peripheral edge of said substrate and guiding said processing liquid downward.

16. The substrate processing apparatus according to claim 15, wherein
said liquid receiving surface extends upward to be higher than an upper surface of said substrate and goes outward in said radial direction as it goes downward.

17. The substrate processing apparatus according to claim 15, wherein
said rotor part further comprises an annular protruding portion protruding inward in said radial direction at an upper side of said liquid receiving surface.

18. The substrate processing apparatus according to claim 15, wherein
said rotor part further comprises:
an annular permanent magnet, and
a protective wall disposed between said permanent magnet and said substrate, for isolating said permanent magnet from said substrate,
an upper end of said protective wall is opposed to a lower surface of said chamber cover with a very narrow gap interposed therebetween,
a lower end of said protective wall is opposed to an inner surface of said chamber body with a very narrow gap interposed therebetween, and
said liquid receiving surface is provided between said upper end and said lower end of said protective wall.

19. The substrate processing apparatus according to claim 15, wherein
said rotor part rotates, being in a floating state in said internal space, by magnetic force exerted between itself and said stator part.

* * * * *